(12) United States Patent
Meyer et al.

(10) Patent No.: US 7,425,816 B2
(45) Date of Patent: Sep. 16, 2008

(54) METHOD AND SYSTEM FOR PULSE CHARGING OF A LITHIUM-BASED BATTERY

(75) Inventors: Gary D. Meyer, Waukesha, WI (US); Jay J. Rosenbecker, Menomonee Falls, WI (US); Kevin L. Glasgow, Lomira, WI (US); Todd W. Johnson, Wauwatosa, WI (US); Karl F. Schuecher, Waite Hill, OH (US); Scott D. Bublitz, Hartland, WI (US); Andrew J. Weber, Cudahy Bay, WI (US)

(73) Assignee: Milwaukee Electric Tool Corporation, Brookfield, WI (US)

( * ) Notice: Subject to any disclaimer, the term of this patent is extended or adjusted under 35 U.S.C. 154(b) by 465 days.

(21) Appl. No.: 11/139,020

(22) Filed: May 24, 2005

(65) Prior Publication Data

US 2006/0071634 A1 Apr. 6, 2006

Related U.S. Application Data

(60) Provisional application No. 60/643,396, filed on Jan. 12, 2005, provisional application No. 60/626,230, filed on Nov. 9, 2004, provisional application No. 60/626,013, filed on Nov. 5, 2004, provisional application No. 60/612,352, filed on Sep. 22, 2004, provisional application No. 60/582,730, filed on Jun. 24, 2004, provisional application No. 60/582,728, filed on Jun. 24, 2004, provisional application No. 60/582,138, filed on Jun. 22, 2004, provisional application No. 60/574,616, filed on May 25, 2004, provisional application No. 60/574,278, filed on May 24, 2004.

(51) Int. Cl.
H01M 10/46 (2006.01)
(52) U.S. Cl. .................................................. 320/141

(58) Field of Classification Search .................. 320/106, 320/110, 139, 141
See application file for complete search history.

(56) References Cited

U.S. PATENT DOCUMENTS 4,388,582 A 6/1983 Saar et al.

(Continued)

FOREIGN PATENT DOCUMENTS

CA 2231260 6/1999

(Continued)

OTHER PUBLICATIONS

"Charging efficiency vs. cell aging in Li+ pulse chargers," *Maxim/Dallas Semiconductor Engineering Journal*, vol. 46, p. 3-7, Maxim Integrated Products, 2003.

*Primary Examiner*—Edward Tso
(74) *Attorney, Agent, or Firm*—Michael Best & Friedrich LLP

(57) ABSTRACT

A combination including a battery pack and a battery charger operable to supply a charging current to the battery pack. The battery pack includes a plurality of battery cells having a lithium-based chemistry and a present state of charge. The battery pack also includes a battery microcontroller that is operable to measure the present state of charge of at least one of the battery cells to produce battery cell present state of charge measurements. The battery charger includes a charger microcontroller that is operable to receive the battery cell present state of charge measurements from the battery microcontroller. The charger microcontroller is also operable to supply the charging current to the battery pack in pulses, wherein each pulse includes a first time interval where charging current is being supplied to the battery and a second time interval where charging current is being suspended from the battery.

20 Claims, 36 Drawing Sheets

U.S. PATENT DOCUMENTS

| | | |
|---|---|---|
| 4,392,101 A | 7/1983 | Saar et al. |
| 4,893,067 A | 1/1990 | Bhagwat et al. |
| 5,043,650 A | 8/1991 | Bhagwat et al. |
| 5,049,804 A | 9/1991 | Hutchings |
| 5,206,097 A | 4/1993 | Burns et al. |
| 5,268,630 A | 12/1993 | Bhagwat et al. |
| 5,280,229 A | 1/1994 | Faude et al. |
| 5,350,993 A | 9/1994 | Toya et al. |
| 5,352,969 A | 10/1994 | Gilmore et al. |
| 5,355,073 A | 10/1994 | Nguyen |
| 5,371,453 A | 12/1994 | Fernandez |
| 5,547,775 A | 8/1996 | Eguchi et al. |
| 5,557,192 A | 9/1996 | Tamai |
| 5,565,756 A | 10/1996 | Urbish et al. |
| 5,567,542 A | 10/1996 | Bae |
| 5,598,085 A | 1/1997 | Hasler |
| 5,606,242 A | 2/1997 | Hull et al. |
| 5,619,116 A | 4/1997 | Takano et al. |
| 5,679,017 A | 10/1997 | Smith |
| 5,684,387 A | 11/1997 | Patino |
| 5,691,620 A | 11/1997 | Nagai et al. |
| 5,691,623 A | 11/1997 | Tsantilis |
| 5,729,116 A | 3/1998 | Tsenter et al. |
| 5,744,937 A | 4/1998 | Cheon |
| 5,757,163 A | 5/1998 | Brotto et al. |
| 5,789,900 A | 8/1998 | Haseqawa et al. |
| 5,808,447 A | 9/1998 | Hagino |
| 5,831,350 A | 11/1998 | McConkey et al. |
| 5,835,351 A | 11/1998 | Ulanski et al. |
| 5,894,212 A | 4/1999 | Balogh |
| 5,945,803 A | 8/1999 | Brotto et al. |
| 5,973,480 A | 10/1999 | Takano et al. |
| 5,986,430 A | 11/1999 | Fernandez et al. |
| 5,998,966 A | 12/1999 | Gaza |
| 6,002,237 A | 12/1999 | Gaza |
| 6,008,628 A | 12/1999 | Brotto |
| 6,018,228 A | 1/2000 | Dias et al. |
| 6,040,683 A | 3/2000 | Mottier |
| 6,040,685 A | 3/2000 | Tsenter et al. |
| 6,043,631 A | 3/2000 | Tsenter |
| 6,084,523 A | 7/2000 | Gelnovatch et al. |
| 6,124,698 A | 9/2000 | Sakakibara |
| 6,133,713 A | 10/2000 | Brotto |
| 6,172,487 B1 | 1/2001 | Brotto |
| 6,175,211 B1 | 1/2001 | Brotto |
| 6,204,640 B1 | 3/2001 | Sakakibara |
| 6,268,710 B1 | 7/2001 | Koga |
| 6,275,004 B1 | 8/2001 | Tamai et al. |
| 6,329,788 B1 | 12/2001 | Bailey, Jr. et al. |
| 6,337,557 B1 | 1/2002 | Kates et al. |
| 6,362,596 B1 | 3/2002 | Brotto |
| 6,377,024 B1 | 4/2002 | Choy |
| 6,433,510 B1 | 8/2002 | Ribellino et al. |
| 6,452,362 B1 | 9/2002 | Choo |
| 6,456,044 B1 | 9/2002 | Darmawaskita |
| 6,489,752 B1 | 12/2002 | Watts et al. |
| 6,504,341 B2 | 1/2003 | Brotto |
| 6,509,114 B1 | 1/2003 | Nakai et al. |
| 6,563,290 B2 | 5/2003 | Sakakibara et al. |
| 6,624,616 B1 | 9/2003 | Frerking et al. |
| 6,791,300 B2 | 9/2004 | Trinh et al. |
| 6,833,685 B2 | 12/2004 | Howard et al. |
| 2002/0125860 A1 | 9/2002 | Schworm et al. |
| 2003/0141843 A1 | 7/2003 | Anzawa et al. |
| 2006/0076923 A1 | 4/2006 | Eaves |

FOREIGN PATENT DOCUMENTS

| | | |
|---|---|---|
| DE | 3637669 | 5/1988 |
| DE | 19617805 | 11/1996 |
| DE | 10153083 | 5/2003 |
| EP | 265144 | 4/1988 |
| EP | 0419806 | 4/1991 |
| EP | 0621990 | 11/1994 |
| EP | 669692 | 2/1995 |
| EP | 767524 | 4/1997 |
| EP | 1039612 | 9/2000 |
| EP | 1191616 | 3/2002 |
| GB | 2289581 | 11/1995 |
| GB | 2293060 | 3/1996 |
| GB | 2336955 | 11/1999 |
| GB | 2354891 | 4/2001 |
| GB | 2354892 | 4/2001 |
| JP | 5251112 | 9/1993 |
| JP | 8196042 | 7/1996 |
| JP | 09-271144 | 10/1997 |
| JP | 11150879 | 6/1999 |
| JP | 11178229 | 7/1999 |
| JP | 2000-078766 | 3/2000 |
| JP | 2000102185 | 4/2000 |
| JP | 2001112182 | 4/2001 |
| JP | 2001218376 | 8/2001 |
| JP | 2002008732 | 1/2002 |
| JP | 2002-098743 | 4/2002 |
| JP | 2002-191135 | 7/2002 |
| JP | 2002369400 | 12/2002 |
| JP | 2003-299257 | 10/2003 |
| RO | 116233 | 11/2000 |
| WO | WO 96/21954 | 7/1996 |
| WO | WO 99/63613 | 12/1999 |
| WO | WO 00/49699 | 8/2000 |
| WO | WO 01/03231 | 1/2001 |

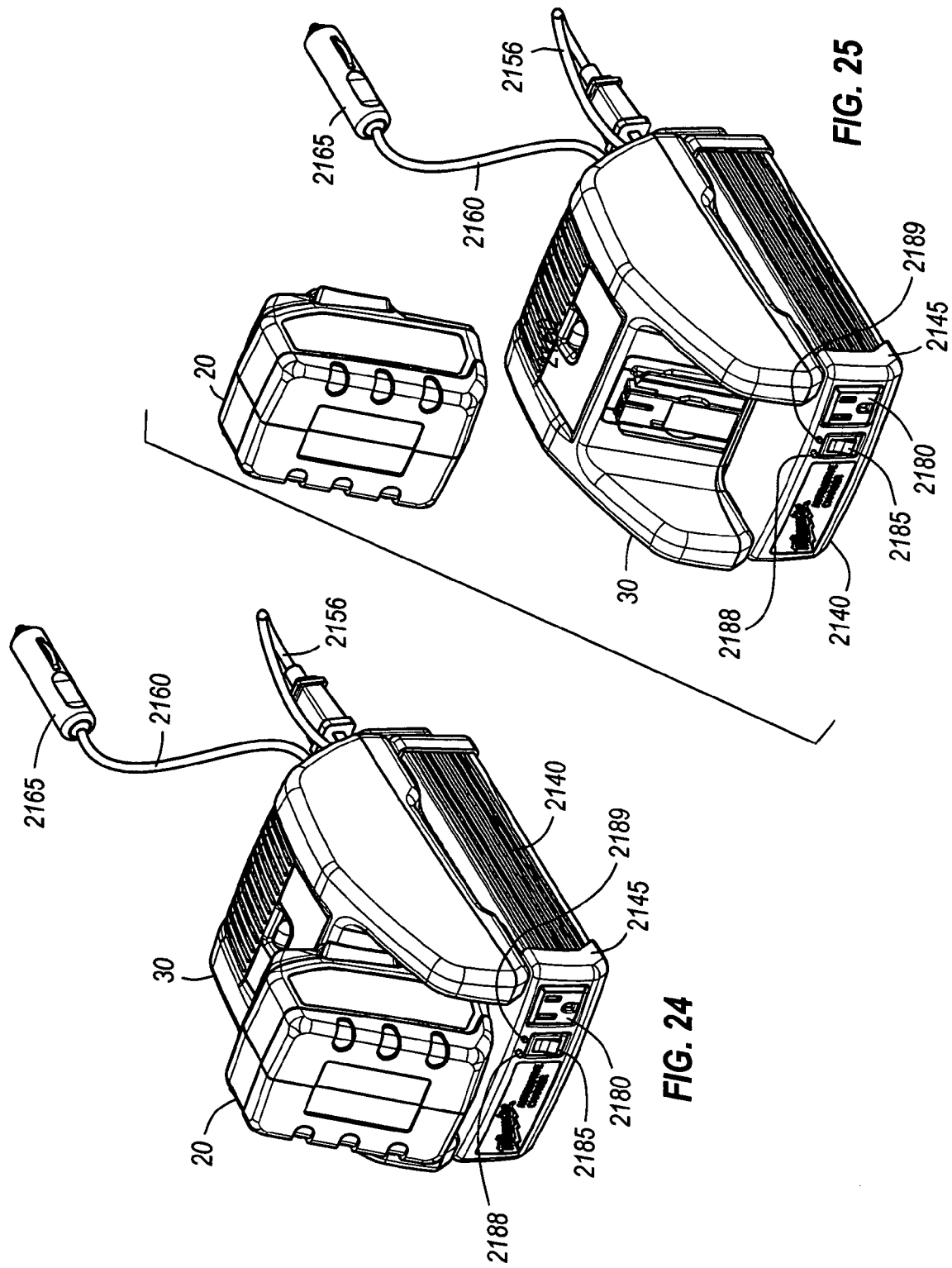

2240

CHARGE CURRENT ALGORITHM

CURRENT OFF (50ms INITIALLY).
- CHARGER RECEIVES CELL AND PACK VOLTAGES AVERAGES FROM PACK.
- CHARGER RECEIVES INSTANTANEOUS CELL VOLTAGES FROM BATTERY AND WAITS FOR ALL CELL VOLTAGES TO FALL TO 4.2V.
- CHARGER CALCULATES ALL CELL VOLTAGES AS PERCENTAGES OF TOTAL PACK VOLTAGE. HIGHEST VOLTAGE CELL IS NOTED (HICELL %).
- CHARGER CALCULATES DIFFERENCE BETWEEN AVERAGED "CURRENT ON" PACK VOLTAGE MEASUREMENTS MADE BY THE BATTERY PACK AND THE CHARGER DURING THE PREVIOUS ON PERIOD ($V_{DIFF}$).
- CHARGER RECEIVES PACK TEMPERATURE INFORMATION. CHARGER AVERAGES TEMPERATURE OVER (5) CONSECUTIVE MEASUREMENTS.
- CHARGER COMMANDS PACK TO MEASURE AND AVERAGE INDIVIDUAL CELL VOLTAGES AND PACK VOLTAGE OVER NEXT CURRENT ON PERIOD.

IS TEMPERATURE > 65°C ? —YES→ GO TO MAINTENANCE MODULE

NO ↓

IS TEMPERATURE < -10°C ? —YES→ TEMPERATURE OUT OF RANGE MODULE

NO ↓

IS WAITING TIME > 15 SEC. ? —YES→ GO TO MAINTENANCE MODULE

NO ↓

CURRENT ON (900ms INITIALLY).
- CHARGER SAMPLES PACK VOLTAGE AT 50ms INTERVALS. CHARGER AVERAGES OVER ON TIME.
- AT EACH SAMPLING POINT, CHARGER CALCULATES:
    (INSTANTANEOUS PACK VOLTAGE - $V_{DIFF}$) * (HICELL %)
        THIS IS THE COMPUTED "INSTANTANEOUS CURRENT ON" VOLTAGE FOR THE HIGHEST VOLTAGE CELL IN THE PACK.
- IF THE COMPUTED CELL VOLTAGE EXCEEDS 4.35V WITHIN THE PRESENT ON PERIOD, THE CHARGER NOTES AT WHAT POINT IN TIME THIS THRESHOLD WAS CROSSED.
- THE TIME ELAPSED BETWEEN THE START OF THE CURRENT ON PERIOD AND THE THRESHOLD CROSSING POINT BECOMES THE NEW CURRENT ON TIME FOR THE NEXT CYCLE.

Ⓒ   Ⓑ

FIG. 37

METHOD AND SYSTEM FOR PULSE CHARGING OF A LITHIUM-BASED BATTERY

RELATED APPLICATIONS

The present patent application claims the benefits of prior filed co-pending U.S. provisional patent application Ser. No. 60/574,278, filed on May 24, 2004; Ser. No. 60/574,616, filed on May 25, 2004; Ser. No. 60/582,138, filed on Jun. 22, 2004; Ser. No. 60/582,728, filed on Jun. 24, 2004; Ser. No. 60/582,730, filed on Jun. 24, 2004; Ser. No. 60/612,352, filed on Sep. 22, 2004; Ser. No. 60/626,013, filed on Nov. 5, 2004; Ser. No. 60/626,230, filed on Nov. 9, 2004; and Ser. No. 60/643,396, filed on Jan. 12, 2005, the entire contents of all of which are hereby incorporated by reference.

The present application also relates to U.S. patent application Ser. No. 10/720,027, filed on Nov. 20, 2003, now U.S. Pat. No. 7,157,882, which claims the benefit of prior filed co-pending U.S. provisional patent application Ser. No. 60/428,358, filed on Nov. 22, 2002; Ser. No. 60/428,450, filed on Nov. 22, 2002; Ser. No. 60/428,452, filed on Nov. 22, 2002; Ser. No. 60/440,692, filed on Jan. 17, 2003; Ser. No. 60/440,693, filed on Jan. 17, 2003; Ser. No. 60/523,716, filed on Nov. 19, 2003; and Ser. No. 60/523,712, filed on Nov. 19, 2003, the entire contents of all of which are hereby incorporated by reference.

The present application also relates to U.S. patent application Ser. No. 10/719,680, filed on Nov. 20, 2003, now U.S. Pat. No. 7,176,654, which claims the benefit of prior filed co-pending U.S. provisional patent application Ser. No. 60/428,358, filed on Nov. 22, 2002; Ser. No. 60/428,450, filed on Nov. 22, 2002; Ser. No. 60/428,452, filed on Nov. 22, 2002; Ser. No. 60/440,692, filed on Jan. 17, 2003; Ser. No. 60/440,693, filed on Jan. 17, 2003; Ser. No. 60/523,716, filed on Nov. 19, 2003; and Ser. No. 60/523,712, filed on Nov. 19, 2003, the entire contents of all of which are hereby incorporated by reference.

The present patent application also relates to U.S. patent application Ser. No. 10/721,800, filed on Nov. 24, 2003, now U.S. Pat. No. 7,253,585, which claims the benefit of prior filed co-pending U.S. provisional patent application Ser. No. 60/428,356, filed on Nov. 22, 2002; Ser. No. 60/428,358, filed on Nov. 22, 2002; Ser. No. 60/428,450, filed on Nov. 22, 2002; Ser. No. 60/428,452, filed on Nov. 22, 2002; Ser. No. 60/440,692, filed on Jan. 17, 2003; Ser. No. 60/440,693, filed on Jan. 17, 2003; Ser. No. 60/523,712, filed on Nov. 19, 2003; and Ser. No. 60/523,716, filed on Nov. 19, 2003, the entire contents of all of which are hereby incorporated by reference.

FIELD OF THE INVENTION

The present invention generally relates to a method and system for battery charging and, more particularly, to a method and system for power tool battery charging.

BACKGROUND OF THE INVENTION

Cordless power tools are typically powered by portable battery packs. These battery packs range in battery chemistry and nominal voltage and can be used to power numerous tools and electrical devices. Typically, the battery chemistry of a power tool battery is either Nickel-Cadmium ("NiCd") or Nickel-Metal Hydride ("NiMH"). The nominal voltage of the battery pack usually ranges from about 2.4 V to about 24 V.

SUMMARY OF THE INVENTION

Some battery chemistries (such as, for example, Lithium ("Li"), Lithium-ion ("Li-ion") and other Lithium-based chemistries) require precise charging schemes and charging operations with controlled discharge. Insufficient charging schemes and uncontrolled discharging schemes may produce excessive heat build-up, excessive overcharged conditions and/or excessive overdischarged conditions. These conditions and build-ups can cause irreversible damage to the batteries and can severely impact the battery's capacity.

The present invention provides a system and method for charging a battery. In some constructions and in some aspects, the invention provides a battery charger capable of fully charging various battery packs with different battery chemistries. In some constructions and in some aspects, the invention provides a battery charger capable of fully charging lithium-based batteries, such as, for example, lithium-cobalt batteries, lithium-manganese batteries and spinel batteries. In some constructions and in some aspects, the invention provides a battery charger capable of charging Lithium-based chemistry battery packs of different nominal voltages or in different nominal voltage ranges. In some constructions and in some aspects, the inventions provides a battery charger having various charging modules that are implemented based on different battery conditions. In some constructions and in some aspects, the invention provides a method and system for charging a lithium-based battery by applying pulses of constant current. The time between pulses and the length of the pulses may be increased or decreased by the battery charger depending on certain battery characteristics.

In one construction, the present invention provides a combination including a battery pack and a battery charger operable to supply a charging current to the battery pack. The battery pack includes a first battery terminal, a second battery terminal, and a battery cell having a present state of charge. The battery cell is coupled to at least one of the first battery terminal and the second battery terminal. The battery pack also includes a battery microcontroller coupled to at least one of the first battery terminal and the second battery terminal. The microcontroller is operable to measure the present state of charge of the battery cell to produce battery cell present state of charge measurements. The battery charger includes a first charger terminal configured to couple to at least one of the first battery terminal and the second battery terminal and a second charger terminal configured to couple to at least one of the first battery terminal and the second battery terminal. The first charger terminal is configured to supply charging current to the battery pack. The battery charger also includes a charger microcontroller coupled to the second charger terminal and operable to receive the battery cell present state of charge measurements from the battery microcontroller. The charger microcontroller is also operable to supply the charging current to the battery pack in pulses, wherein each pulse includes a first time interval where charging current is being supplied to the battery and a second time interval where charging current is being suspended from the battery. The microcontroller is further operable to modify the first time interval of a pulse based at least in part on the battery cell present state of charge measurements received from the battery microcontroller.

Independent features and independent advantages of the invention will become apparent to those skilled in the art upon review of the following detailed description, claims, and drawings.

BRIEF DESCRIPTION OF THE DRAWINGS

FIG. 24 is another perspective view of a power inverter, such as the power inverter of FIG. 18; connected to a battery charger.

FIG. 25 is still another perspective view of a power inverter, such as the power inverter of FIG. 18, connected to a battery charger.

FIGS. 37 and 38 are a flowchart illustrating still another module of a charging, operation for a battery.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items.

DETAILED DESCRIPTION OF THE DRAWINGS

Figure 1:
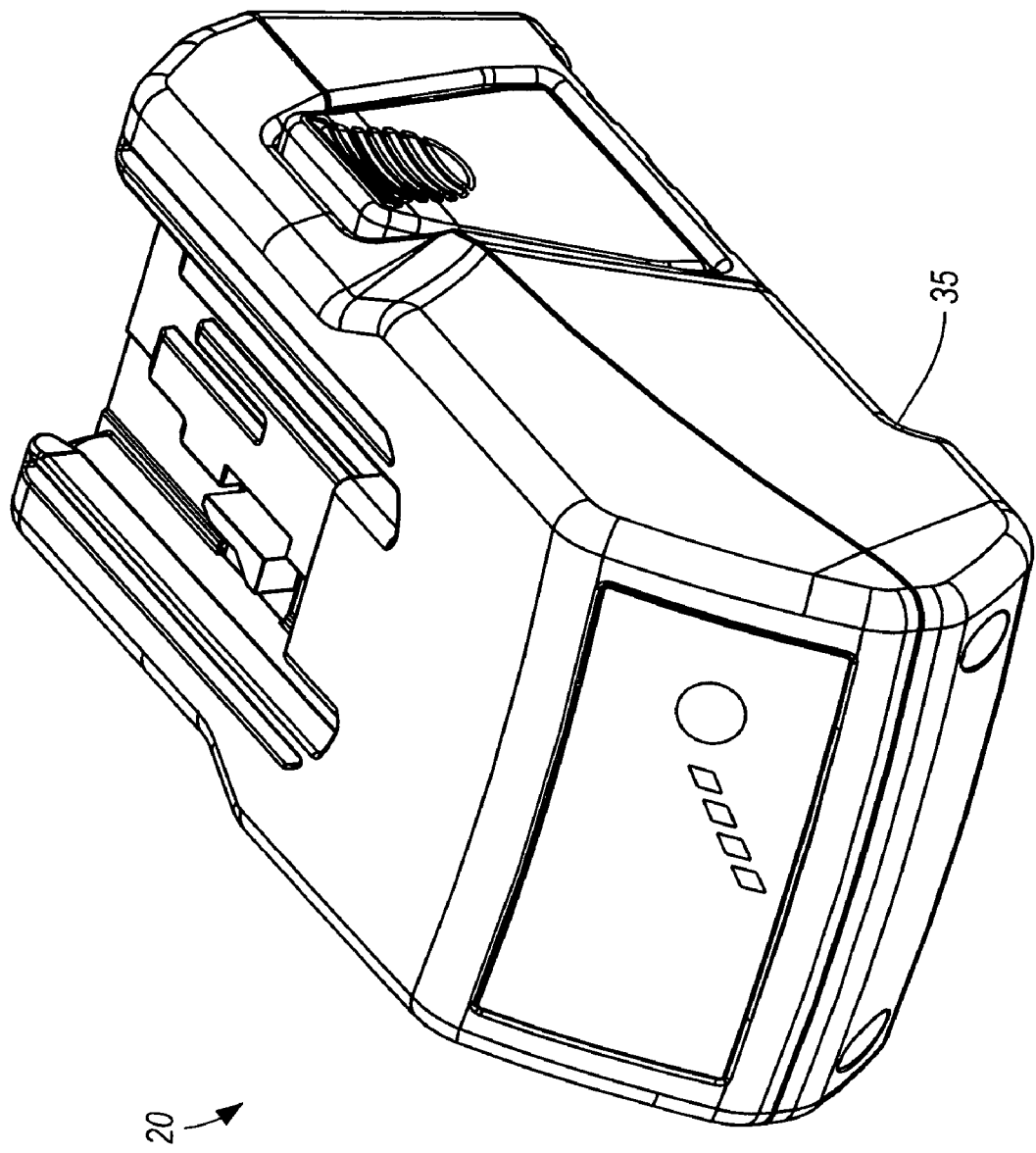
FIG. 1 is a perspective view of a battery.
Figure 2:
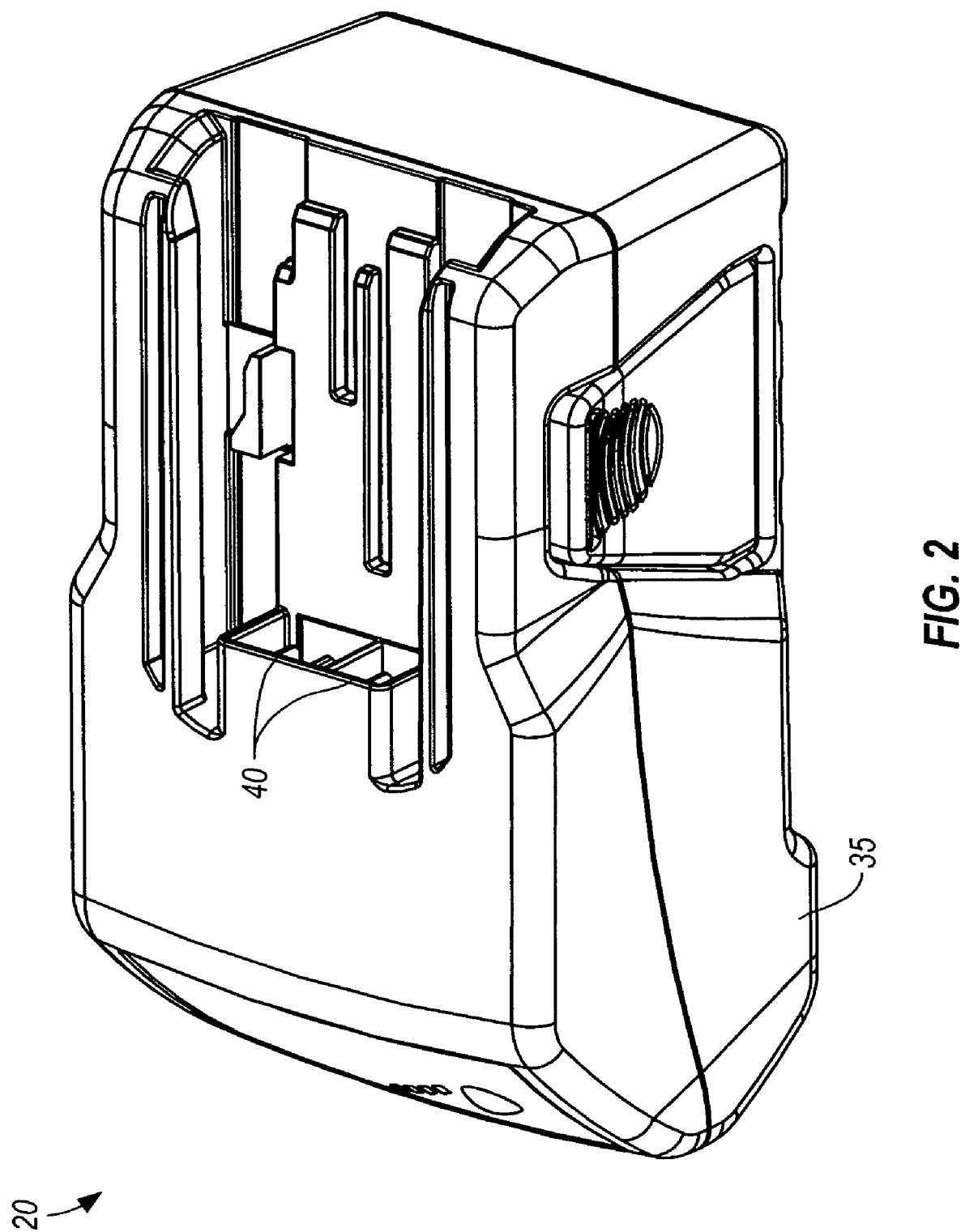
FIG. 2 is another perspective view of a battery such as the battery shown in FIG. 1.
Figure 15A:
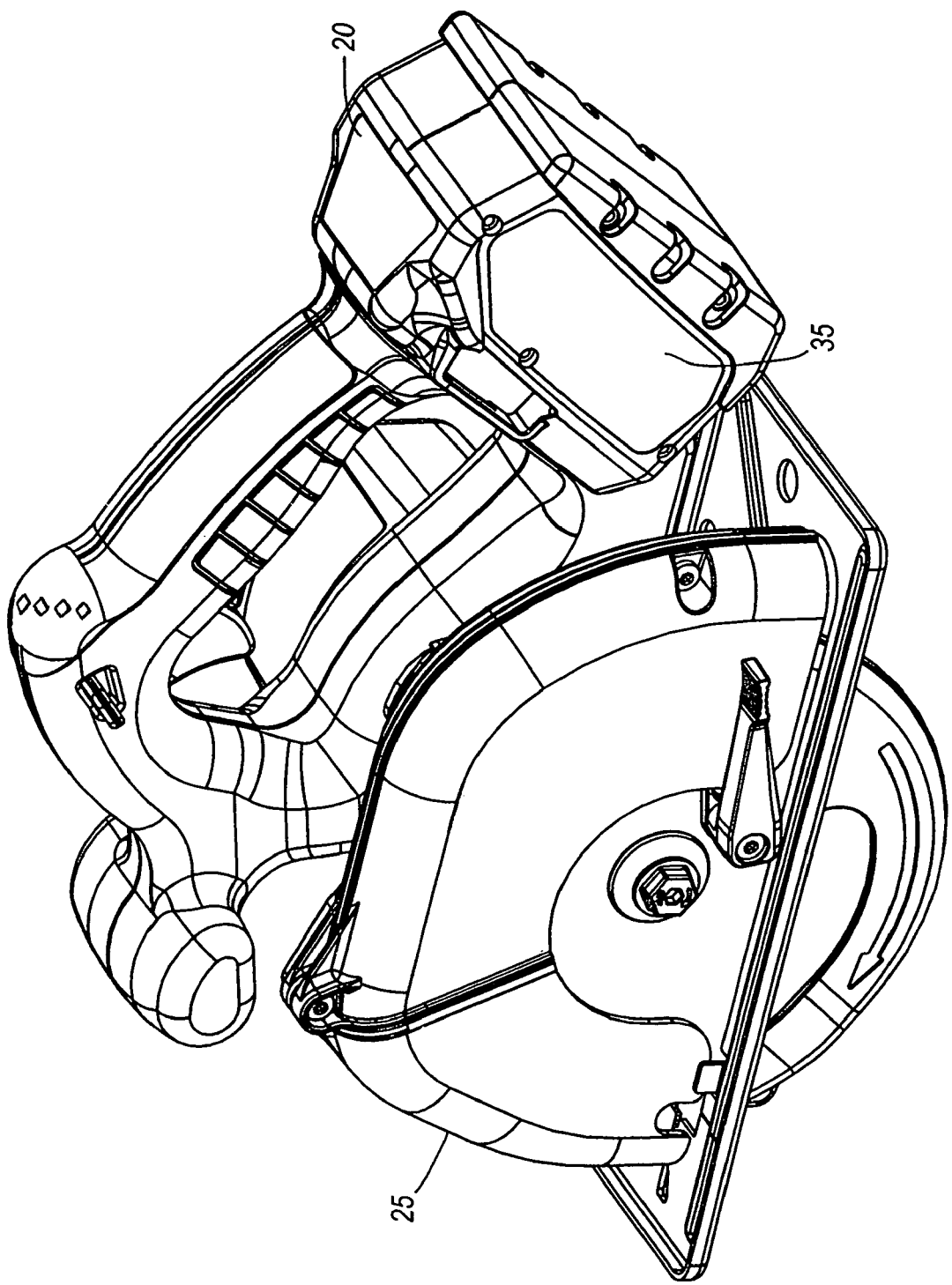
FIG. 15A-B are perspective views of a battery, such as one of the batteries shown in FIGS. 1, 2, and 14A-B, electrically and physically connected to a power tool.
Figure 15B:
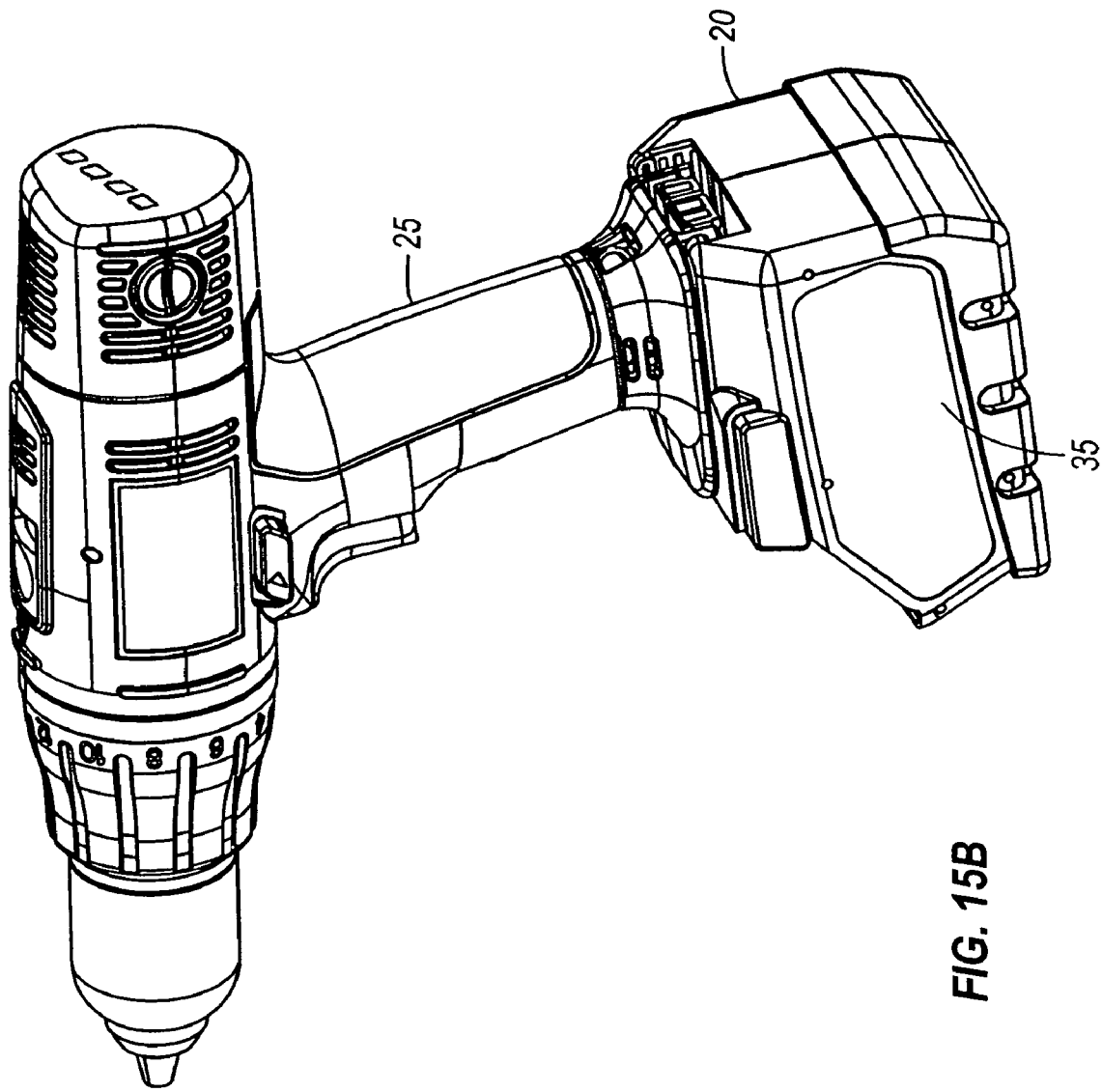

A battery pack or battery 20 is illustrated in FIGS. 1 and 2. The battery 20 is configured for transferring power to and receiving power from one or more electrical devices, such as, for example, a power tool 25 (shown in FIGS. 15A-B) and/or a battery charger 30 (shown in FIGS. 3 and 4). In some constructions and in some aspects, the battery 20 can have any battery chemistry such as, for example, lead-acid, Nickel-cadmium ("NiCd"), Nickel-Metal Hydride ("NiMH"), Lithium ("Li"), Lithium-ion ("L-ion"), another Lithium-based chemistry or another rechargeable battery chemistry. In some constructions and in some aspects, the battery 20 can supply a high discharge current to electrical devices, such as, for example, a power tool, having high-current discharge rates. In the illustrated constructions, the battery 20 has a battery chemistry of Li, Li-ion or another Li-based chemistry and supplies an average discharge current that is equal to or greater than approximately 20 A. For example, in the illustrated construction, the battery 20 can have a chemistry of lithium-cobalt ("Li—Co"), lithium-manganese ("Li—Mn") spinel, or Li—Mn Nickel.

Figure 14A:
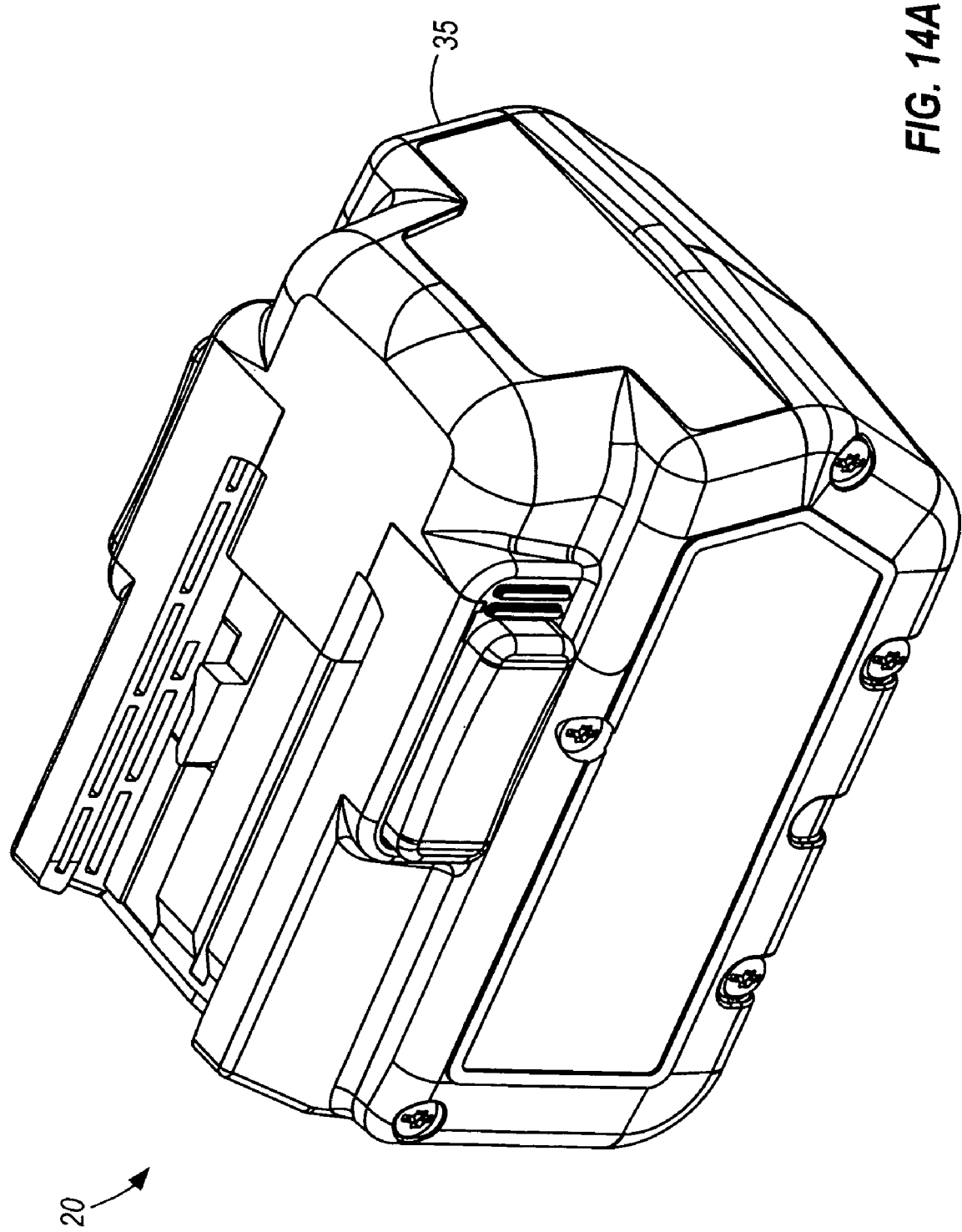
FIG. 14A-B are views of other constructions of a battery.
Figure 14B:
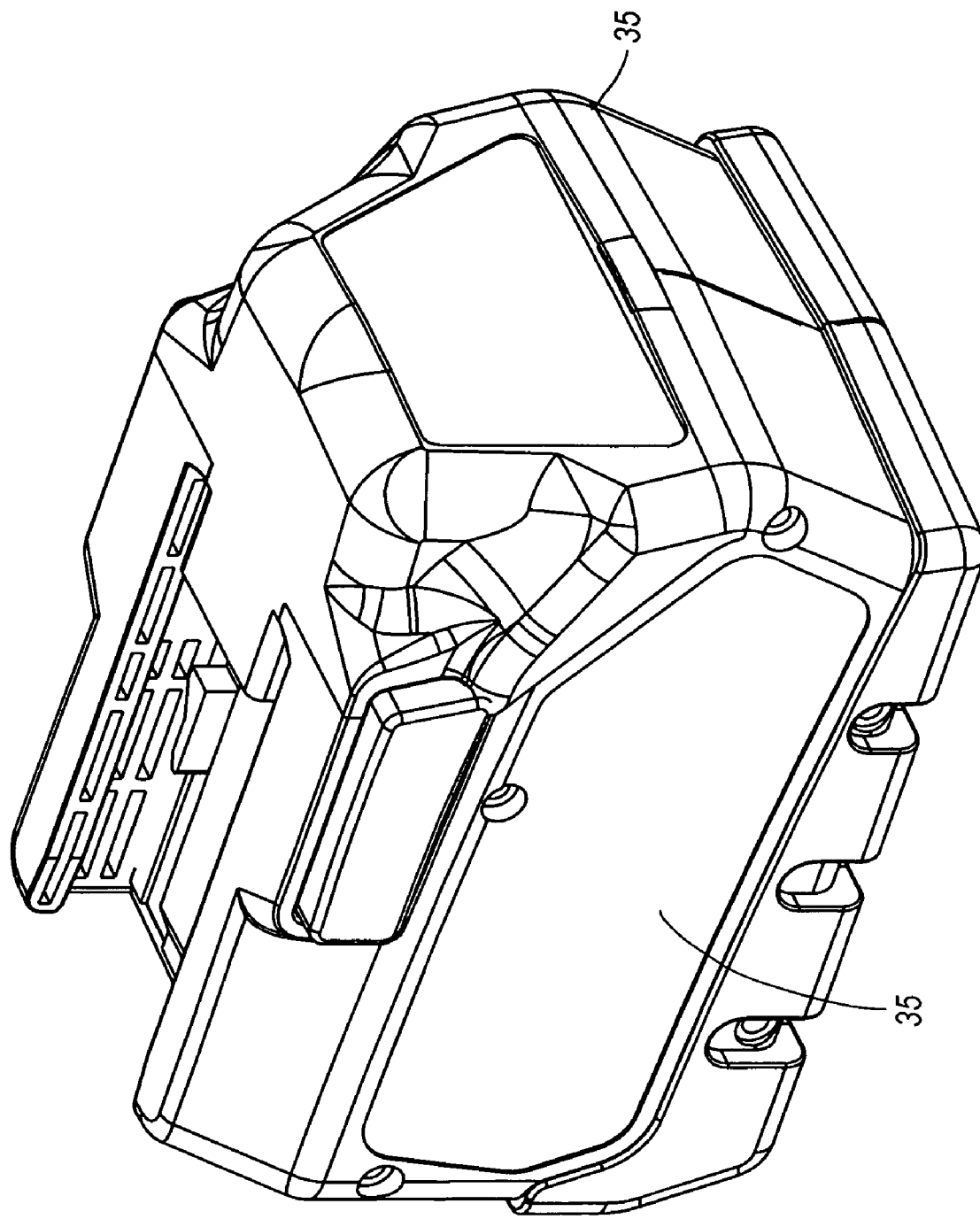

In some constructions and in some aspects, the battery 20 can also have any nominal voltage such as, for example, a nominal voltage ranging from approximately 9.6 V to approximately 50 V. In one construction (see FIGS. 1-3), for example, the battery 20 has a nominal voltage of approximately 21 V. In another construction (see FIG. 14), the battery 20A has a nominal voltage of approximately 28 V. It should be understood that, in other constructions, the battery 20 may have another nominal voltage in another nominal voltage range.

The battery 20 includes a housing 35 which provides terminal supports 40. The battery 20 further includes one or more battery terminals supported by the terminal supports 40 and connectable to an electrical device, such as the power tool 25 and/or the battery charger 30. In some constructions, such as, for example, the construction illustrated in FIG. 4, the battery 20 includes a positive battery terminal 45, a negative battery terminal 50 and a sense battery terminal 55. In some constructions, the battery 20 includes more or fewer terminals than in the construction shown.

The battery 20 includes one or more battery cells 60 each having a chemistry and a nominal voltage. In some constructions, the battery 20 has a battery chemistry of Li-ion, a nominal voltage of approximately 18 V or 21 V and includes five battery cells. In some constructions, each battery cell 60 has a chemistry of Li-ion, and each battery cell 60 has substantially the same nominal voltage, such as, for example, approximately 3.6 V or approximately 4.2 V.

In some constructions and in some aspects, the battery 20 includes an identification circuit or component electrically connected to one or more battery terminals. In some constructions, an electrical device, such as, for example, a battery charger 30 (shown in FIGS. 3 and 4) would "read" the identification circuit or component or receive an input based on the identification circuit or component in order to determine one or more battery characteristics. In some constructions, the battery characteristics could include, for example, the nominal voltage of the battery 20, the temperature of the battery 20 and/or the chemistry of the battery 20.

In some constructions and in some aspects, the battery 20 includes a control device, a microcontroller, a microprocessor or a controller electrically connected to one or more battery terminals. The controller communicates with the electrical devices, such as a battery charger 30, and provides information to the devices regarding one or more battery characteristics or conditions, such as, for example, the nominal voltage of the battery 20, individual cell voltages, the temperature of the battery 20 and/or the chemistry of the battery 20. In some constructions, such as, for example, the construction illustrated in FIG. 4, the battery 20 includes an identification circuit 62 having a microprocessor or controller 64.

In some constructions and in some aspects, the battery 20 includes a temperature-sensing device or thermistor. The thermistor is configured and positioned within the battery 20 to sense a temperature of one or more battery cells or a temperature of the battery 20 as a whole. In some constructions, such as, for example, the construction illustrated in FIG. 4, the battery 20 includes a thermistor 66. In the illustrated construction, the thermistor 66 is included in the identification circuit 62.

Figure 3:
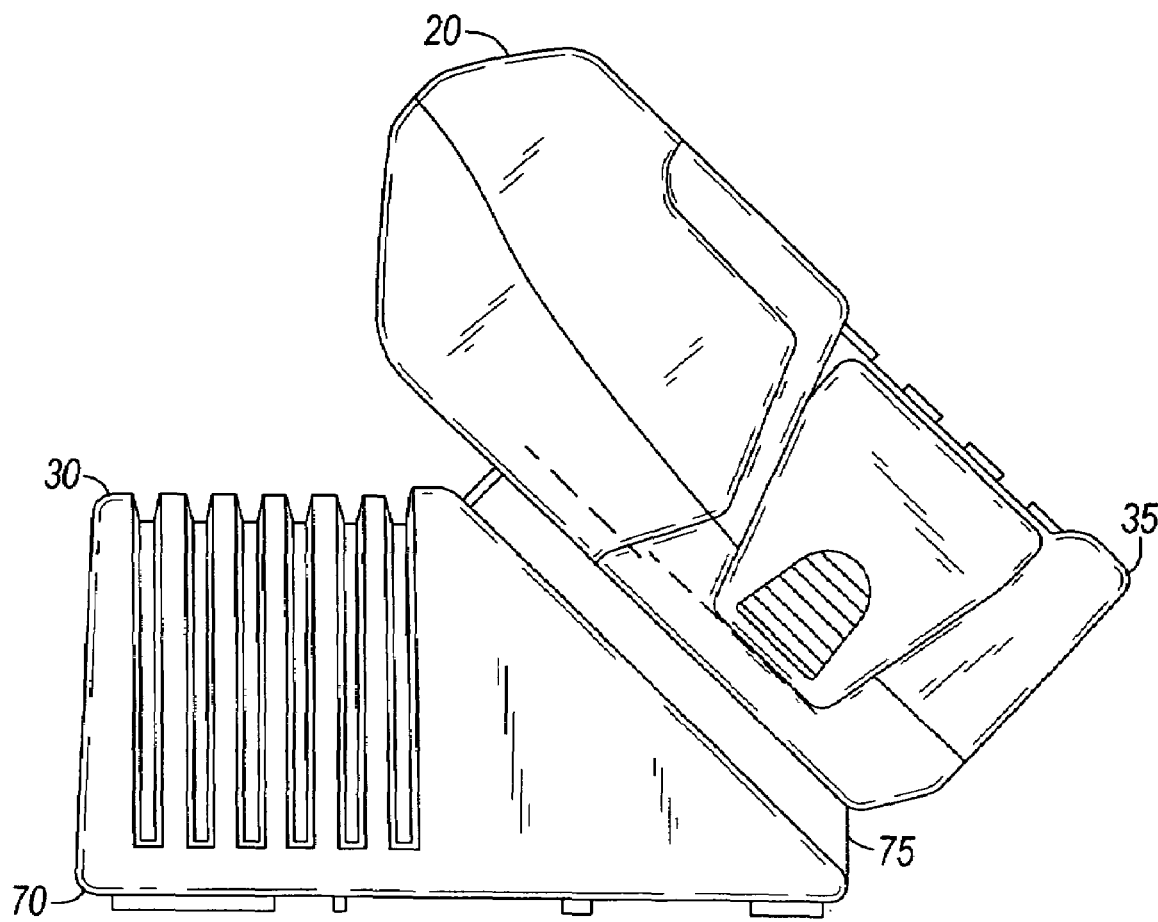
FIG. 3 is a perspective view of a battery, such as the battery shown in FIG. 1, electrically and physically connected to a battery charger.
Figure 4:
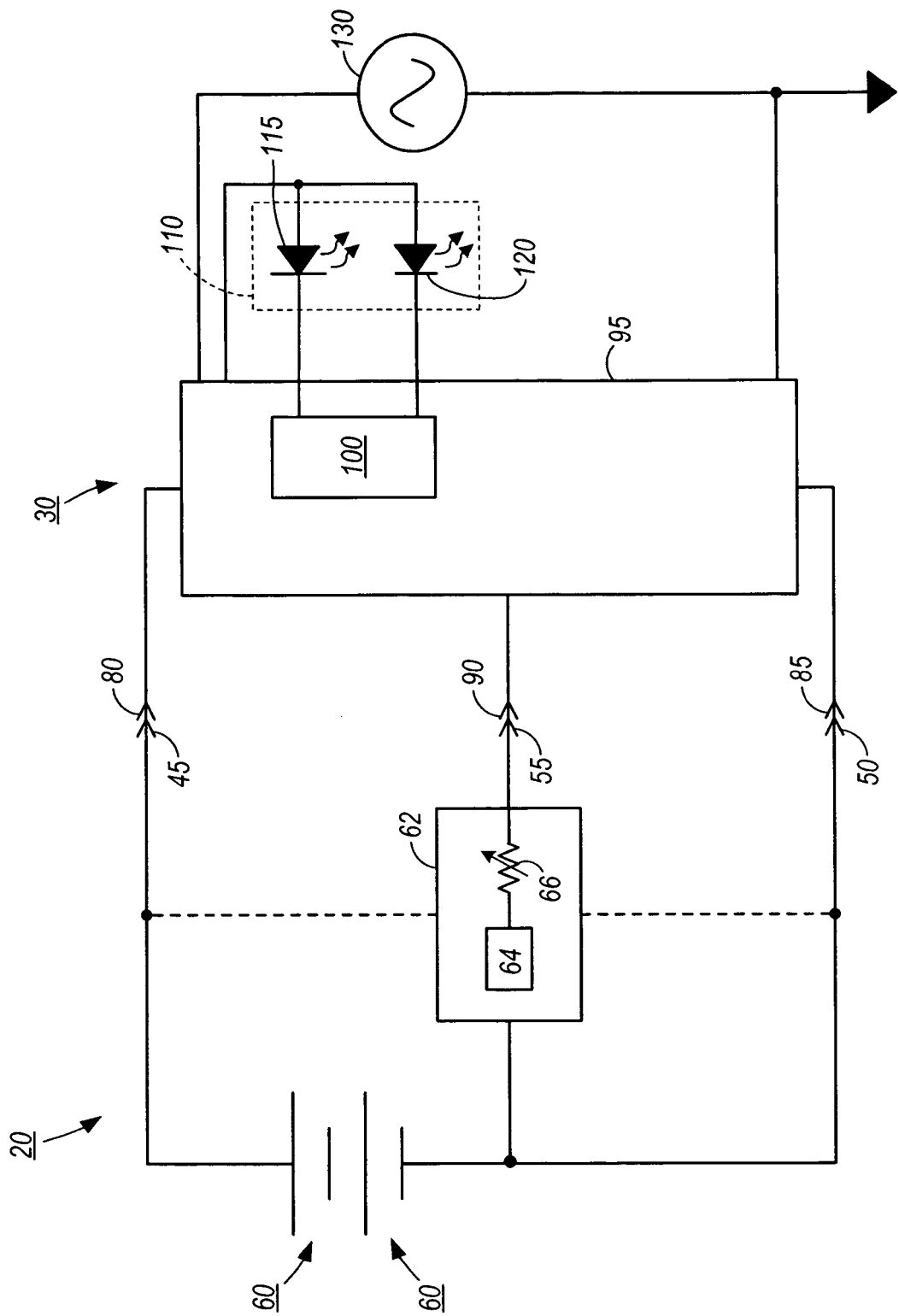
FIG. 4 is a schematic view of a battery electrically connected to a battery charger, such as the battery and battery charger shown in FIG. 3.

As shown in FIGS. 3 and 4, the battery 20 is also configured to connect with an electrical device, such as a battery charger 30. In some constructions, the bate charger 30 includes a housing 70. The housing 70 provides a connection portion 75 to which the battery 20 is connected. The connecting portion 75 includes one or more electrical device terminals to electrically connect the battery 20 to the battery charger 30. The terminals included in the battery charger 30 are configured to mate with the terminals included in the battery 20 and to transfer and receive power and information from the battery 20.

In some constructions, such as, for example, the construction illustrated in FIG. 4, the battery charger 30 includes a positive terminal 80, a negative terminal 85 and a sense terminal 90. In some constructions, the positive terminal 80 of the battery charger 30 is configured to mate with the positive battery terminal 45. In some constructions, the negative terminal 85 and the sense terminal 90 of the battery charger 30 are configured to mate with the negative battery terminal 50 and the sense battery terminal 55, respectively.

In some constructions and in some aspects, the battery charger 30 also includes charging circuitry 95. In some constructions, the charging circuitry 95 includes a control device, a microcontroller, a microprocessor or a controller 100. The controller 100 controls the transfer of power between the battery 20 and the battery charger 30. In some constructions, the controller 100 controls the transfer of information between the battery 20 and the battery charger 30. In some constructions, the contoller 100 identifies and/or determines one or more characteristics or conditions of the battery 20 based on signals received from the battery 20. Also, the controller 100 can control operation of the charger 30 based on identification characteristics of the battery 20.

In some constructions and in some aspects, the controller 100 includes various timers, back-up timers and counters and/or can perform various timing and Counting functions. The timers, back-up timers and counters are used and controlled by the controller 100 during various charging steps and/or modules. The timers, backup timers and counters will be discussed below.

In some constructions and in some aspects, the battery charger 30 includes a display or indicator 110. The indicator 110 informs a user of the status of the battery charger 30. In some constructions, the indicator 110 can inform the user of different stages of charging, charging modes or charging modules that are beginning and/or being completed during operation. In some constructions, the indicator 110 includes a first light-emitting diode ("LED") 115 and a second LED 120. In the illustrated construction, the first and second LEDs 115 and 120 are different colored LEDs. For example, the first LED 115 is a red LED, and the second LED 120 is a green LED. In some constructions, the controller 100 activates and controls the indicator 110. In some constructions, the indicator 110 is positioned on the housing 70 or included in the housing 70 such that the indicator 110 is visible to the user. Display could also include an indicator showing percent charged, time remaining, etc. In some constructions, the display or indicator 110 may include the fuel gauge provided on the battery 20.

The battery charger 30 is adapted to receive an input of power from a power source 130. In some constructions, the power source 130 is approximately a 120-V AC, 60-Hz signal. In other constructions, the power source 130 is approximately a 240-V AC signal. In further constructions, the power source 130 is, for example, a constant current source. In these constructions, the power sources 130 can include a 12-V DC signal, such as a DC signal received from a vehicle jack (e.g., from an vehicular battery).

In the illustrated constructions, the battery charger 30 receives the input of power from an AC power source. For use with a DC power source, a user can connect the battery charger 30 to a power inverter 2140, shown in FIGS. 18-27. In these constructions, the power inverter 2140 converts a first signal, such as a DC signal (e.g., a 12-V DC signal from a vehicle DC outlet) to a second signal, such as an AC signal (e.g., a 120-V AC signal).

As shown in FIGS. 18-26, the power inverter 2140 includes a housing 2145. In the illustrated construction, the housing 2145 includes a first end 2146, a second end 2147, a first side 2148 and a second side 2149. The housing 2145 also includes a bottom surface 2152 and a top surface 2154. In other constructions, the housing 2145 can include more or fewer surfaces, sides and ends than shown and described.

In one construction, the top surface 2154 can provide an area for the battery charger 30 to be placed. In the illustrated construction, the top surface 2154 is substantially the same width and length of a battery charger 30. In other constructions, the top surface 2154 can be larger or smaller than the width and length of the battery charger 30. In further constructions, the top surface 2154 can include a locking mechanism (not shown) to secure the battery charger 30 to the power inverter 2140. In still further constructions, another portion of the housing 2145 can include a locking mechanism to secure the battery charger 30 to the inverter 2140.

The power inverter 2140 also includes an input 2159 that receives the first power signal (i.e., the DC power signal). In some constructions, the input 2159 includes a cord 2160 and an input connector 2165. In the illustrated constructions, the input connector 2165 includes a 12-V DC input plug for receiving a DC signal from a vehicular DC outlet.

Figure 18:
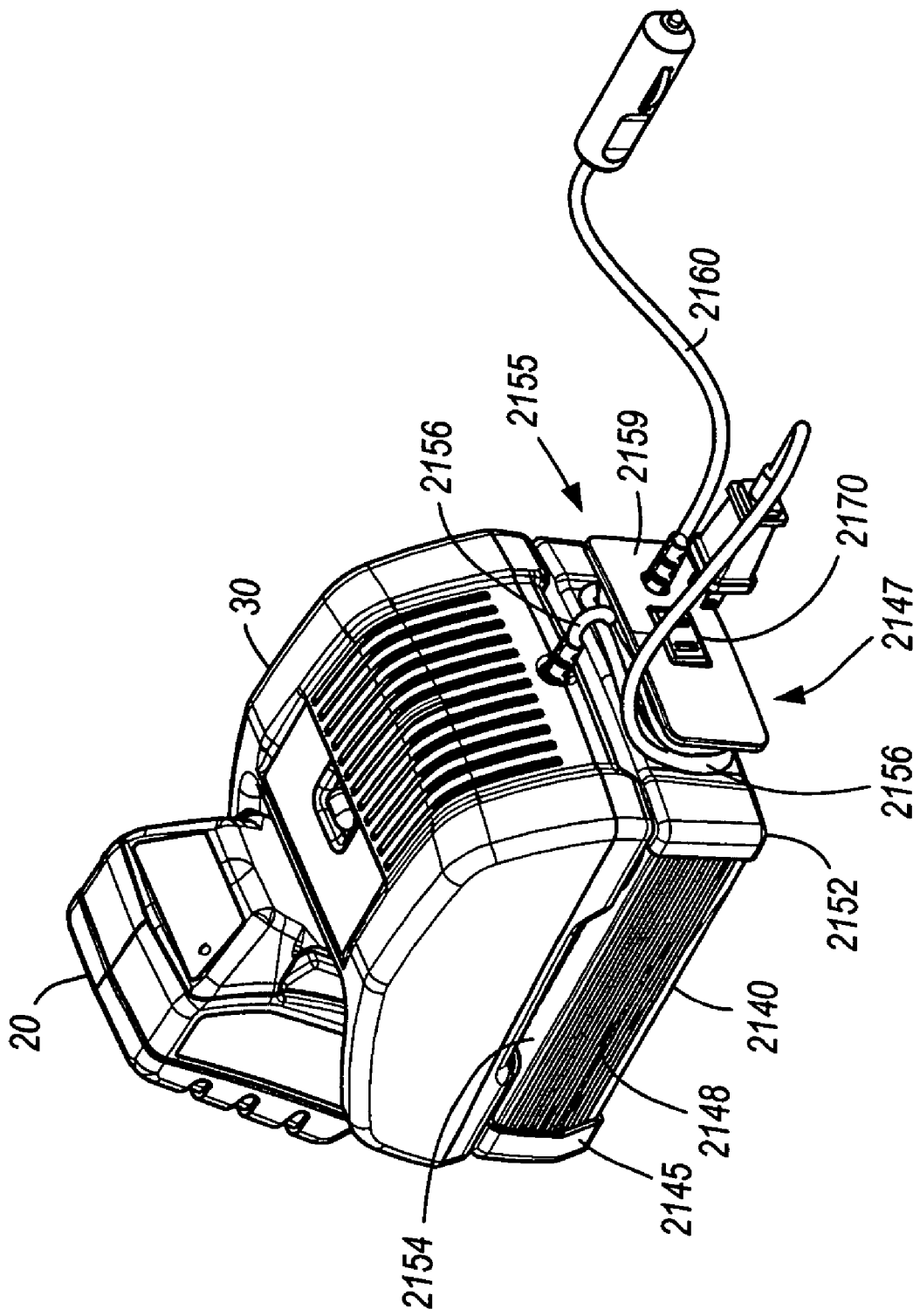
FIG. 18 is a perspective view of a power inverter connected to a battery charger.
Figure 19:
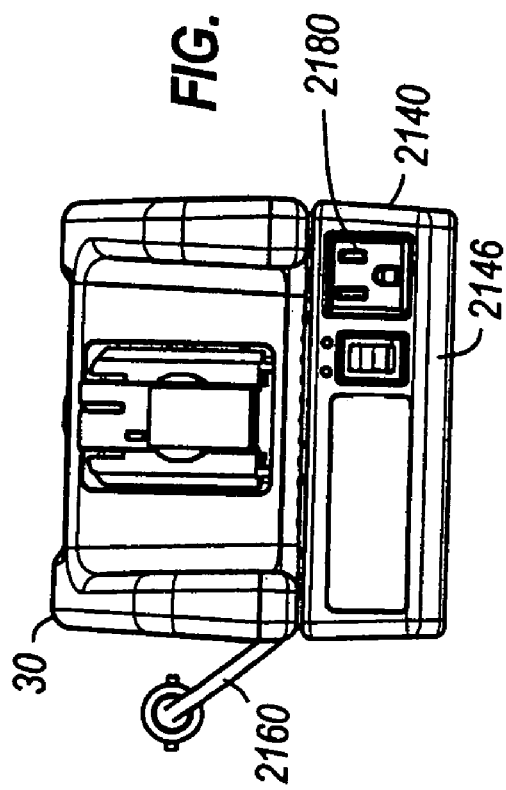
FIG. 19 is a plan view of a power inverter, such as the power inverter of FIG. 18, connected to a battery charger.
Figure 23:
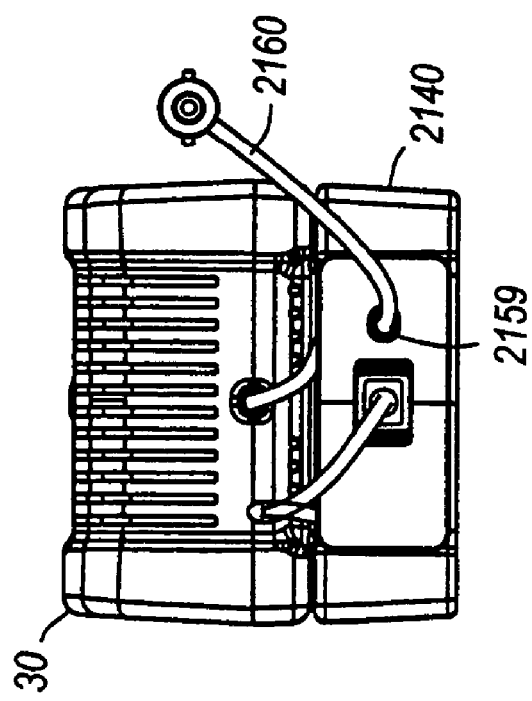
FIG. 23 is rear view of a power inverter, such as the power inverter of FIG. 18, connected to a battery charger.
Figure 21:
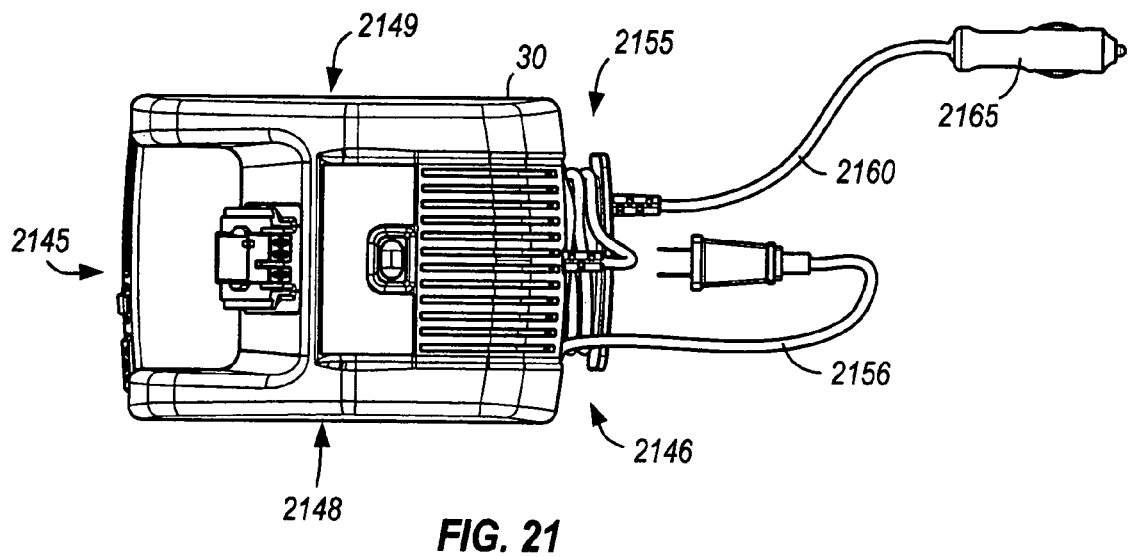
FIG. 21 is a top view of a power inverter, such as the power inverter of FIG. 18, connected to a battery charger.
Figure 20:
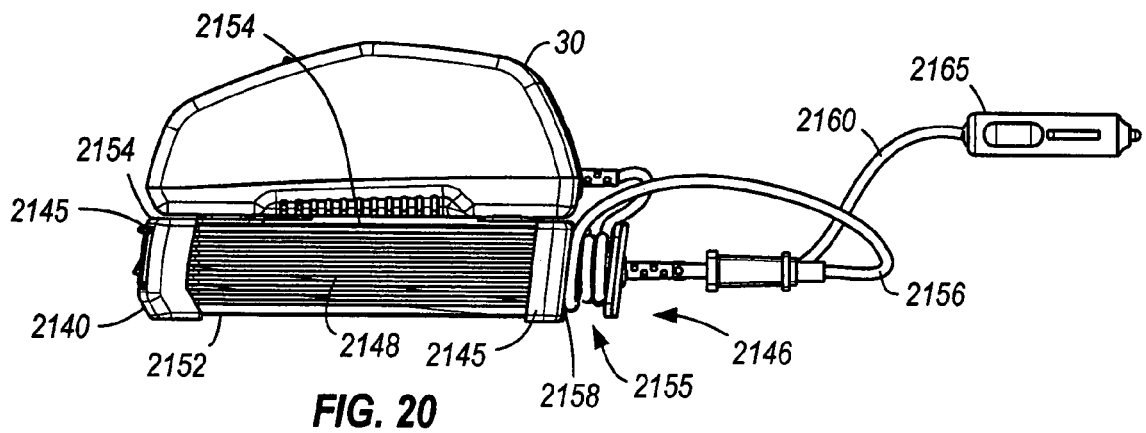
FIG. 20 is a side view of a power inverter, such as the power inverter of FIG. 18, connected to a battery charger.
Figure 22:
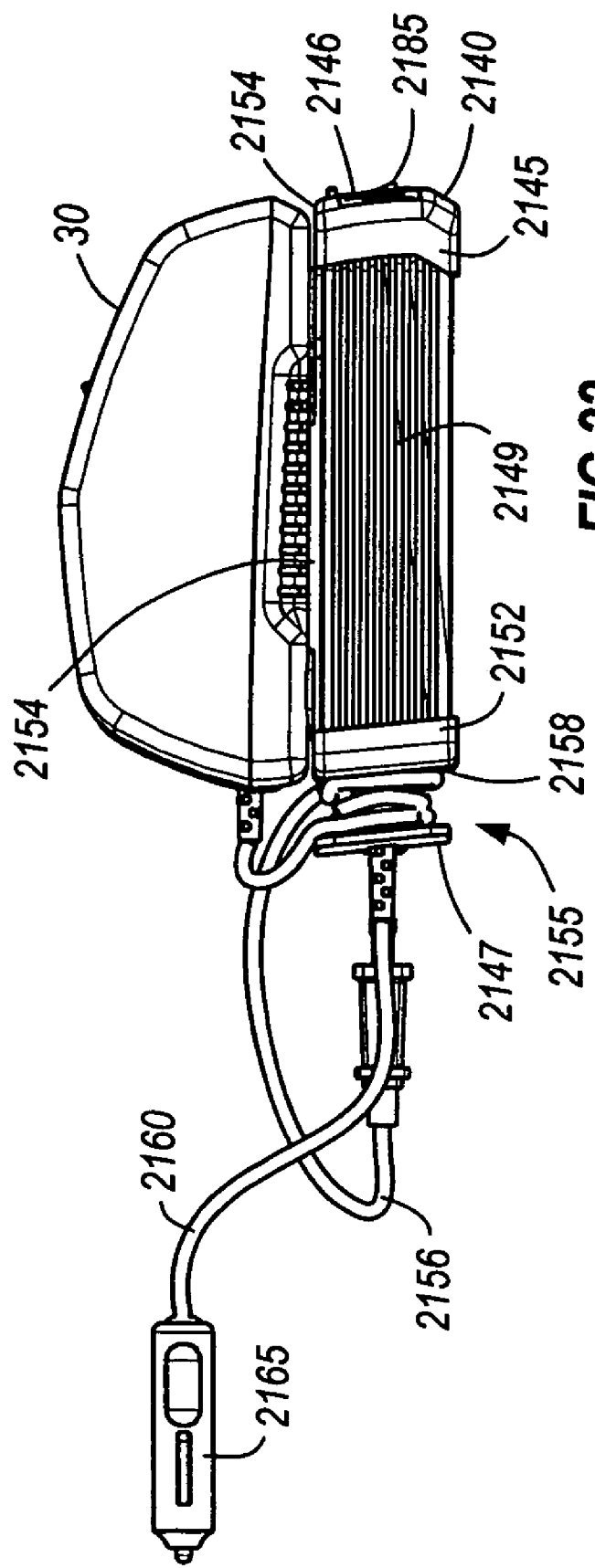
FIG. 22 is another side view of a power inverter, such as the power inverter of FIG. 18, connected to a battery charger.
Figure 26:
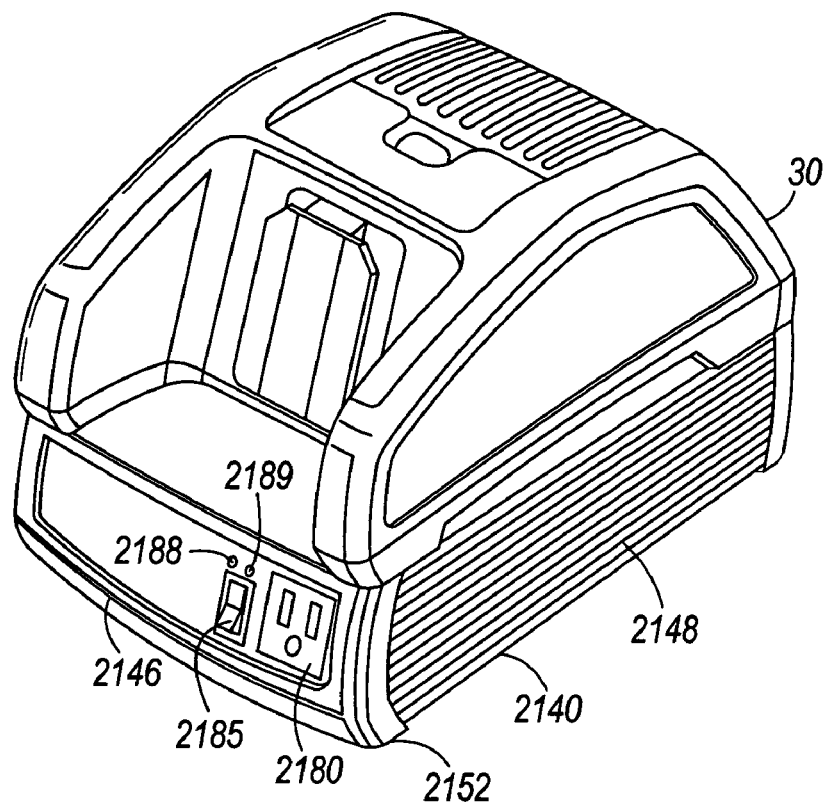
FIG. 26 is still another perspective view of a power inverter, such as the power inverter of FIG. 18, connected to a battery charger.
Figure 27:
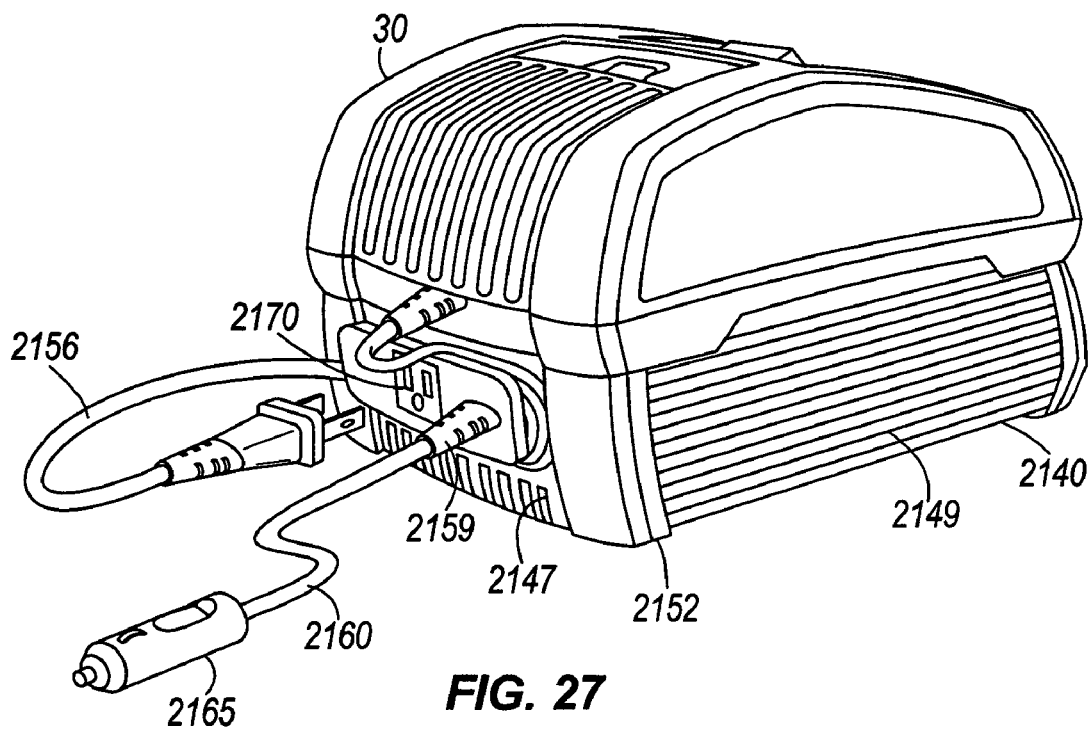
FIG. 27 is still another perspective view of a power inverter, such as the power inverter of FIG. 18, connected to a battery charger.

The power inverter 2140 also includes a converted output 2170 to deliver the second power signal (i.e., the AC power signal). In the illustrated construction, the converted output 2170 includes an AC outlet, such as a three-wire straight blade outlet 2170. As shown in FIG. 18, the outlet 2170 is positioned on cord wrap 2155.

In some constructions, the power inverter 2140 can include a cord wrap 2155. The cord wrap 2155 can store and secure the cord 2156 of the battery charger 30. In the illustrated constructions, a groove 2158 in the second end 2147 of the housing 2145 forms the cord wrap 2155.

In some constructions, the power inverter 2140 can include a second output 2180. In the illustrated construction, the second output 2180 is positioned, on the first end 2146 of the housing 2145 and operable to deliver the second (converted) power signal. In other constructions, the output 2180 can deliver the first power signal (i.e., the DC signal). In further constructions, the inverter 2140 can include additional outputs 2180 that deliver the first power signal or the second power signal. In still further constructions, the inverter 2140 can include a combination of second outlets 2180, at least one that delivers the first power signal and at least another that delivers the second power signal.

In some constructions, the power inverter 2140 can include a switch 2185 that controls the output of power through the converted output 2170. The switch 2185 can include an on position in which the inverter 2140 is operable to dispense power through the converted output 2170 (when the inverter 2140 is receiving a first power signal) and an off position in which the inverter 2140 is not operable to dispense power through the converted output 2170. The positions of the switch 2185 can be indicated to a user by one or more LEDs, such as, for example, the first LED 2188 and the second LED 2189 shown in FIGS. 23-26. In the illustrated constructions, the first LED 2188 and the second LED 2189 are located on the first end 2146 of the housing 2145. In one construction, the first LED 2188 is aired LED and indicates that the inverter 2140 is not operable to supply power through the converted output 2170, and the second LED 2189 is a green LED and indicates that the inverter 2140 is operable to supply power through the converted output 2170. In other constructions, the switch 2185 can control the output of the second output 2180. In still further constructions, the inverter 2140 includes a switch 2185 for each output or outlet 2170, 2180.

In some constructions and in some aspects, the battery charger 30 can charge various rechargeable batteries having different battery chemistry and different nominal voltages, as described below. For example, in an exemplary implementation, the battery charger 30 can charge a first battery having a battery chemistry of NiCd and a nominal voltage of approximately 14.4 V, a second battery having a battery chemistry of Li-ion and a nominal voltage of approximately 18 V, and a third battery having a battery chemistry of Li-ion and a nominal voltage of approximately 28 V. In another exemplary implementation, the battery charger 30 can charge a first Li-ion battery having a nominal voltage of approximately 21 V and a second Li-ion battery having a nominal voltage of approximately 28 V. In this exemplary implementation, the battery charger 30 can identify the nominal voltages of each battery 20, and either scale certain thresholds accordingly, as discussed below, or modify voltage readings or measurements (taken during charging) according to the battery nominal voltage.

In some constructions, the battery charger 30 can identify the nominal voltage of a battery 20 by "reading" an identification component included in the battery 20 or by receiving a signal from, for example, a battery microprocessor or controller. In some constructions, the battery charger 30 may include a range of acceptable nominal voltages for various batteries 20 that the charger 30 is able to identify. In some constructions, the range of acceptable nominal voltages can include a range from approximately 8 V to approximately 50 V. In other constructions, the range of acceptable nominal voltages can include a range from approximately 12 V to approximately 28 V. In further constructions, the battery charger 30 can identify nominal voltages equaling about 12 V and greater. Also in further constructions, the battery charger 30 can identify nominal voltages equaling about 30 V and lower.

In other constructions, the battery charger 30 can identify a range of values that includes the nominal voltage of the battery 20. For example, rather than identifying that a first battery 20 has a nominal voltage of approximately 18 V, the battery charger 30 can, identify that the nominal voltage of the first battery 20 falls within the range of, for example, approximately 18' V to approximately 22 V, or approximately 16 V to approximately 24 V. In further constructions, the battery charger 30 can also identify other battery characteristics, such as, for example, the number of battery cells, the battery chemistry, and the like.

In other constructions, the charger 30 can identify any nominal voltage of the battery 20. In these constructions, the charge 30 can be capable of charging any nominal voltage battery 20 by adjusting or scaling certain thresholds according to the nominal voltage of the battery 20. Also in these constructions, each battery 20, regardless of the nominal voltage, may receive approximately the same amplitude of charge current for approximately the same amount of time (for example, if each battery 20 is approximately fully discharged). The battery charger 30 can either adjust or scale the thresholds (discussed below) or adjust or scale the measurements according to the nominal voltage of the battery 30 being charged.

For example, the battery charger 30 may identify a first battery having, a nominal voltage of approximately 21 V and 5 battery cells. Throughout charging, the battery charger 30 modifies every measurement that the charger 30 samples (e.g., battery voltage) to obtain a per-cell measurement. That is, the charger 30 divides every battery voltage measurement by 5 (e.g., five cells) to obtain, approximately, the average voltage of a cell. Accordingly, all of the thresholds included in the battery charger 30 may correlate to a per-cell measurement. Also, the batter charger 30 may identify a second battery having a nominal voltage of approximately 28 V and 7 battery cells. Similar to the operation with the first battery, the battery charger 30 modifies every voltage measurement to obtain a per-cell measurement. Again, all of the thresholds included in the battery charger 30 may correlate to a per-cell measurement. In this example, the battery charger 30 can use the same thresholds for monitoring and disabling charging for the first and second batteries, enabling the battery charger 30 to charge many batteries over a range of nominal voltages.

In some constructions and in some aspects, the battery charger 30 bases the charging scheme or method for charging the battery 20 on the temperature of the battery 20. In one construction, the battery charger 30 supplies a charging current the battery 20 while periodically detecting or monitoring the temperature of the battery 20. If the battery 20 does not include a microprocessor or controller, the battery charger 30 periodically measures the resistance of the thermistor 66 after predefined periods of time. If the battery 20 includes a microprocessor or controller, such as controller 64, then the battery charger 30 either: 1) interrogates the controller 64 periodically to determine the battery temperature and/or if the battery temperature is outside an appropriate operating range(s); or 2) waits to receive a signal from the controller 64 indicating that the battery temperature is not within an appropriate operating range, as will be discussed below.

In some constructions and in some aspects, the battery charger 30 bases the charging scheme or method for charging the battery 20 on the present voltage of the battery 20. In some constructions, the battery charger 30 supplies a charging current to the battery 20 while periodically detecting or monitoring the battery voltage after predefined periods of time when the current is being supplied to the battery 20 and/or when the current is not being supplied, as will be discussed below. In some constructions, the battery charger 30 bases the charging scheme or method for charging the battery 20 on both the temperature and the voltage of the battery 20. Also, charging scheme can be based on individual cell voltages.

Once the battery temperature and/or battery voltage exceeds a predefined threshold or does not fall within an appropriate operating range, the battery charger 30 interrupts the charging current. The battery charger 30 continues to periodically detect or monitor the battery temperature/voltages or waits to receive a signal from the controller 64 indicating that the battery temperature/voltages are within an appropriate operating range. When the battery temperature/voltages are within an appropriate operating range, the battery charger 30 may resume the charging current supplied to the battery 20. The battery charger 30 continues to monitor the battery temperature/voltages and continues to interrupt and resume the charging current based on the detected batter-temperature/voltages. In some constructions, the battery charger 30 terminates charging after a predefined time period or when the battery capacity reaches a predefined threshold. In other constructions, charging is terminated when the battery 20 is removed from the battery charger 30.

Figure 5A:
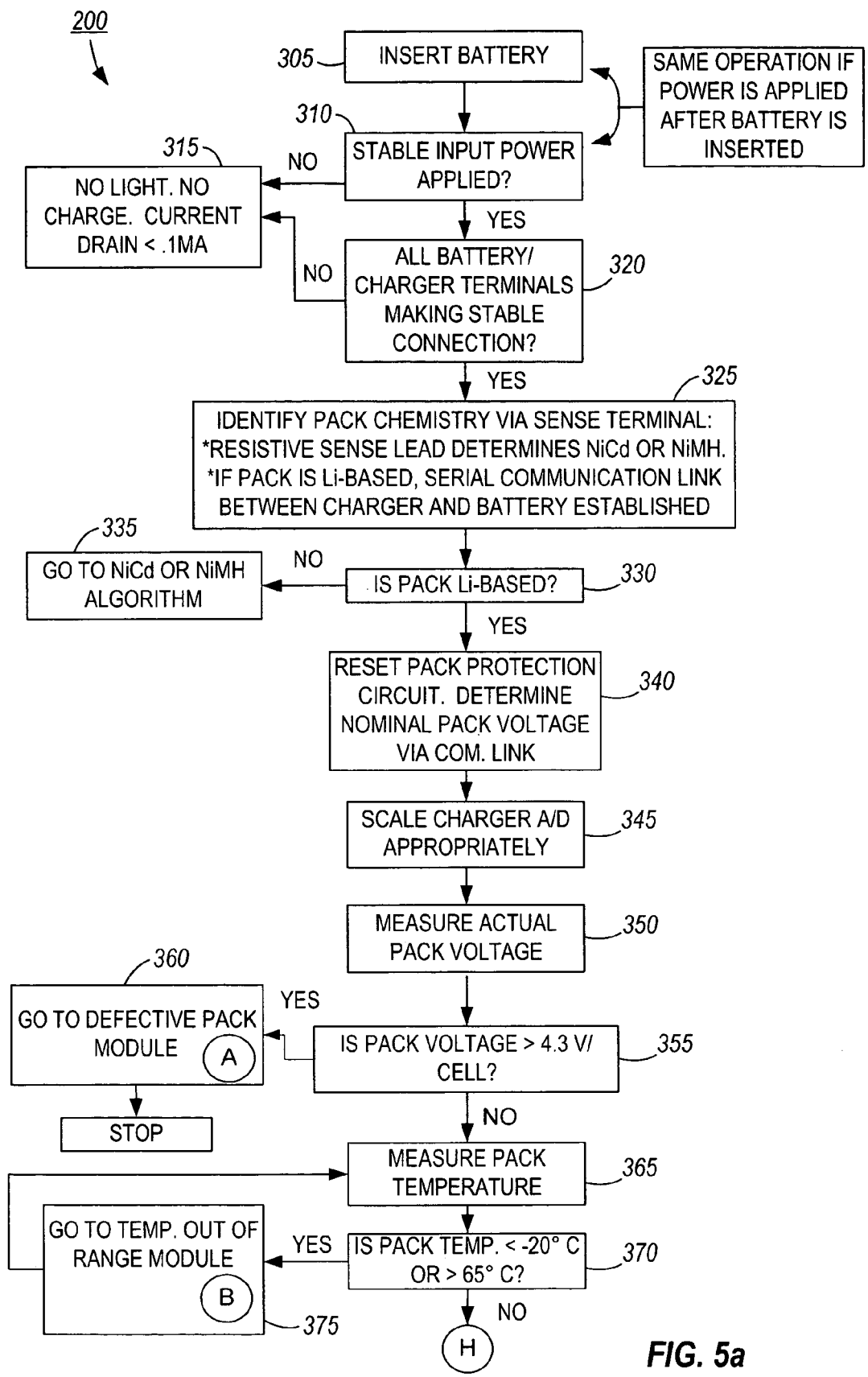
FIGS. 5a and 5b are flowcharts illustrating operation of a battery charger embodying aspects of the invention, such as the battery charger shown in FIG. 3.
Figure 5B:
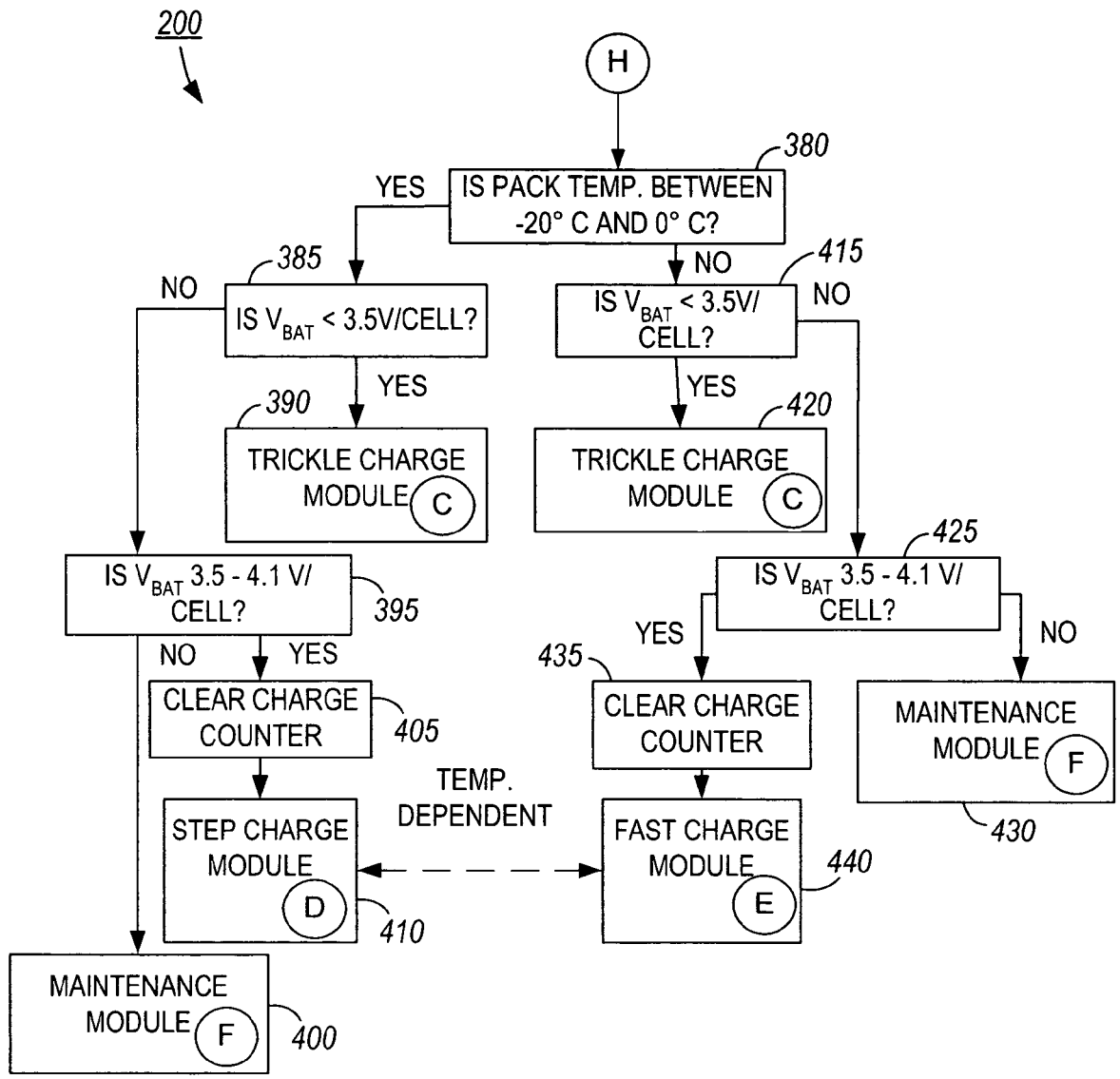

In some constructions and in some aspects, the battery charger 30 includes a method of operation for charging various batteries, such as the battery 20, having different chemistries and/or nominal voltages. An example of this charging operation 200 is illustrated in FIGS. 5a and 5b. In some constructions and in some aspects, the battery charger 30 includes a method of operation for charging Li-based batteries, such as batteries having a Li—Co chemistry, a Li—Mn spinel chemistry, a Li—Mn Nickel chemistry, and the like. In some constructions and in some aspects, the charging operation 200 includes various modules for performing different functions in response to different battery conditions and/or battery characteristics.

In some constructions and in some aspects, the method of operation 200 includes modules for interrupting charging based on abnormal and/or normal battery conditions. In some constructions, the charging operation 200 includes a defective pack module, such as the defective pack module illustrated in flowchart 205 of FIG. 6, and/or a temperature out-of-range module, such as the temperature out-of-range module illustrated in flowchart 210 of FIG. 7. In some constructions, the battery charger 30 enters the defective pack module 205 in order to terminate charging based on abnormal battery voltage, abnormal cell voltage and/or abnormal battery capacity. In some constructions, the battery charger 30 enters the temperature out-of-range module 210 in order to terminate charging based on abnormal battery temperature and/or one or more abnormal battery cell temperatures. In some constructions, the charging operation 200 includes more or fewer modules which terminate charging based on more or fewer battery conditions than the modules and conditions discussed above and below. Other constructions of a charging operation and charging modules are shown in FIGS. 28-38.

In some constructions and in some aspects, the charging operation 2600 includes various modes or modules for charging the battery 20 based on various battery conditions. In some constructions, the charging operation 200 includes a trickle charge module, such as the trickle charge module illustrated in flowchart 215 of FIG. 8, a step charge module, such as the step charge module illustrated in flowchart 220 of FIG. 9, a fast charge module, such as the fast charge module illustrated in flowchart 225 of FIG. 10, and/or a maintenance charge module, such as the maintenance module illustrated in flowchart 230 of FIG. 11.

In some constructions and in some aspects, charging is selected by the controller 100 during the charging operation 200 based on certain battery temperature ranges, certain battery voltage ranges and/or certain battery capacity ranges. In some constructions, each module 215-230 is selected by the controller 100 based on the battery characteristics shown in Table 1. In some constructions, the condition "battery temperature" or "temperature of the battery" can include the temperature of the battery taken as a whole (i.e., battery cells, battery components, etc.) and/or the temperature of the battery cells taken individually or collectively. In some constructions, each charging module 215-230 can be based on the same base charging scheme or charging algorithm, such as, for example, a full charge current, as discussed below.

[t1] Operation for Charging Li-Based Batteries.

TABLE 1

Operation for Charging Li-based Batteries

| Battery Voltage (V/cell) | Battery Temperature (° C.) | | | |
|---|---|---|---|---|
| | <$T_1$ | $T_1$ to $T_2$ | $T_2$ to $T_3$ | >$T_3$ |
| <$V_1$ | No charge. Slow blink for first LED. | Trickle charge. First LED on steady. | Trickle charge. First LED on steady. | No charge. Slow blink for first LED. |
| $V_1$ to $V_2$ | No charge. Slow blink for first LED. | Step charge. First LED on steady until near full charge, then turns off. Second LED blinks near full charge. | Fast charge. First LED on steady until near full charge, then turns off. Second LED blinks near full charge. | No charge. Slow blink for first LED. |
| $V_2$ to $V_3$ | No charge. Slow blink for first LED. | Maintenance charge. Second LED on steady. | Maintenance charge. Second LED on steady. | No charge. Slow blink for first LED. |
| >$V_3$ | No charge. Fast blink for first LED. | No charge. Fast blink for first LED. | No charge. Fast blink for first LED. | No charge. Fast blink for first LED. |

In some constructions and in some aspects, the charging current applied to the battery 20 during the trickle charge module 215 includes applying a full charge current (e.g., "I") to the battery 20 for a first time period, such as, for example, ten seconds, and then suspending the full charge current for a second time period, such as, for example, fifty seconds. In some constructions, the full charge current is a pulse of charging current approximately at a predefined amplitude. In some constructions, the battery charger 30 only enters the trickle charge module 215 if the battery voltage is less than a first predefined voltage threshold, $V_1$.

In some constructions and in some aspects, the charging current applied to the battery 20 during the fast charge module 225 includes applying the full charge current to the battery 20 for a first time period, such as, for example, one second, and then suspending the full charge current for a second time period, such as, for example, 50-ms. In some constructions, the controller 100 sets a back-up timer to a first predefined time limit, such as, for example, approximately two hours. In these constructions, the battery charger 30 will not implement the fast charge module 225 for the predefined time limit in order to avoid battery damage. In other constructions, the battery charger 30 will shut down (e.g., stop charging) when the predefined time limit expires.

In some constructions, the battery charger 30 only enters the fast charge module 225 if the battery voltage is included in a range from the first voltage threshold, $V_1$, to a second predefined voltage threshold, $V_2$, and the battery temperature falls within a range from a second battery temperature threshold, $T_2$, to a third battery temperature threshold, $T_3$. In some constructions, the second voltage threshold, $V_2$, is greater than the first voltage threshold, $V_1$, and the third temperature threshold, $T_3$, is greater than the second temperature threshold, $T_2$.

In some constructions and in some aspects, the charging current applied to the battery 20 during the step charge module 220 includes applying the charging current of the fast charge module 225 to the battery 20, but having a duty cycle of one minute charging ("ON"), one minute suspended charging ("OFF"). In some constructions, the controller 100 sets a back-up timer to a second predefined time limit, such as, for example, approximately four hours. In these constructions, the battery charger 30 will not implement the step charge module 220 for the predefined time limit in order to avoid battery damage.

In some constructions, the battery charger 30 only enters the step charge module 220 if the battery voltage is included in a range from the first voltage threshold, $V_1$, to the second voltage threshold, $V_2$, and the battery temperature falls within a range from the first temperature threshold, $T_1$, to the second temperature threshold, $T_2$. In some constructions, the second voltage threshold, $V_2$, is greater than the first voltage threshold, $V_1$, and the second temperature threshold, $T_2$, is greater than the first temperature threshold, $T_1$.

In some constructions and in some aspects, the charging current applied to the battery 20 during the maintenance module 230 includes applying a full charge current to the battery 20 only when the battery voltage falls to a certain predefined threshold. In some constructions, the threshold is approximately 4.05-V/cell +/−1% per cell. In some constructions, the battery charger 30 only enters the maintenance module 230 if the battery voltage is included in the range of the second voltage threshold, $V_2$, to the third voltage threshold, $V_3$, and the battery temperature falls within a range from the first temperature threshold, $T_1$, to the third temperature threshold, $T_3$.

In some constructions and in some aspects, the controller 100 implements the various charging modules 220-230 based on various battery conditions. In some constructions, each charging module 220-230 includes the same charging algorithm (e.g., algorithm for applying the full charge current). However, each charging module 220-230 implements, repeats or incorporates the charging algorithm in a different manner. An example of a charging algorithm is the charge current algorithm illustrated in flowchart 250 of FIG. 12, as will be discussed below.

As illustrated in FIGS. 5a and 5b, the charging operation 200 begins when a battery, such as the battery 20, is inserted or electrically connected to the battery charger 30 at step 305. At step 310, the controller 100 determines if a stable input of power, such as, for example, the power source 130, is applied or connected to the battery charger 30. As indicated in FIG. 5a, the same operation (i.e., step 305 proceeding to step 310) still applies if power is applied after the battery 20 is electrically connected to the battery charger 30.

If the controller 100 determines there is not a stable input of power applied, then the controller 100 does not activate the indicator 110 and no charge is applied to the battery 20 at step 315. In some constructions, the battery charger 30 draws a small discharge current at step 315. In some constructions, the discharge current is approximately less than 0.1-mA.

If the controller 100 determines there is a stable input of power applied to the battery charger 30 at step 310, then the operation 200 proceeds to step 320. At step 320, the controller 100 determines if all the connections between the battery terminals 45, 50 and 55 and the battery charger terminals 80, 85 and 90 are stable. If the connections are not stable at step 320, the controller 100 continues to step 315.

If the connections are stable at step 320, the controller 100 identifies the chemistry of the battery 20 via the sense terminal 55 of the battery 20 at step 325. In some constructions, a resistive sense lead from the battery 20, as sensed by the controller 100, indicates that the battery 20 has a chemistry of either NiCd or NiMH. In some constructions the controller 100 will measure the resistance of the resistive sense lead to determine the chemistry of the battery 20. For example, in some constructions, if the resistance of the sense lead falls in a first range, then the chemistry of the battery 20 is NiCd. If the resistance of the sense lead falls in a second range, then the chemistry of the battery 20 is NiMH.

In some constructions, NiCd batteries and NiMH batteries are charged by the battery charger 30 using a single charging algorithm that is different from a charging algorithm implemented for batteries having Li-based chemistries. In some constructions, the single charging algorithm for NiCd and NiMH batteries is, for example, an existing charging algorithm for NiCd/NiMH batteries. In some constructions, the battery charger 30 uses the single charging algorithm for charging NiCd batteries and NiMH batteries but ends the charging process for NiCd batteries with a different termination scheme than the termination scheme used to terminate charging for NiMH batteries. In some constructions, the battery charger 30 terminates charging for NiCd batteries when a negative change in the battery voltage (e.g., $-\Delta V$) is detected by the controller 100. In some constructions, the battery charger 30 terminates charging for NiMH batteries when a change in battery temperature over time (e.g., $\Delta T/dt$) reaches or exceeds a predefined termination threshold.

In some constructions, the NiCd and/or NiMH batteries are charged using a constant current algorithm. For example, the battery charger 30 can include the same charging circuitry for charging different batteries having differing battery chemistries, such as NiCd, NiMH, Li-ion, and the like. In an exemplary construction, the charger 30 can use the charging circuitry to apply the same full charge current to NiCd and NiMH batteries as Li-ion batteries using a constant current algorithm instead of pulse charging. In another exemplary construction, the battery charger 30 can be capable of scaling the full charge current through the charging circuitry according to the battery chemistry.

In other constructions, the controller 100 does not determine the exact chemistry of the battery 20. Rather, the controller 100 implements a charging module that can effectively charge both NiCd batteries and NiMH batteries.

In other constructions, the resistance of the sense lead could indicate that the battery 20 has a Li-based chemistry. For example, if the resistance of the sense lead falls in a third range, then the chemistry of the battery 20 is Li-based.

In some constructions, a serial communication link between the battery charger 30 and the battery 20 established through the sense terminals 55 and 90 indicates that the battery 20 has a Li-based chemistry. If a serial communication link is established at step 320, then a microprocessor or controller, such as the controller 64, in the battery 20 sends information regarding the battery 20 to the controller 100 in the battery charger 30. Such information transferred between the battery 20 and battery charger 30 can include battery chemistry, nominal battery voltage, battery capacity, battery temperature, individual cell voltages, number of charging cycles, number of discharging cycles, status of a protection circuit or network (e.g., activated, disabled, enabled, etc.), etc.

At step 330, the controller 100 determines if the chemistry of the battery 20 is Li-based or not. If the controller 100 determines that the battery 20 has a chemistry of either NiCd or NiMH at step 330, then the operation 200 proceeds to the NiCd/NiMH charging algorithm at step 335.

If the controller 100 determines that the battery 20 has a chemistry that is Li-based at step 330, then the operation 200 proceeds to step 340. At step 340, the controller 100 resets any battery protection circuit, such as, for a switch, included in the battery 20 and determines the nominal voltage of the battery 20 via the communication link. At step 345, the controller 100 sets the charger analog-to-digital converter ("A/D") to the appropriate level based on nominal voltage.

At step 350, the controller 100 measures the present voltage of the battery 20. Once a measurement is made, the controller 100 determines if the voltage of the battery 20 is greater than 4.3-V/cell at step 355. If the battery voltage is greater than 4.3-V/cell at step 355, then the operation 200 proceeds to the defective pack module 205 at step 360. The defective pack module 205 will be discussed below.

If the battery voltage is not greater than 4.3-V/cell at step 355, then the controller 100 measures the battery temperature at step 365 and determines if the battery temperature falls below $-20°$ C. or exceeds $65°$ C. at step 370. If the battery temperature is below $-20°$ C. or is above $65°$ C. at step 370, then the operation 200 proceeds to the temperature out-of-range module 210 at step 375. The temperature out-of-range module 210 will be discussed below.

If the battery temperature is not below $-20°$ C. or does not exceed $65°$ C. at step 370, then the controller 100 determines at step 380 (shown in FIG. 5b) if the battery temperature falls between $-20°$ C. and $0°$ C. If the battery temperature falls between $-20°$ C. and $0°$ C. at step 380, the operation 200 proceeds to step 385. At step 385, the controller 100 determines if the battery voltage is less than 3.5-V/cell. If the battery voltage is less than 3.5-V/cell, the operation 200 proceeds to the trickle charge module 215 at step 390. The trickle charge module 215 will be discussed below.

If the battery voltage is not less than 3.5-V/cell at step 385, the controller 100 determines if the battery voltage is included in the voltage range of 3.5-V/cell to 4.1-V/cell at step 395. If the battery voltage is not included in the voltage range of 3.5-V/cell to 4.1-V/cell at step 395, then the operation 200 proceeds to the maintenance module 230 at step 400. The maintenance module 230 will be discussed below.

If the battery voltage is included in the voltage range of 3.5-V/cell to 4.1-V/cell at step 395, the controller 100 clears a counter, such as a charge counter, at step 405. Once the charge counter is cleared at step 405, the operation 200 proceeds to the step charge module 220 at step 410. The step charge module 220 and charge counter will be discussed below.

Referring back to step 380, if the battery temperature is not included within the range of $-10°$ C. and $0°$ C., the controller 100 determines if the battery voltage is less than 3.5-V/cell at step 415. If the battery voltage is less than 3.5-V/cell at step 415, the operation 200 proceeds to the trickle charge module 215 at step 420.

If the battery voltage is not less than 3.5-V/cell at step 415, the controller 100 determines if the battery voltage is included in the voltage range of 3.5-V/cell to 4.1-V/cell at step 425. If the battery voltage is not included in the voltage range of 3.5V/cell to 4.1-V/cell at step 425, then the operation 200 proceeds to the maintenance module 230 at step 430.

If the battery voltage is included in the voltage range of 3.5-V/cell to 4.1-V/cell at step 425, the controller 100 clears a counter, such as the charge counter, at step 435. Once the charge counter is cleared at step 435, the operation 200 proceeds to the fast charge module 225 at step 440. The fast charge module 225 will be discussed below.

Figure 6:
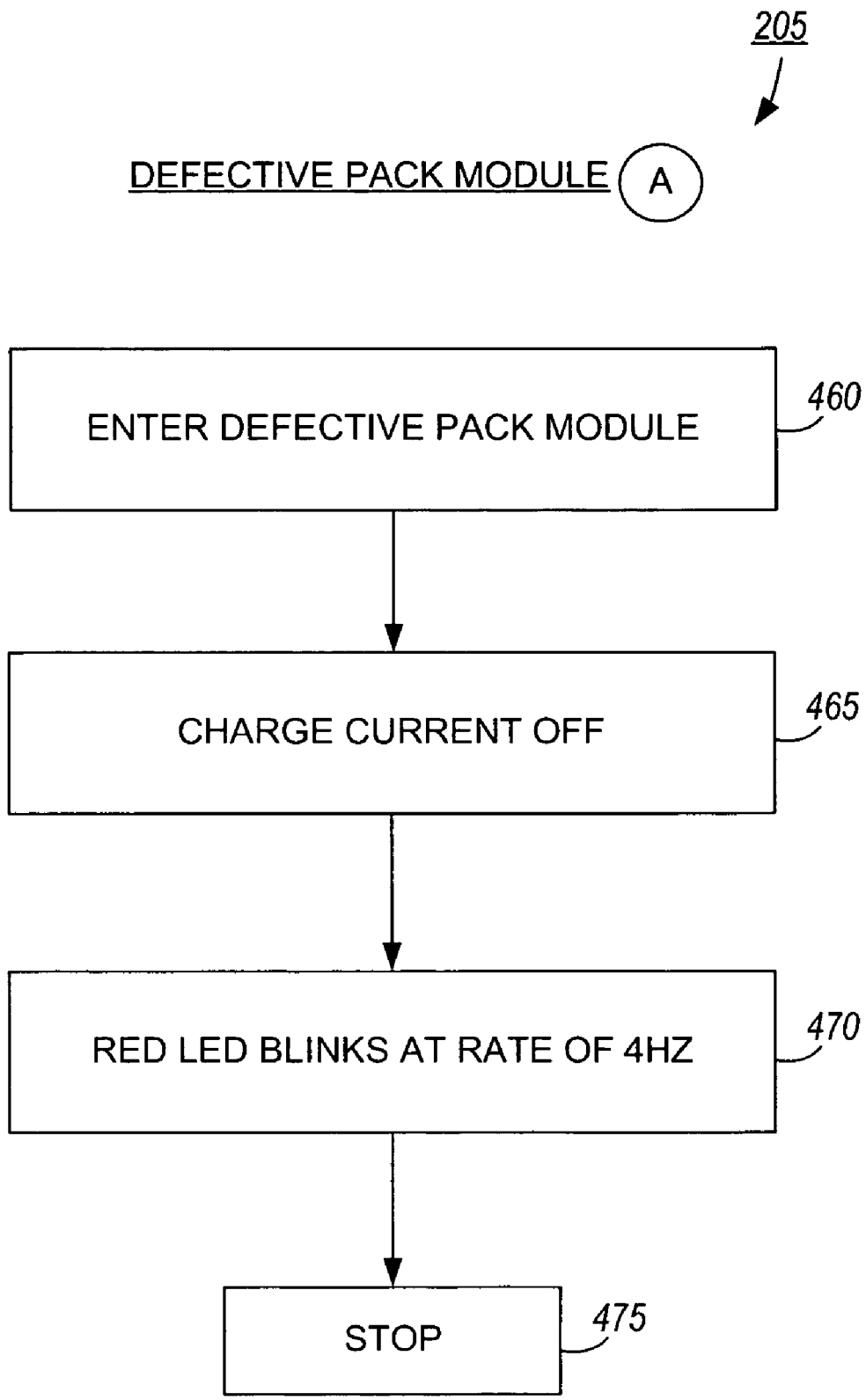
FIG. 6 is a flowchart illustrating a first module capable of being implemented on a battery charger embodying aspects of the invention, such as the battery charger shown in FIG. 3.

FIG. 6 is a flowchart illustrating the operation of the defective pack module 205. Operation of the module 205 begins when the main charging operation 200 enters the defective pack module 205 at step 460. The controller 100 interrupts the charging current at step 465 and activates the indicator 110, such as the first LED, at step 470. In the illustrated construction, the controller 100 controls the first LED to blink at a rate of approximately 4-Hz. Once the indicator 110 is activated in step 470, the module 205 ends at step 475, and the operation 200 may also end.

Figure 7:
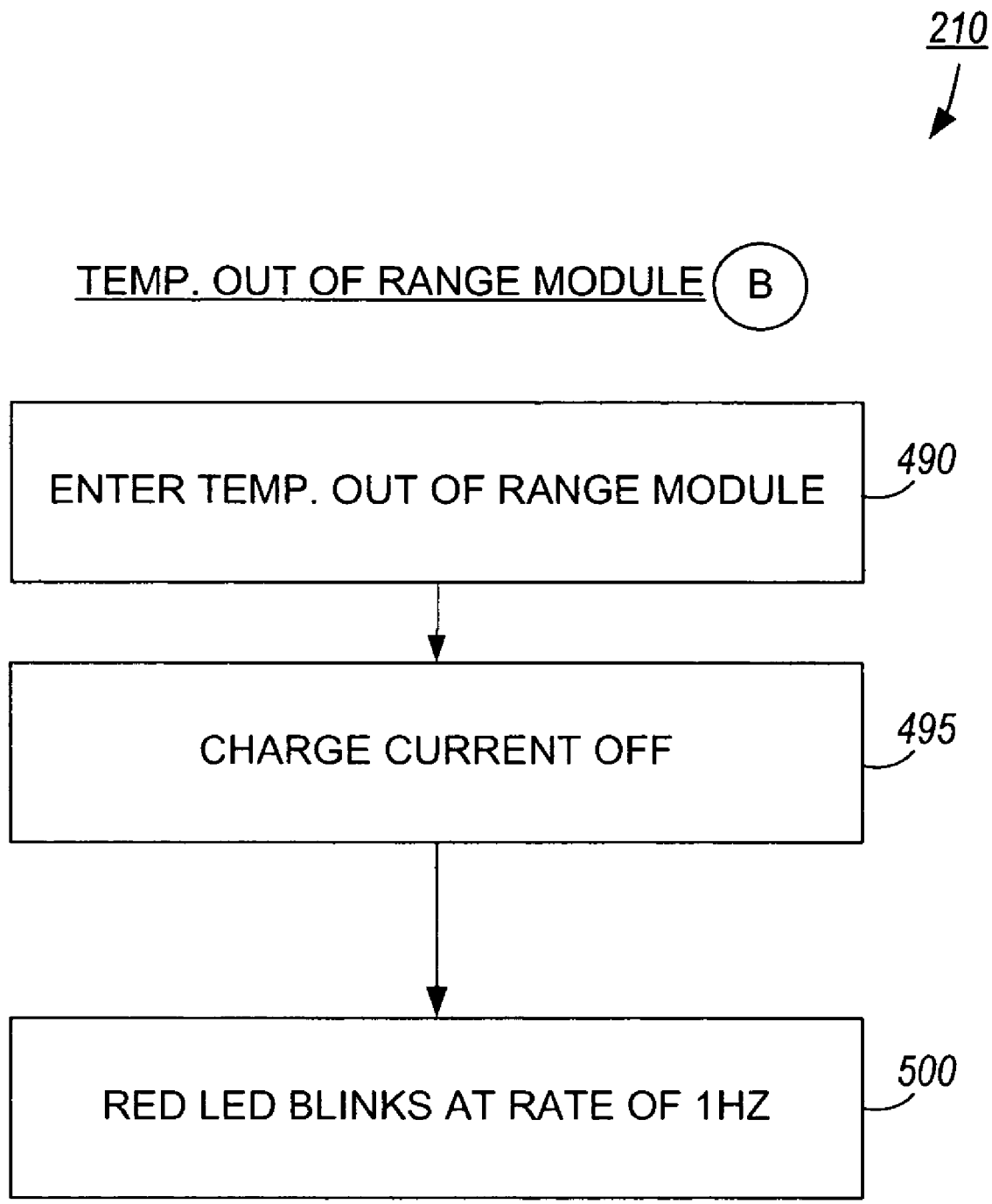
FIG. 7 is a flowchart illustrating a second module capable of being implemented on a battery charger embodying aspects of the invention, such as the battery charger shown in FIG. 3.

FIG. 7 is a flowchart illustrating the operation of the temperature out-of-range module 210. Operation of the module 210 begins when the main charging operation 200 enters the temperature out-of-range module 210 at step 490. The controller 100 interrupts the charging current at step 495 and activates the indicator 110, such as the first LED, at step 500. In the construction illustrated, the controller 100 controls the first LED to blink at a rate of approximately 1-Hz to indicate to a user that the battery charger 30 is currently in the temperature-out-of-range module 210. Once the indicator 110 is activated in step 500, operation 200 exits the module 210 and proceeds to where the operation 200 left off.

Figure 8:
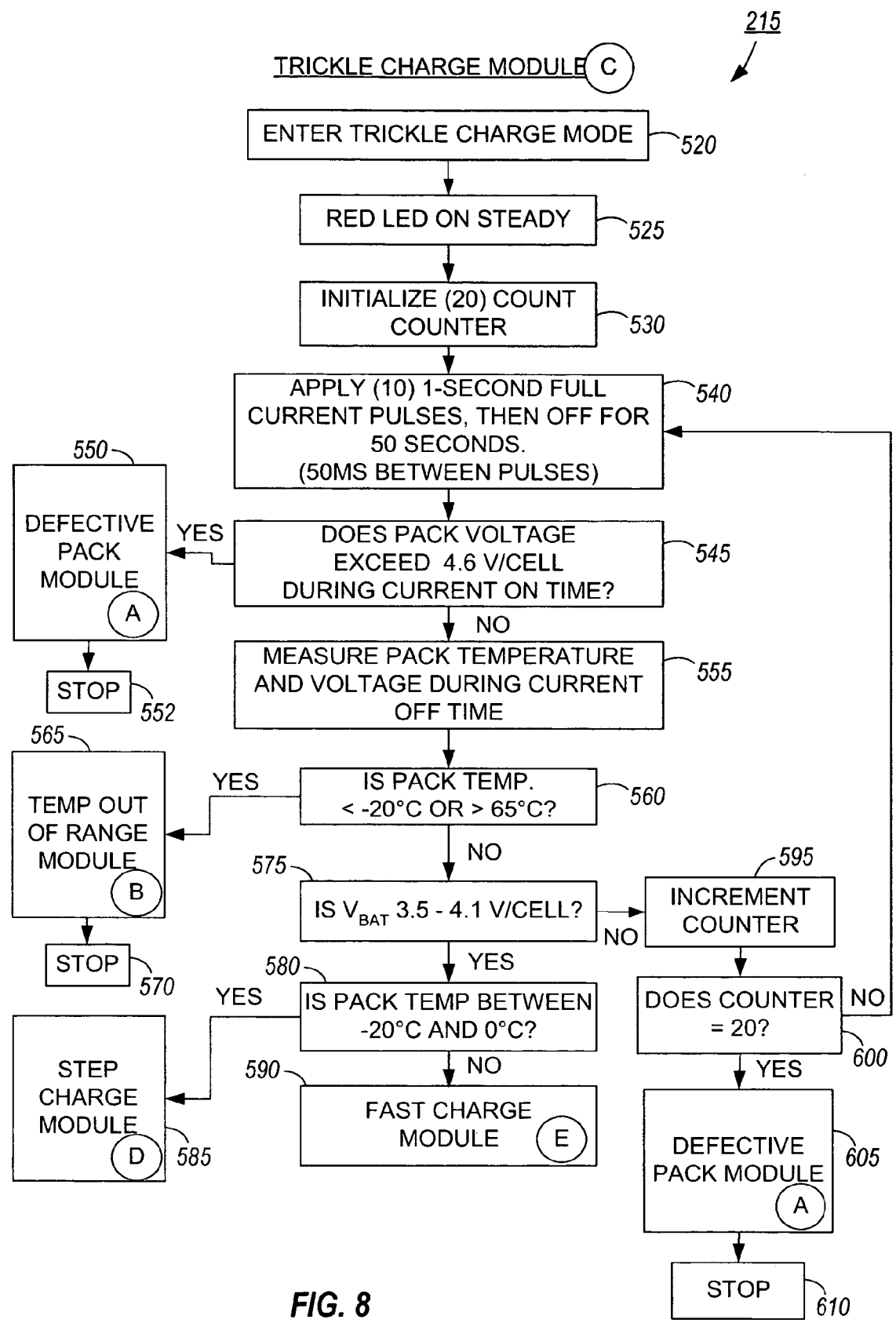
FIG. 8 is a flowchart illustrating a third module capable of being implemented on a battery charger embodying aspects of the invention, such as the battery charger shown in FIG. 3.

FIG. 8 is a flowchart illustrating the trickle charge module 215. Operation of the module 215 begins when the main charging operation 200 enters the trickle charge module 215 at step 520. The controller 100 activates the indicator 110, such as the first LED 115, at step 525 to indicate to a user that the battery charger 30 is currently charging the battery 20. In the illustrated construction, the controller 100 activates the first LED 115 so that it appears to be constantly on.

Once the indicator 110 is activated in step 525, the controller 100 initializes a counter, such as a trickle charge count counter, at step 530. In the construction illustrated, the trickle charge count counter has a count limit of twenty.

At step 540, the controller 100 begins to apply ten one second ("1-s") full current pulses to the battery 20 and then suspends charging for fifty seconds ("50-s"). In some constructions, there are 50-ms time intervals between the 1-s pulses.

At step 545, the controller 100 measures the battery voltage when a charging current is applied to the battery 20 (e.g., current on-times) to determine if the battery voltage exceeds 4.6-V/cell. If the battery voltage exceeds 4.6-V/cell during current on-times at step 545, the module 215 proceeds to the defective pack module 205 at, step 550 and would end at step 552. If the battery voltage does not exceed 4.6-V/cell during current on-times at step 545, the controller 100 measures the battery temperature and the battery voltage when a charging current is not applied to the battery 20 (e.g., current off-times) at step 555.

At step 560, the controller 100 determines if the battery temperature falls below −10° C. or exceeds 65° C. If the battery temperature is below −20° C. or is above 65° C. at step 560, then the module 215 proceeds to the temperature out-of-range module 210 at step 565 and would end at step 570. If the battery temperature is not below −20° C. or is not above 65° C. at step 560, then the controller 100 determines if the battery voltage is included in the range of 3.5-V/cell to 4.1-V/cell at step 575.

If the battery voltage is included in the range of 3.5-V/cell to 4.1-V/cell at step 575, then the controller 100 determines if the battery temperature is included in the range of −20° C. to 0° C. at step 580. If the battery temperature is included in the range of −20° C. to 0° C. at step 580, then the module 215 proceeds to the step charge module 220 at step 585. If the battery temperature is not included in the range of −20° C. to 0° C. at step 580, then the module 215 proceeds to the fast charge module 225 at step 590.

If the battery voltage is not included in range of 3.5-V/cell to 4.1-V/cell at step 575, then the controller 100 increments the trickle charge count counter at step 595. At step 600, the controller 100 determines if the trickle charge count counter equals the counter limit, such as for example, twenty. If the counter does not equal the counter limit at step 600, the module 215 proceeds to step 540. If the counter does equal the count limit at step 600, the module 215 proceeds to the defective pack module 205 at step 605 and would end at step 610.

Figure 9:
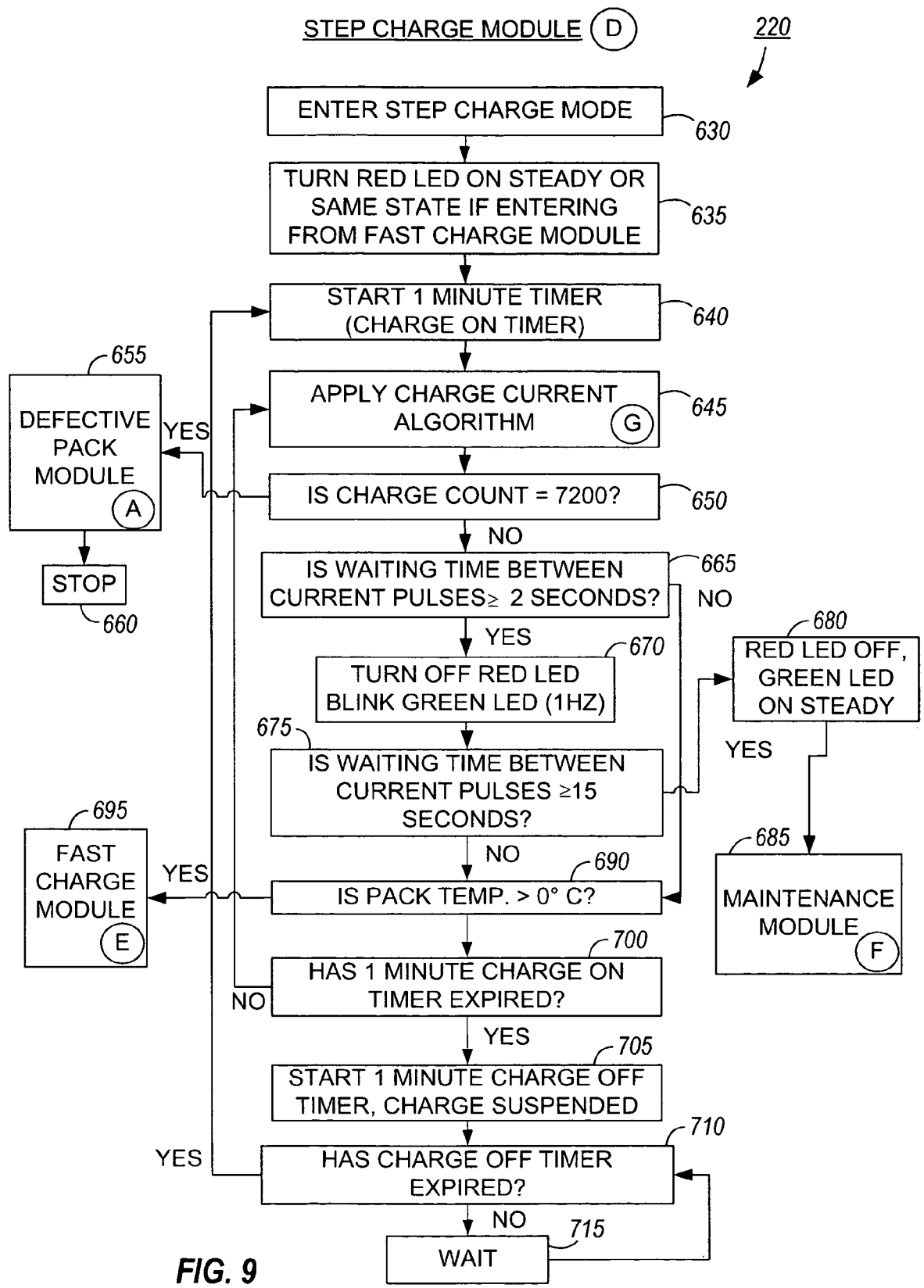
FIG. 9 is a flowchart illustrating a fourth module capable of being implemented on a battery charger embodying aspects of the invention, such as the battery charger shown in FIG. 3.

FIG. 9 is a flowchart illustrating the step charge module 220. Operation of the module 220 begins when the main charging operation 200 enters the step charge module 220 at step 630. The controller 100 activates the indicator 110, such as the first LED 115, at step 635 to indicate to a user that the battery charger 30 is currently charging the battery 20. In the illustrated construction, the controller 100 activates the first LED 115 so that it appears to be constantly on.

At step 640, the controller 100 starts a first timer or charge-on timer. In the illustrated construction, the charge-on timer counts down from one minute. At step 645, the module 220 proceeds to the charge current algorithm 250. Once the charge current algorithm 250 is performed, the controller 100 determines if the charge count equals the count limit, such as, for example, 7,200, at step 650. If the charge count equals the count limit at step 650, the module 220 proceeds to the defective pack module 205 at step-655 and the module 220 would end at step 660.

If the charge count does not equal the count limit at step 650, the controller 100 determines if the waiting time between current pulses (as will be discussed below) is greater than or equal to a first waiting time threshold, such as, for example, two seconds, at step 665. If the waiting time is greater than or equal to the first waiting time threshold at step 665, the controller 100 activates the indicator 110 at step 670, such as, for example, turns off the first LED 115 and activates the second LED 120 to blink at approximately 1-Hz. If the waiting time is not greater than or equal to the first waiting time threshold at step 665, the module 220 proceeds to step 690, which is discussed below.

Once the indicator 110 is activated at step 670, the controller 100 determines if the waiting time between current pulses is greater than or equal to a second waiting time threshold, such as, for example, fifteen seconds, at step 675. If the waiting time is greater than or equal to the second waiting time threshold at step 675, the controller 100 changes the indicator 110 at step 680, such as, for example, activates the second LED 120 such that the second LED 120 appears to be on constantly. The module 220 then proceeds to the maintenance module 230 at step 685.

If the waiting time is not greater than or equal to the second waiting time threshold at step 675, the controller 100 determines if the battery temperature is greater than 0° C. at step 690. If the battery temperature is greater than 0° C. at step 690, the module 220 proceeds to the fast charge module 225 at step 695. If the battery temperature is not greater than 0° C. at step 690, the controller 100 determines if the charge-on timer has expired at step 700.

If the charge-on timer has not expired at step 700, the module 220 proceeds to the charge current algorithm 250 at step 645. If the charge-on timer has expired at step 700, the controller 100 activates a second timer or a charge-off timer at step 705 and suspends charging. At step 710, the controller 100 determines if the charge-off timer has expired. If the charge-off timer has not expired at step 710, the controller 100 waits for a predefined amount of time at step 715 and then proceeds back to step 710. If the charge-off timer has expired at step 710, the module 220 proceeds back to step 640 to start the charge-on timer again.

Figure 10:
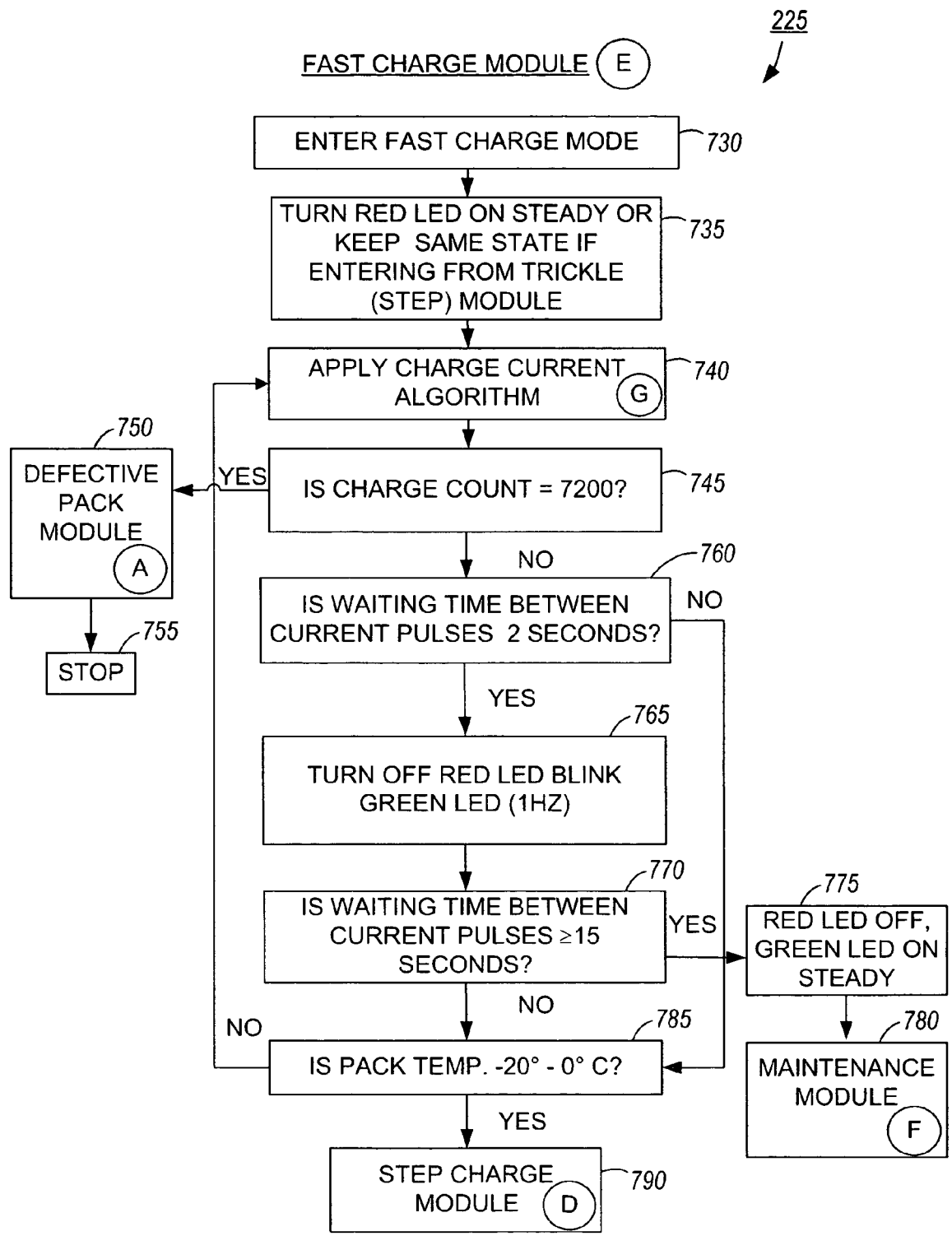
FIG. 10 is a flowchart illustrating a fifth module capable of being implemented on a battery charger embodying aspects of the invention, such as the battery charger shown in FIG. 3.

FIG. 10 is a flowchart illustrating the fast charge module 225. Operation of the module 225 begins when the main charging operation 200 enters the fast charge module 225 at step 730. The controller 100 activates the indicator 110, such as the first LED 115, at step 735 to indicate to a user that the battery charger 30 is currently charging the battery 20. In the illustrated construction, the controller 100 activates the first LED 115 so that it appears to be constantly on.

At step 740, the module 225 proceeds to the charge current algorithm 250. Once the charge current algorithm 250 is performed, the controller 100 determines if the charge count equals the count limit (e.g., 7,200) at step 745. If the charge count equals the count limit at step 745, the module 220 proceeds to the defective pack module 205 at step 750 and the module 220 would end at step 755.

If the charge count does not equal the count limit at step 745, the controller 100 determines if the waiting time between current pulses is greater than or equal to the first waiting time threshold (e.g., two seconds) at step 760. If the waiting time is greater than or equal to the first waiting time threshold at step 760, the controller 100 activates the indicator 110 at step 765, such as, for example, turns off the first LED 115 and activates the second LED 120 to blink at approximately 1-Hz. If the waiting time is not greater/than or equal to the first waiting time threshold at step 760, the module-225 proceeds to step 785, which is discussed below.

Once the indicator 110 is activated at step 765, the controller 100 determines if the waiting time between current pulses is greater than or equal to a second waiting time threshold (e.g., fifteen seconds) at step 770. If the waiting time is greater than or equal to the second waiting time threshold at step 770, the controller 100 changes the indicator 110 at step 775, such as, for example, activates the second LED 120 such that the second LED 120 appears to be on constantly. The module 225 then proceeds to the maintenance module 230 at step 780.

If the waiting time is not greater than or equal to the second waiting time threshold at step 770, the controller 100 determines if the battery temperature is included in the range of −20° C. to 0° C. at step 785. If the battery temperature is included in the range at step 785, the module 225 proceeds to the step charge module 220 at step 790. If the battery temperature is not included in the range at step 785, the module 225 proceeds back to the charge current algorithm 250 at step 740.

Figure 11:
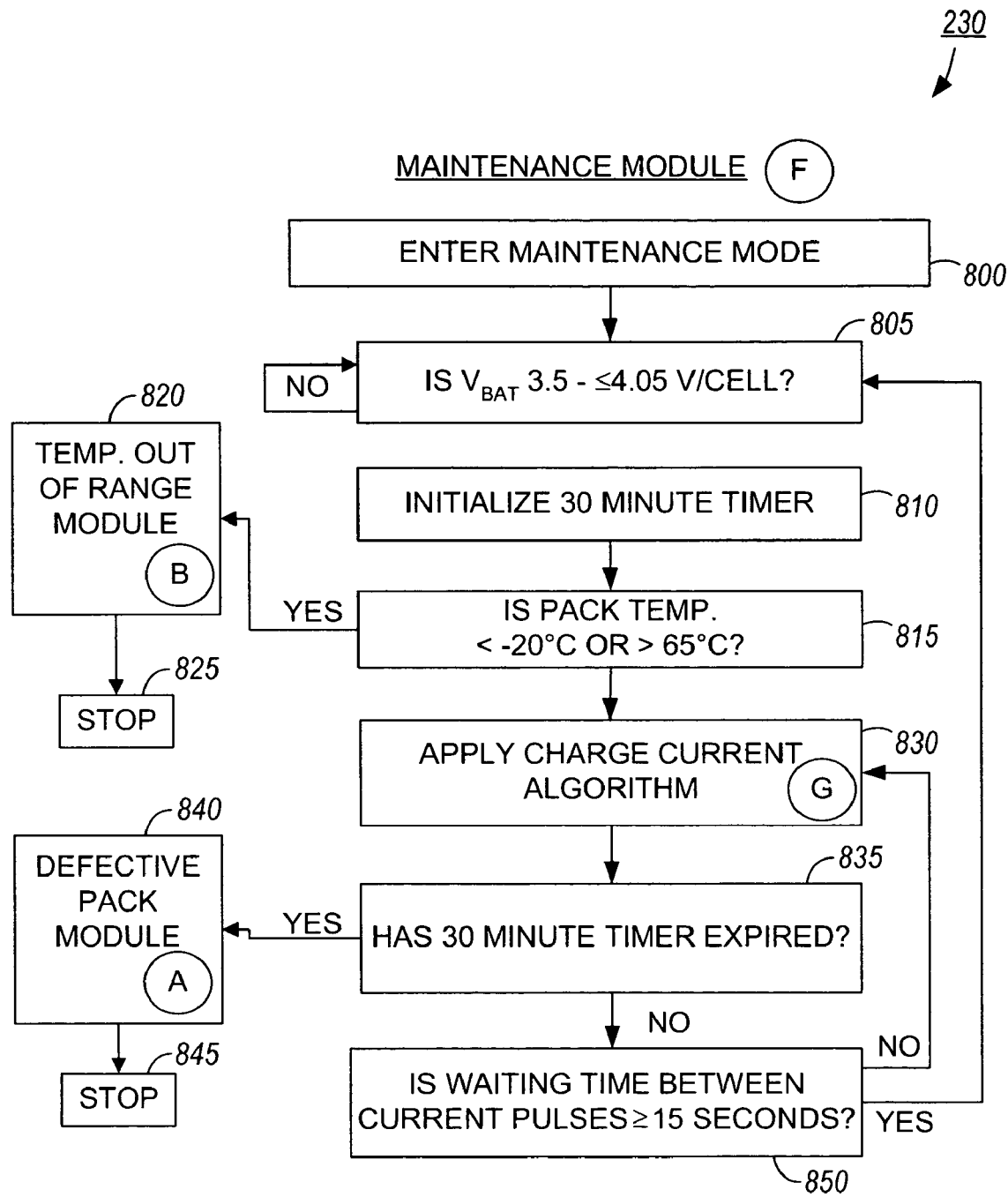
FIG. 11 is a flowchart illustrating a sixth module capable of being implemented on a battery charger embodying aspects of the invention, such as the battery charger shown in FIG. 3.

FIG. 11 is a flowchart illustrating the maintenance module 230. Operation of the module 230 begins when the main charging operation 200 enters the maintenance module 230 at step 800. The controller 100 determines is the battery voltage is included within the range of 3.5-V/cell to 4.05-V/cell at step 805. If the battery voltage is not included in the range at step 805, the controller 100 continues to stay in step 805 until the battery voltage is included in the range. Once the battery voltage is included in the range at step 805, the controller 100 initializes a maintenance timer at step 810. In some constructions, the maintenance timer counts down from thirty minutes.

At step 815, the controller 100 determines if the battery temperature falls below −20° C. or exceeds 65° C. If the battery temperature falls below −20° C. or exceeds 65° C. at step 815, the module 230 proceeds to the temperature out-of-range module 210 at step 820 and the module would end at step 825. If the battery temperature does not fall below −20° C. or does not exceed 65° C. at step 815, the module 230 proceeds to the charge current algorithm 250 at step 830.

Once the charge current algorithm 250 is performed at step 830, the controller 100 determines if the maintenance timer has expired at step 835. If the maintenance timer has expired, the module 230 proceeds to the defective pack module 205 at step 840, and the module 230 would end at step 845. If the maintenance timer has not expired at step 835, the controller 100 determines if the waiting time between the current pulses is greater than or equal to a first predefined maintenance waiting time period, such as, for example, fifteen seconds, at step 850.

If the waiting time is greater than the first predefined maintenance waiting time period at step 850, the module 230 proceeds to step 805. If the waiting time is not greater than or equal to the first predefined maintenance waiting time period at step 850, the module 230 proceeds to the charge current algorithm 250 at step 830. In some constructions, the battery charger 30 will remain in the maintenance module 230 until the battery pack 26 is removed from the battery charger 30.

Figure 12:
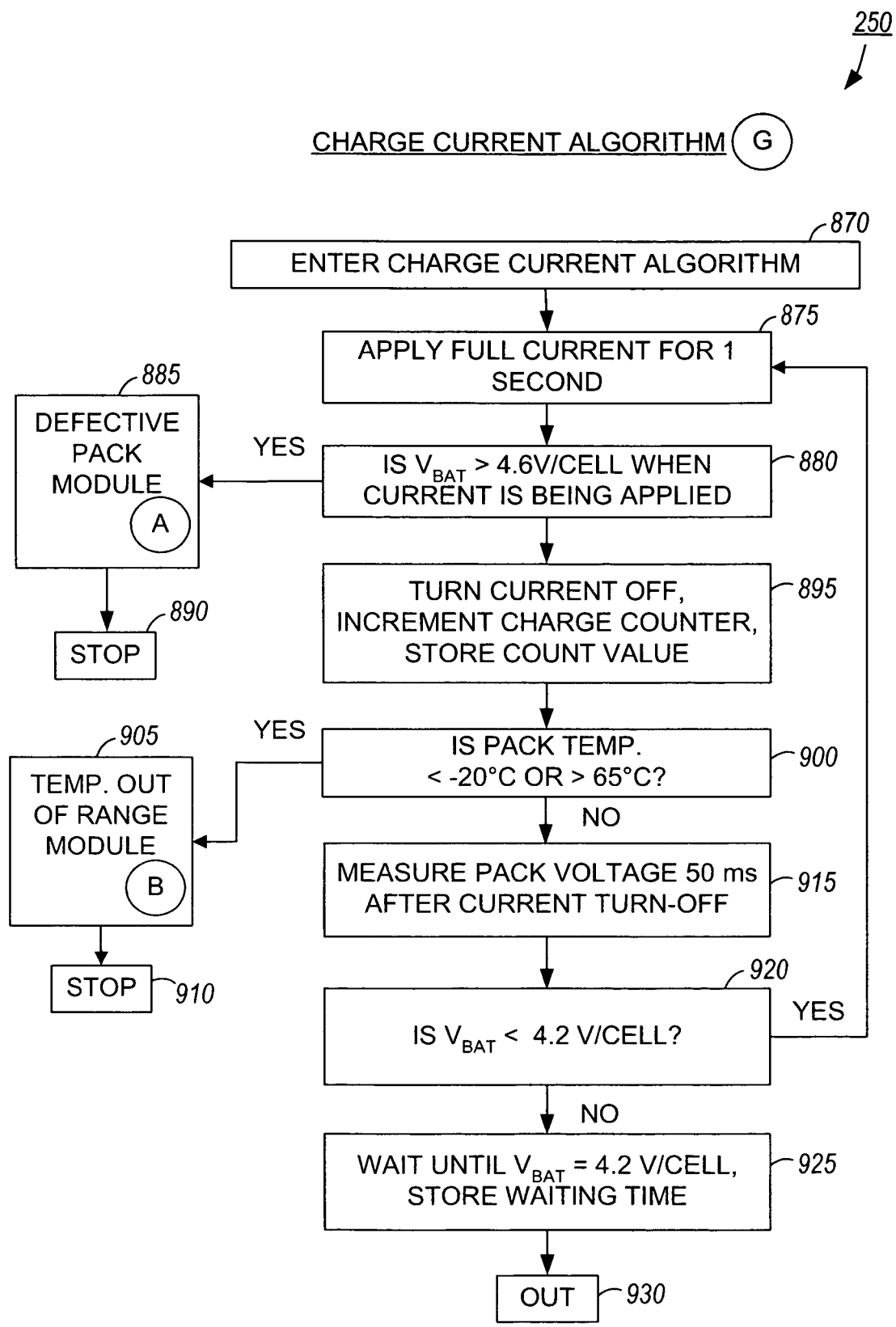
FIG. 12 is a flowchart illustrating a charging algorithm capable of being implemented on a battery charger embodying aspects of the invention, such as the battery charger shown in FIG. 3.

FIG. 12 is a flowchart illustrating the base charge scheme or charge current algorithm 250. Operation of the module 250 begins when the other modules 220-230 or main charging operation 200 enters the charge current algorithm 250 at step 870. The controller 100 applies a full current pulse for approximately one second at step 875. At step 880, the controller 100 determines if the battery voltage is greater than 4.6-V/cell when current is being applied to the battery 20.

If the battery voltage is greater than 4.6-V/cell at step 880, then the algorithm 250 proceeds to the defective pack module 205 at step 885, and the algorithm 250 would end at step 890. If the battery voltage is not greater than 4.6-V/cell at step 880, the controller 100 interrupts the charging current, increments a counter, such as the charge current counter, and stores the count value at step 895.

At step 900, the controller 100 determines is the battery temperature falls below −20° C. or exceeds 65° C. If the battery temperature falls below −20° C. or exceeds 65° C. at step 900, the algorithm 250 proceeds to the temperature out-of-range module 210 at step 905, and the algorithm 250 will terminate at step 910. If the battery temperature does not fall below −20° C. or does not exceed 65° C. at step 900, the controller 100 measures the battery voltage when the charging current is not being supplied to the battery 20 at step 915.

At step 920, the controller 100 determines if the battery voltage is less than 4.2-V/cell. If the battery voltage is less than 4.2-V/cell at step 920, the algorithm 250 proceeds to step 875. If the battery voltage is not less than 4.2-V/cell at step 920, the controller 100 waits until the battery voltage approximately equals 4.2-V/cell at step at 925. Also at step 925, the controller 100 stores the waiting time. The algorithm 250 ends at step 930.

In some constructions and in some aspects, the battery charger 30 can include another method of operation for charging various batteries, such as the battery 20, having different chemistries and/or nominal voltages. An example of this charging operation is illustrated in FIGS. 28-38. In some constructions and in some aspects, the battery charger 30 includes a method of operation for charging Li-based batteries, such as batteries having a Li—Co chemistry, a Li—Mn spinel chemistry, a Li—Mn Nickel chemistry, and the like. In some constructions and in some aspects, the charging operation 200 includes various modules for performing different functions in response to different battery conditions and/or battery characteristics.

In some constructions and in some aspects, the method of charging operation includes modules for interrupting charging based on abnormal and/or normal battery conditions. In some constructions, the charging operation includes a defective pack module and/or a temperature out-of-range module, such as the temperature out-of-range module illustrated in flowchart 2235 of FIG. 36. In some constructions, the battery charger 30 enters the defective pack module in order to terminate charging based on abnormal battery voltage, abnormal cell voltage and/or abnormal battery capacity. In some constructions, the battery charger 30 enters the temperature out-of-range module 2235 in order to terminate charging based on abnormal battery temperature and/or one or more abnormal battery cell temperatures. In some constructions, the charging operation includes more or fewer modules which terminate charging based on more or fewer battery conditions than, the modules and conditions discussed above and below.

In some constructions and in some aspects, the charging operation includes various modes or modules for charging the battery 20 based on various battery conditions or stages within the operation. In some constructions, the charging operation includes a trickle charge module, such as the trickle (limited) charge module illustrated in flowchart 2225 of FIG. 34 and the trickle (step) module illustrated in flowchart 2220 of FIG. 33, a fast charge module, such as the fast charge module illustrated in flowchart 2215 of FIG. 32, and/or a maintenance charge module, such as the maintenance module illustrated in flowchart 2230 of FIG. 35, as well as other modules, such as the flat pack wake-up module illustrated in flowchart 2210 of FIG. 31 and the charge module and pack insert module 2200 (that begins charging) illustrated in flowchart 2205 of FIGS. 29 and 30 and flowchart 2200 of FIG. 28, respectively. The charging operation also includes a charging current algorithm, such as the algorithm illustrated in flowchart 2240 of FIGS. 37 and 38, that other modules implement in various ways.

Figure 28:
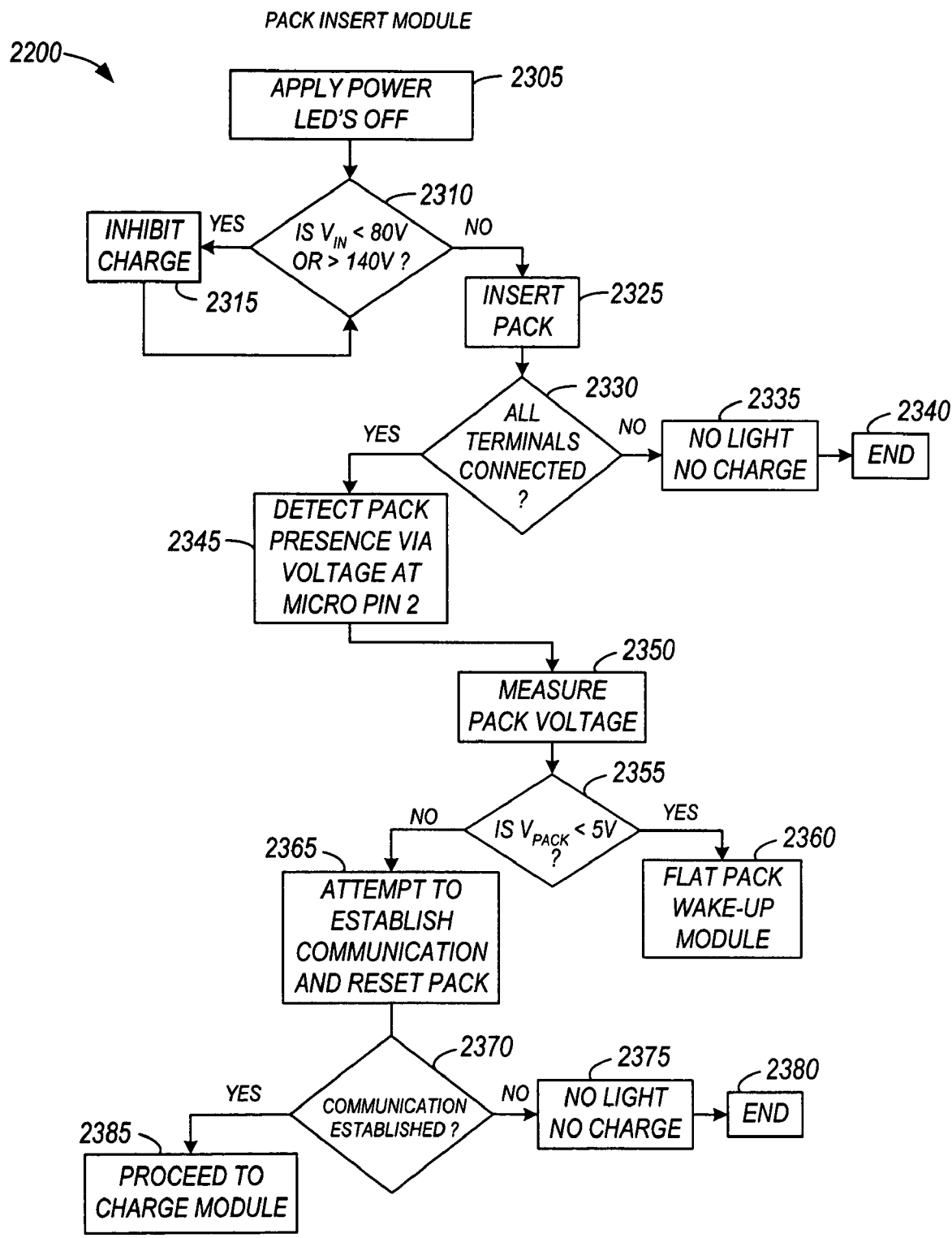
FIG. 28 is a flowchart illustrating a module of a charging operation for a battery.

An example of a portion of the charging operation will be given with respect to FIGS. 28-30. For example, the charging operation begins with the pack insert module 2200, as shown in FIG. 28. The operation begins with power supplied to the battery charger (at 2305), and the battery charger 30 determines whether or not the input voltage $V_{in}$ is within proper operating parameters (e.g., 80-V<$V_{in}$<140-V) (at 2310). If the input voltage $V_{in}$ is not within the operating parameters, then the battery charger 30 inhibits charging (at 2315). The battery charger 30 can also indicate to a user whether or not the proper input voltage $V_{in}$ is being supplied (at 2315).

If the battery charger 30 is receiving the proper input voltage $V_{in}$, the battery pack 20 is connected to the charger (at 2325), and the charger 30 determines if the proper connections (e.g., connections between terminals) have been made (at step 2330). If the proper connections have not been made, then the charger 30 does not light any LEDs (at 2335) and the charging operation terminates (at 2340). If the connections are made, the charger 30 detects the presence of a battery 20 via a voltage to the controller 100 (at 2345) and the controller 100 measures the voltage $V_{pack}$ of the battery 20 (at 2350).

The charger 30 determines if the battery voltage $V_{pack}$ is less than 5-V (at 2355). If the battery voltage $V_{pack}$ is less than 5-V, then the charge operation proceeds to the flat pack wake-up module 2210 (at 2360). If the battery voltage $V_{pack}$ is not less than 5-V, the charger 30 attempts to establish communication with the battery 20 (at 2365) and determine whether or not communication is established (at 2370). If communication is not established, then the charger 30 does not light any indicators (at 2375) and the charging operation terminates (at 2380). If communication is established, the charging operation continues to the charge module 2205 (at 2385).

Figure 29:
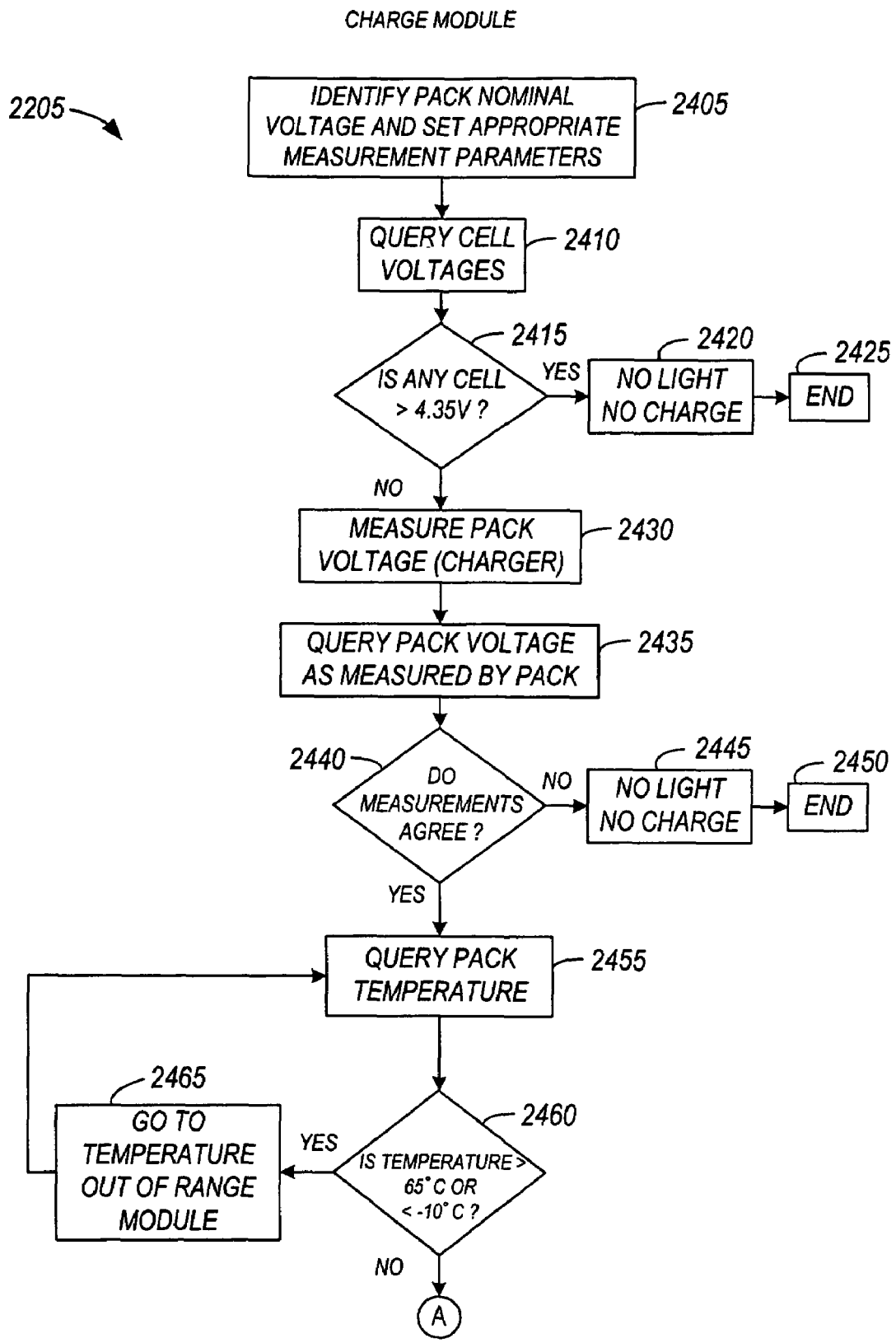
FIGS. 29 and 30 are a flowchart illustrating another module of a charging operation for a battery.
Figure 30:
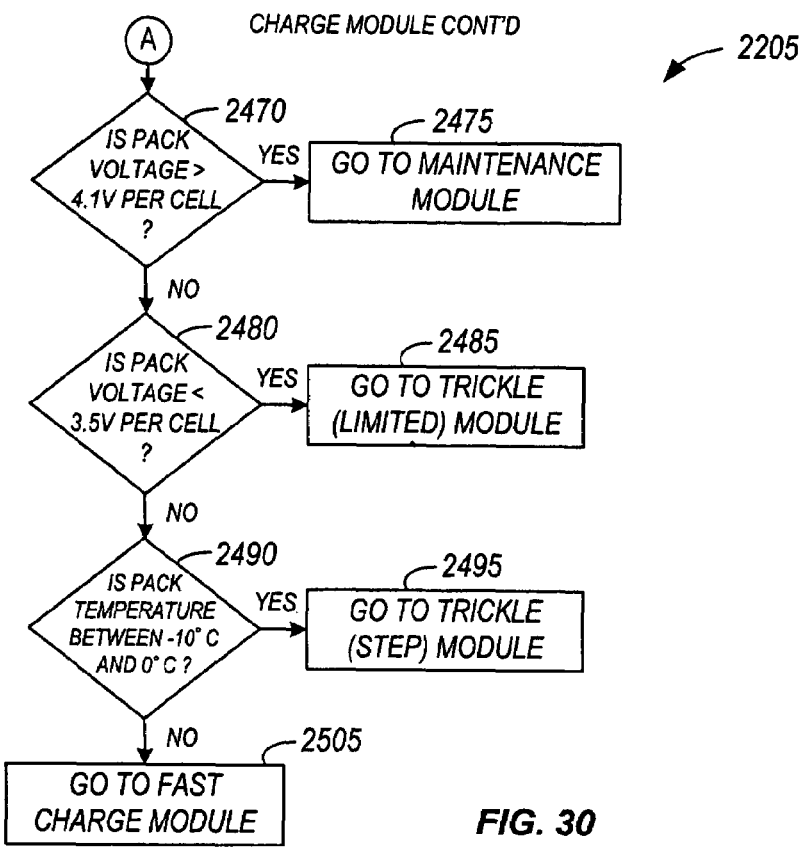
Figure 32:
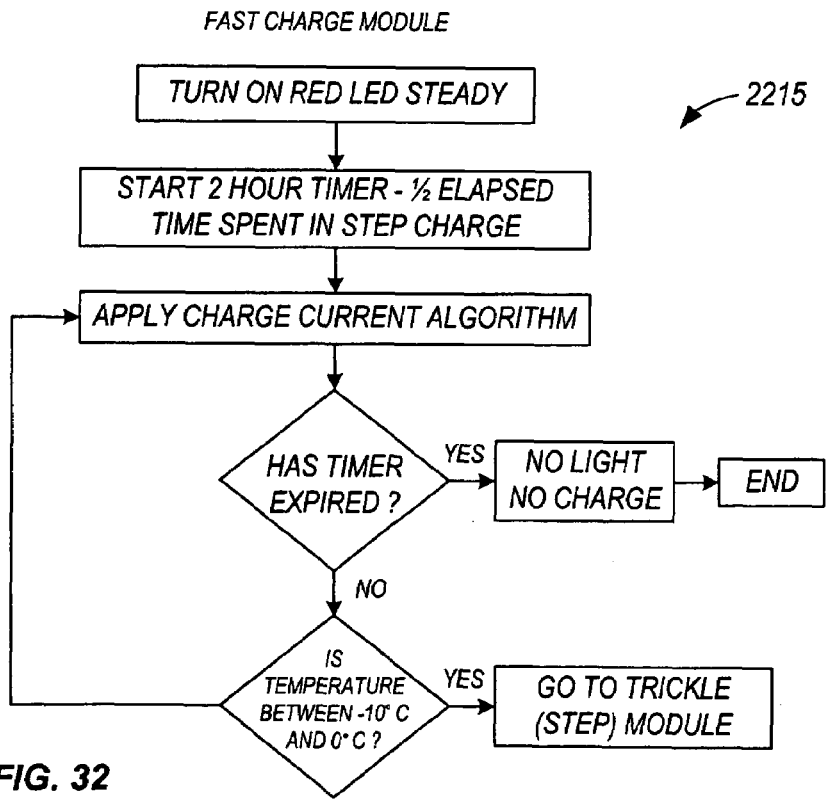
FIG. 32 is a flowchart illustrating still another module of a charging operation for a battery.
Figure 31:
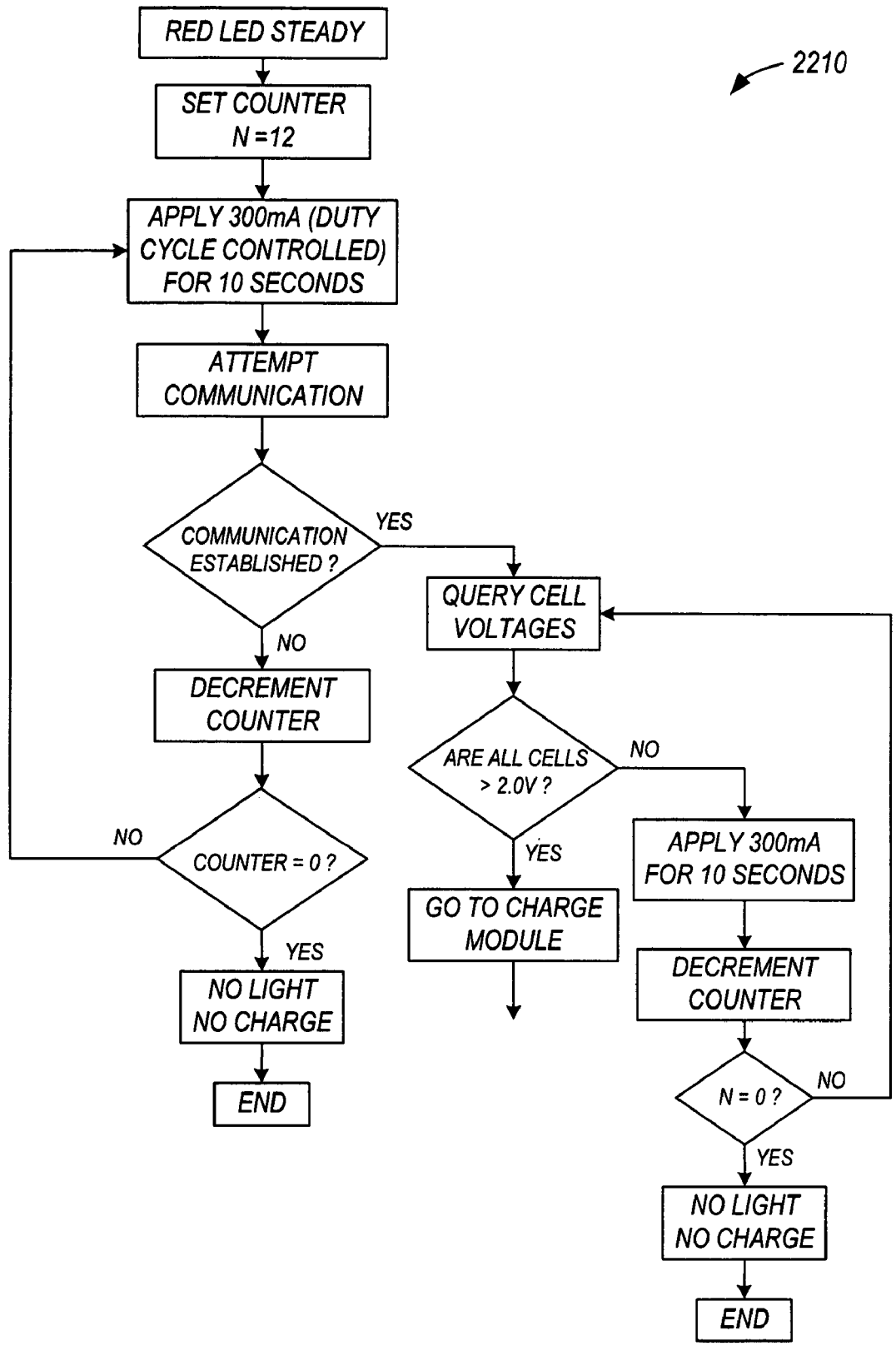
FIG. 31 is a flowchart illustrating yet another module of a charging operation for a battery.
Figure 33:
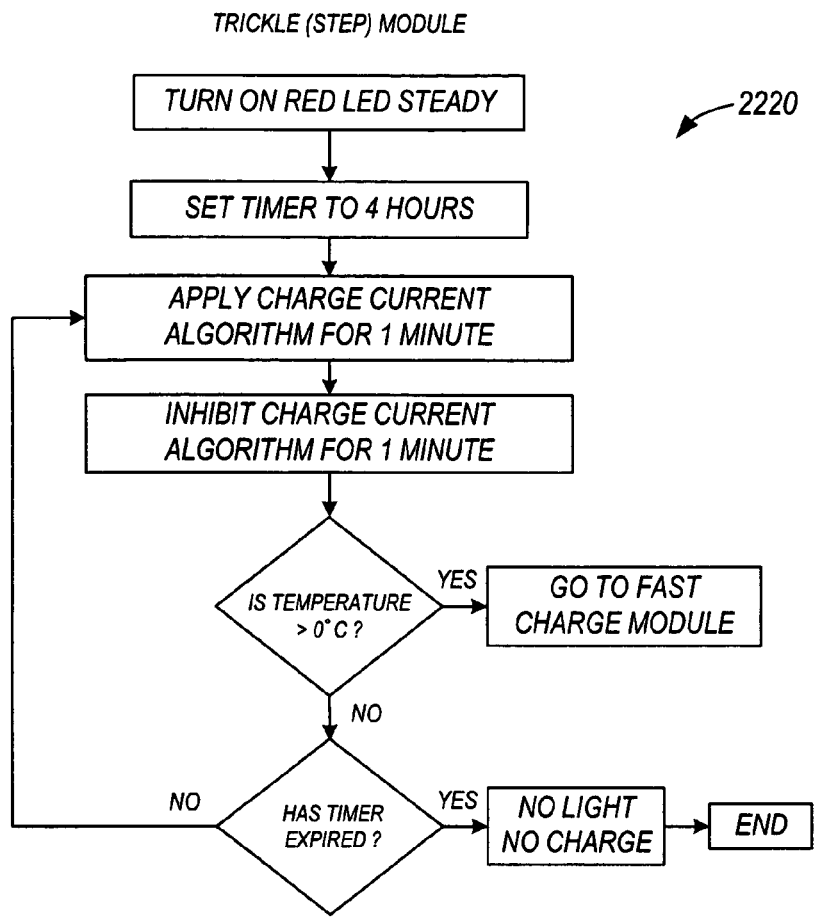
FIG. 33 is a flowchart illustrating still another module of a charging operation for a battery.
Figure 36:
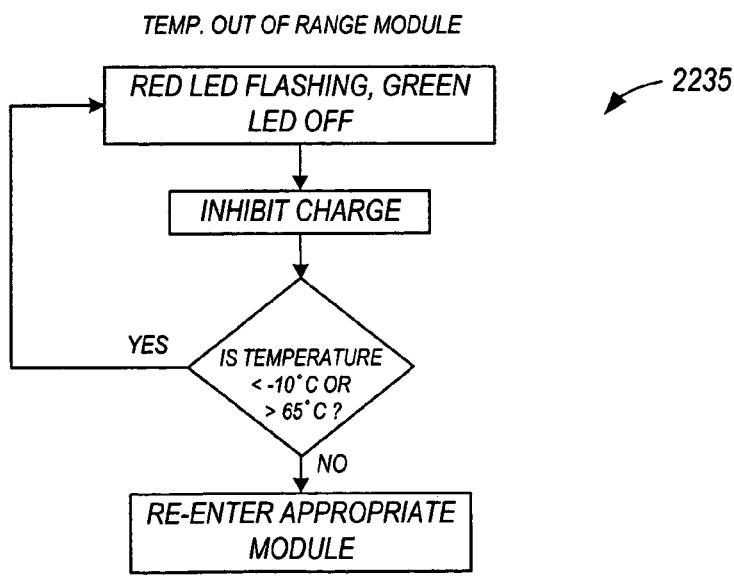
FIG. 36 is a flowchart illustrating still another module of a charging operation for a battery.
Figure 34:
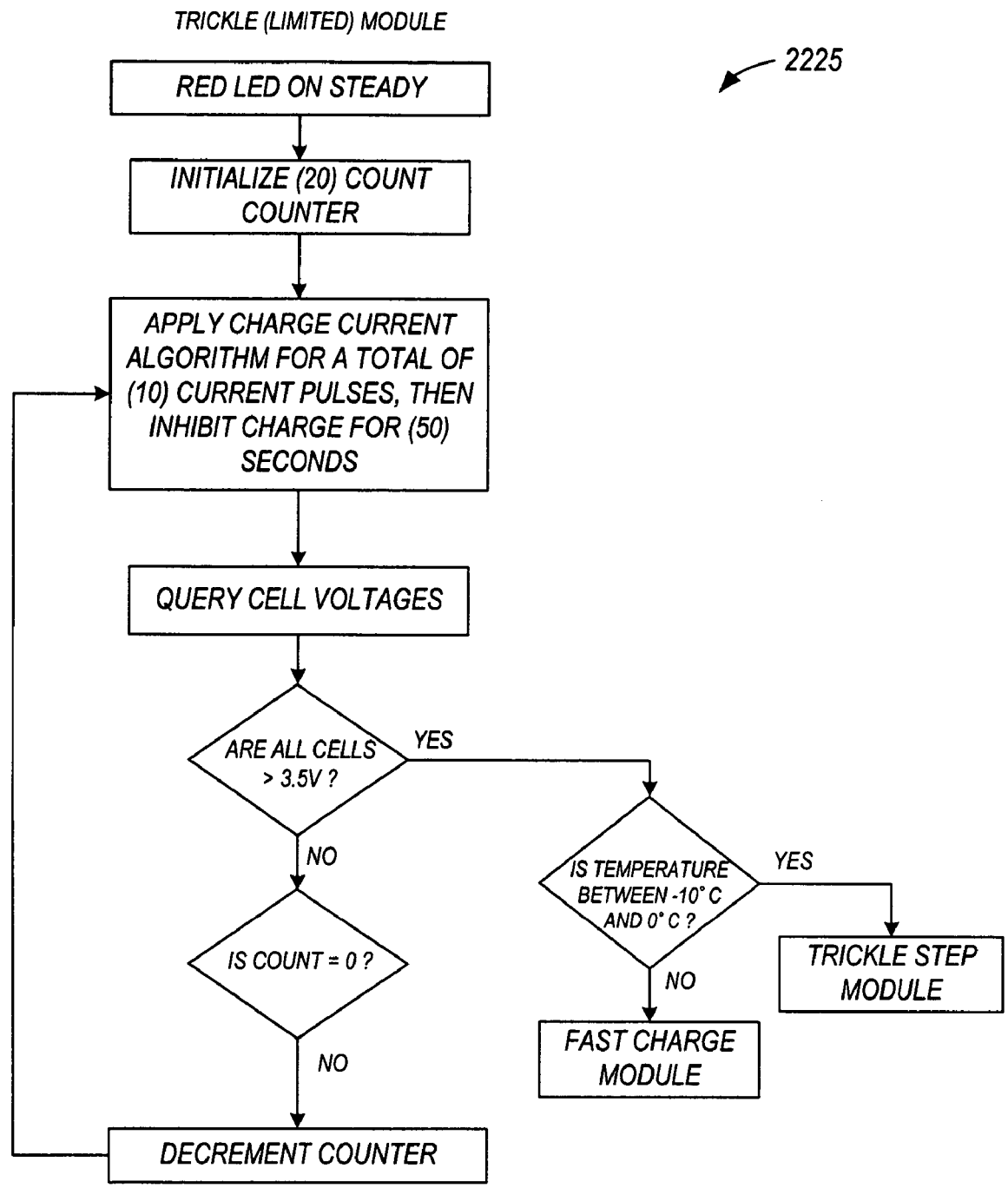
FIG. 34 is a flowchart illustrating still another module of a charging operation for a battery.
Figure 35:
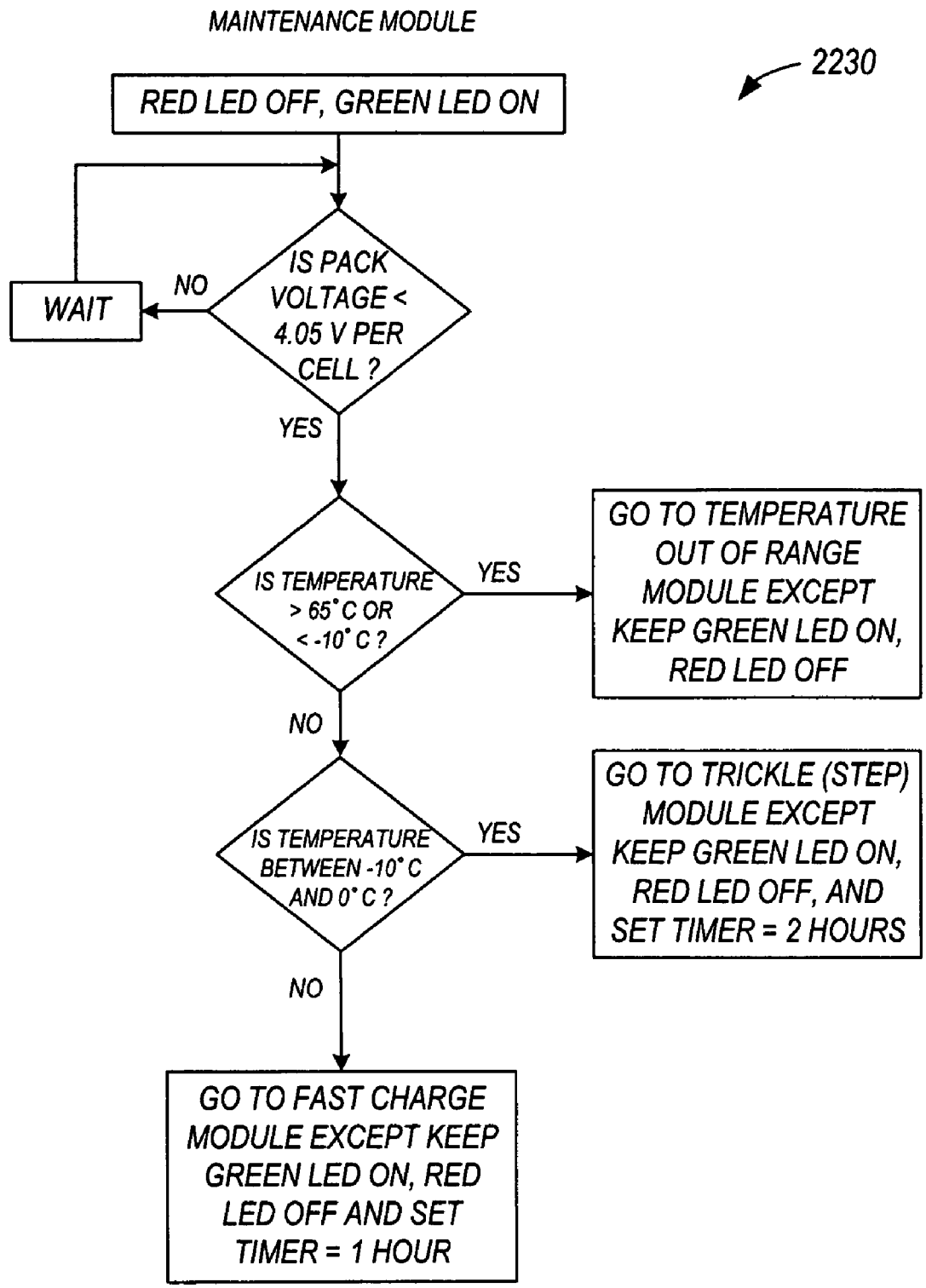
FIG. 35 is a flowchart illustrating still another module of a charging operation for a battery.
Figure 38:
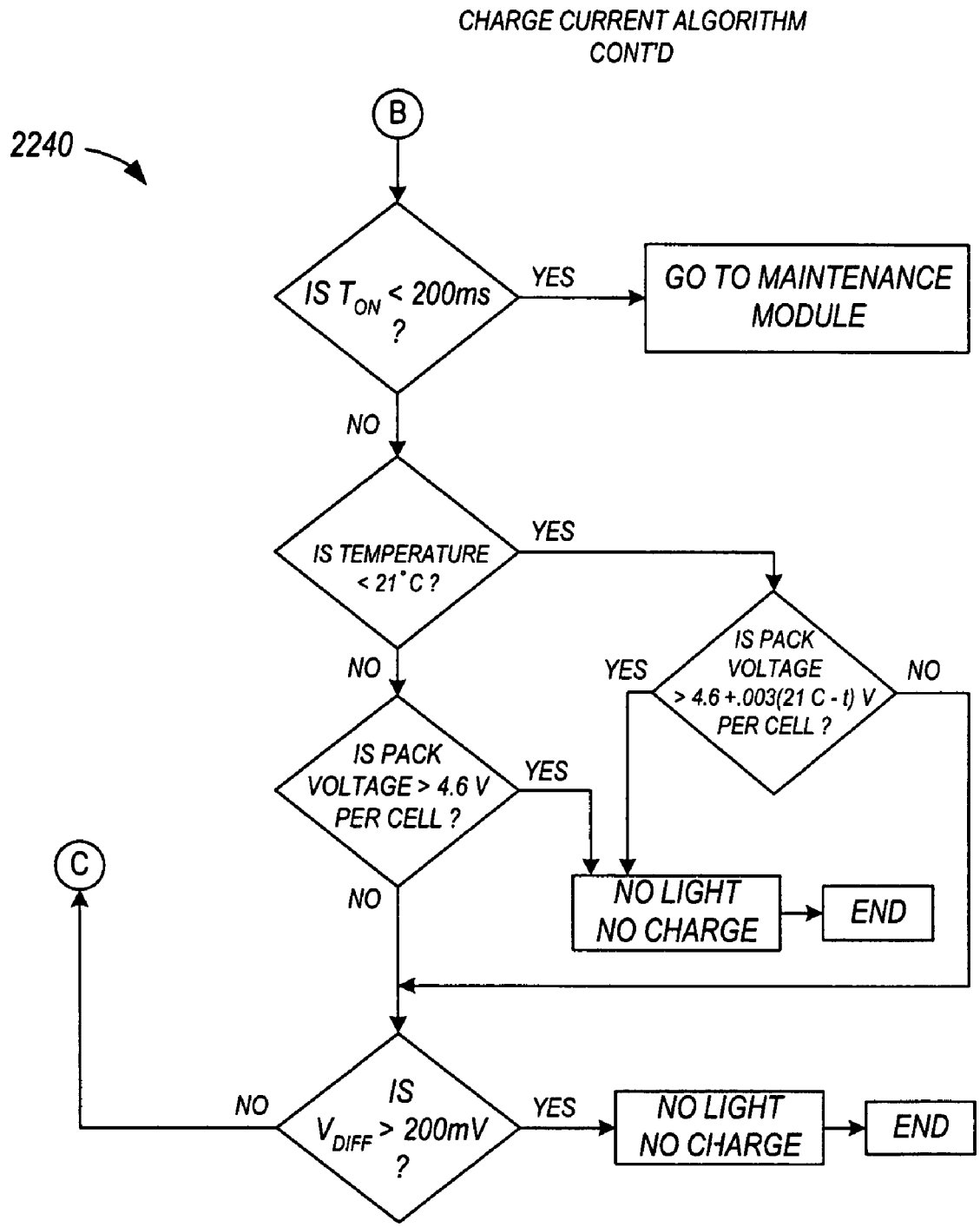

The charge module 2205 is illustrated in FIGS. 29 and 30. The charge module 2205 begins with the charger 30 identifying the pack nominal voltage and setting appropriate measurement parameters (at 2405) and querying the cell voltages of the battery 20 (at 2410) to determine if any cell voltage is greater than an upper threshold (e.g., 4.35-V)(at 2415). If any cell is greater than the upper threshold, the charger 30 does not activate any LEDs (at 2420) and the charging operation terminates (at 2425). If no cell is greater than the upper threshold, the charger 30 measures the battery voltage across the terminals of the charger 30 (at 2430) and queries the battery voltage $V_{pack}$ as measured by the battery 20 (at 2435) to determine if the measurements agree (at 2440). If the measurements do not agree, the charger 30 does not activate any LEDs (at 2445) and the charging operation terminates (at 2450).

If the measurements agree, the charger 30 queries the battery 20 for battery temperature (at 2455) to determine if the battery temperature is within operating range (at 2460). If the battery voltage if not within the desired operating range, the operation proceeds to the temperature out of range module 2235 (at 2465), and the charger 30 can query the battery 20 again for battery temperature information (at 2455) once the charging operation exits the temperature out of range module 2235.

If the battery temperature is within the desired operating range, the charger 30 determines if the battery voltage $V_{pack}$ is greater than a maintenance threshold (e.g., 4.1-V per cell) (at 2470) and the charging operation proceeds to the maintenance module 2230 if the battery voltage $V_{pack}$ is greater than the maintenance threshold (at 2475). Otherwise, the charger 30 determines if the battery voltage $V_{pack}$ is less than a trickle threshold (e.g., 3.5-V per cell) (at 2480), and the charging operation proceeds to the trickle (limited) module 2225 if the battery voltage $V_{pack}$ is below the trickle threshold (at 2485). If the battery voltage is not lower than the trickle threshold, the charger 30 determines if the battery temperature is within a trickle range (at 2490). The operation proceeds to the trickle (step) module 2220 (at 2495) if the temperature is within the trickle range, and proceeds to the fast charge module 2215 (at 2505) if the temperature is not within the trickle range. The charging operation can continue as indicated in the other modules illustrated in FIGS. 31-38.

During the charging operation illustrated in FIGS. 28-38, the battery charger 30 supplies power to the battery 20 using a pulse charge method. In one construction, the battery charger 30 supplies pulses to the battery 20 having the same pulse width every time, but varying the time between pulses. This is referred to as the "full charge current" or "full charge pulse". In other constructions, such as the constructions shown in FIGS. 16 and 39, the full charge current or full charge pulse applied by the battery charger 30 can be scaled according to the individual cell voltages in the battery 20. This implementation will be described with respect to FIGS. 4, 16 and 39.

As shown in FIG. 4, the controller 100 in the battery charger 30 can receive and transmit information from and to the microcontroller 64 in the battery 20. In some constructions, the microcontroller 64 can monitor various battery characteristics during charging, including the voltages or present state of charge of each battery cells 60, either automatically or in response to a command from the battery charger 30. The microcontroller 64 can monitor certain battery characteristics and process or average measurements during periods of charge current $T_{on}$ (i.e., "current on" time periods). In some constructions, the current on time period can be approximately one second ("1-s"). During periods of no charge current $T_{off}$ (i.e., "current off" time periods), information regarding certain battery characteristics (e.g., cell voltages or cell state of charges) can be transferred from the battery 20 to the charger 30. In some constructions, the current off time period $T_{off}$ is approximately 50 ms. The battery charger 30 can process the information sent from the battery 20 and modify the current on time periods $T_{on}$ accordingly. For example, if one or more battery cells 60 have a higher present state of charge than the remaining battery cells 60, then the battery charger 30 may decrease subsequent current on time periods $T_{on}$ in order to avoid overcharging the one or more higher battery cells.

In some constructions, the battery charger 30 may compare each individual cell voltage to an average cell voltage, and if the difference between the individual cell voltage and the average cell voltage equals or exceeds a predefined threshold (e.g., an imbalance threshold) then the charger 30 may identify the cell as being a higher state of charge cell. The battery charger 30 may modify the current on time period $T_{on}$. In other constructions, the battery charger 30 may estimate the state of charge for a particular battery cell (such as a battery cell identified as a higher voltage cell) during current on time periods based on the information received from the battery 20. In these constructions, if the estimation of the present state of charge for the cell exceeds a threshold, then the battery charger 30 may modify the duration of the current on time period $T_{on}$.

Figure 16:
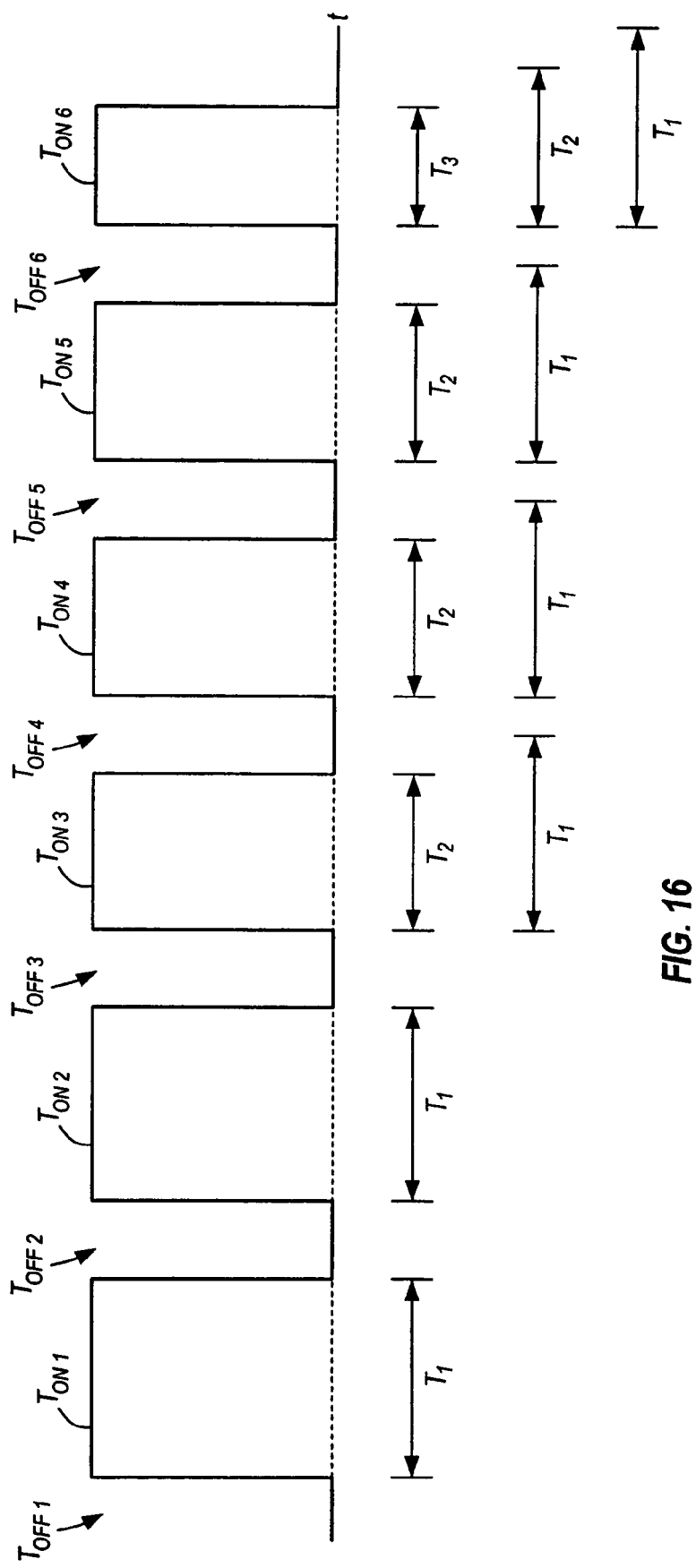
FIG. 16 is a schematic view of the charging current for a battery.
Figure 39:
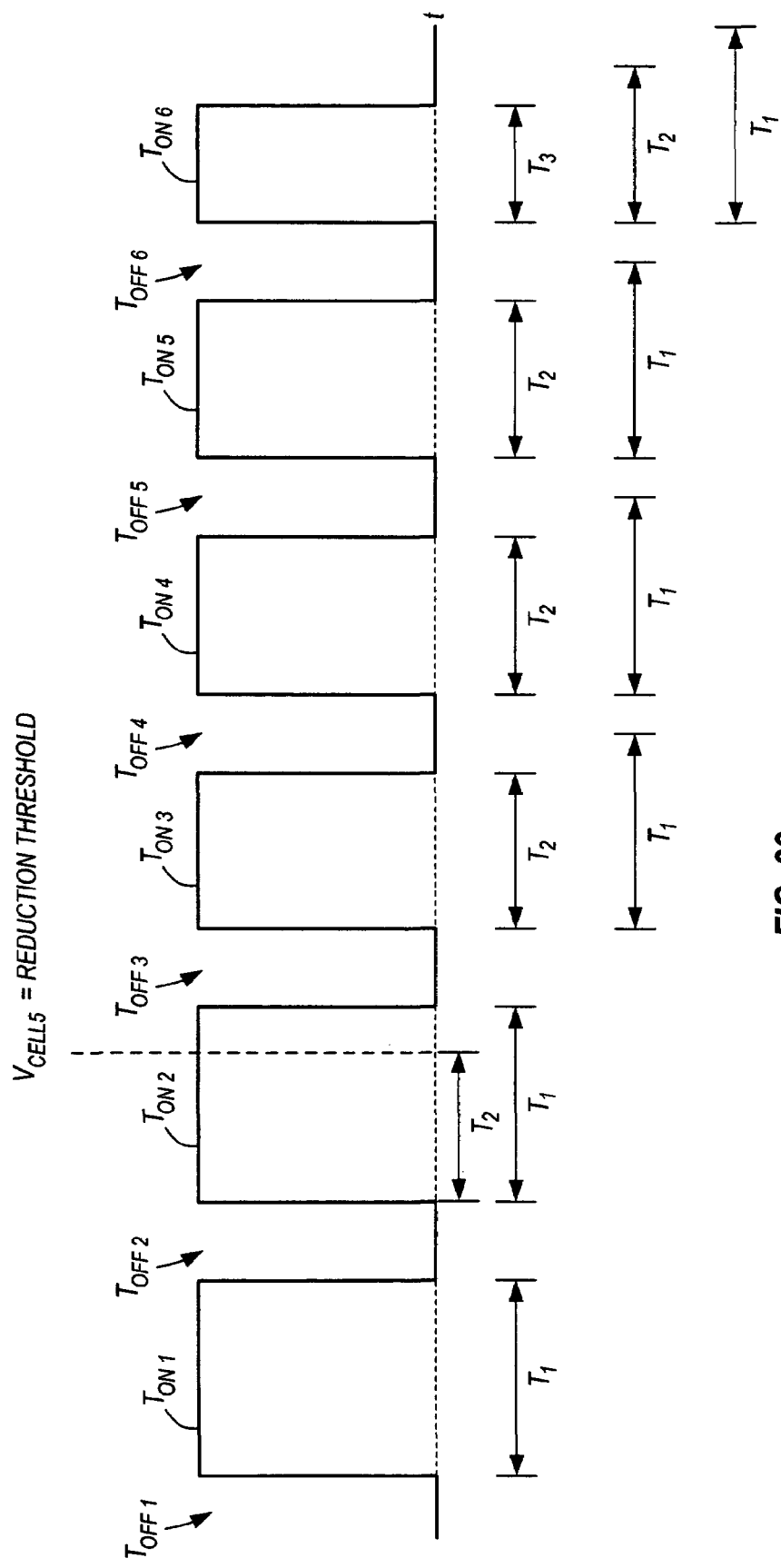
FIG. 39 is a schematic view of the charging current for a battery.

For example, as shown in FIGS. 16 and 39, the battery charger 30 can command the battery 20 to average the cell voltage measurements taken during the next current on time period $T_{on1}$. The command may be sent during the first current off time period $T_{off1}$. Accordingly, during the first current on time period $T_{on1}$, the microcontroller 64 measures and averages the cell voltages as well as other battery parameters. During the next current off time period $T_{off2}$, the battery 30 can transmit the averaged if measurements to the battery charger 30. In some constructions, the battery 20 can send eight averaged measurements such as, for example, an averaged pack state of charge measurement and an averaged individual cell state of charge for each of the seven battery cells 60. For example, the battery 20 may send the following information: cell 1 14%, cell 2 14%, cell 3 15%, cell 4 14%, cell 5 16%, cell 6 14%, cell 7 14%, and pack (e.g., cells 1-7) voltage 29.96 V. In this example, the battery charger 30 identifies cell 5 as being a higher battery cell. The charger 30 also records the battery voltage as measured by the both the battery microcontroller 64 and the battery charger 30. In this example, the battery charger 30 measures the battery voltage as approximately 30.07 V. The battery charger 30 computes the difference in battery voltage measurements (e.g., 110 mV), and determines the voltage drop across the terminals and leads as approximately 110 mV.

During the subsequent current on time period $T_{on2}$, the battery charger 30 estimates the voltage of cell 5. For example, the battery charger 30 samples measurements of the voltage of the battery 20, and for each battery voltage measurement, estimates the state of charge for cell 5 according to the following equation:

$$(V_{battery/ch} - V_{terminals}) * V_{cell}$$

wherein $V_{battery/ch}$ is the voltage of the battery 20 as measured by the charger 30, $V_{terminals}$ is the voltage drop across the terminals (e.g., 110 mV), and $V_{cell}$ is the voltage of the cell being estimated as a percentage of the battery voltage. If the estimation of cell 5's voltage exceeds a threshold ("the reduction threshold"), then the battery charger 30 may modify the subsequent current on time period $T_{on3}$. In this example, the battery charger 30 remembers when the estimation (or calculation) of cell 5's voltage reaches the reduction threshold, which is approximately 800 ms. As shown in FIG. 39, the charger 30 identifies and calculates cell 5 as being a high battery cell, and modifies the subsequent current on time period $T_{on3}$ to be approximately equal to the duration the charger 30 remembers (e.g., 800 ms). Accordingly, the length $T_2$ of the current on time period $T_{on3}$ is less than the length $T_1$ of the previous current on time periods $T_{on1}$ and $T_{on2}$.

In some constructions, the charger 30 continues to set the subsequent current on time periods (e.g., $T_{on4-5}$) to approximately the length $T_2$ of the previous current on time period $T_{on3}$ (e.g., 800 ms). If cell 5 (or another cell) continues to be identified as a high cell, then the charger 30 can modify the length of the subsequent current on time period (e.g., $T_{on6}$) from length $T_2$ (e.g., approximately 800 ms) to $T_3$ (e.g., approximately 600 ms) for example, if cell 5's voltage continues to reach the reduction threshold (at 600 ms, for example).

In other constructions, the charger 30 can also set the subsequent current on time periods (e.g., $T_{on5}$) back to approximately the length of $T_1$ (thus increasing the on time subsequent to reducing the on time) if the charger 30 determines that the battery cells are not receiving enough current. For example, the battery charger 30 can increase the current on time periods if the charger determines that the cell 5's voltage, despite being the high or imbalanced cell, is too far below the reduction threshold at the end of the on time period. In these constructions, the battery charger 30 can continue to modify the length of the current pulses (e.g., on time period) in view of the battery cell voltages to optimize the amount of charge the cells receive with little overcharge. In some constructions, the battery charger 30 cannot increase the current on-time to be greater than an initial current on time period, such as, for example, period $T_{on1}$.

Figure 13:
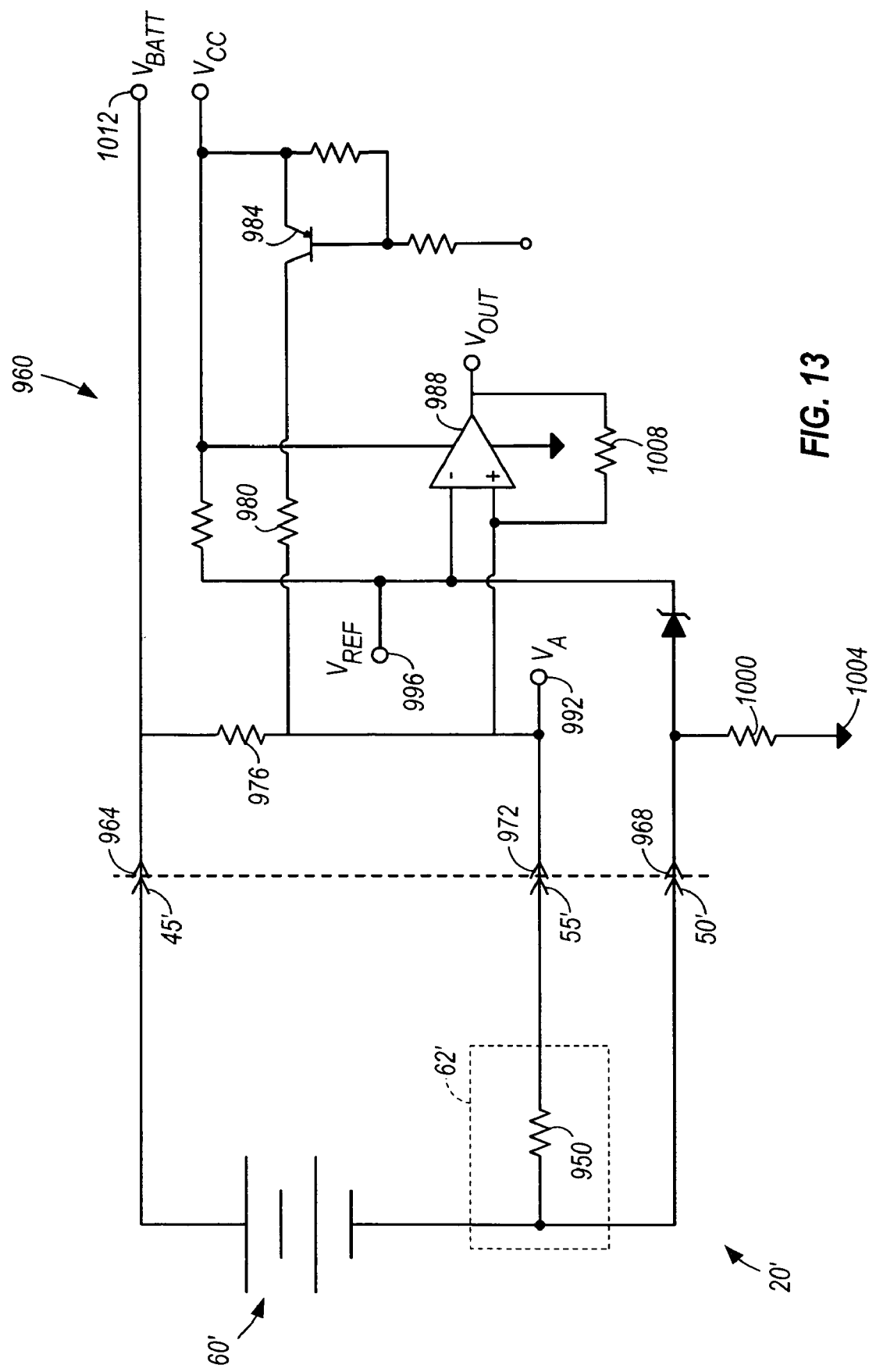
FIG. 13 is a schematic diagram of a battery electrically connected to a battery charger.

A further schematic diagram of a battery 20' is schematically illustrated in FIG. 13. The battery 20' is similar to the battery 20, and common elements are identified by the same reference number "'".

In some constructions, the circuit 62' includes an electrical component such as, for example, an identification resistor 950, and the identification resistor 950 can have a set resistance. In other constructions, the electrical component may be a capacitor, an inductor, a transistor, a semiconducting element, an electrical circuit or another component having a resistance or capable of sending an electrical signal such as, for example, a microprocessor, a digital logic component and the like. In the illustrated construction, the resistance value of the identification resistor 950 can be chosen based on characteristics of the battery 20', such as the nominal voltage and the chemistry of the battery cell(s) 60'. A sense terminal 55' can electrically connect to the identification resistor 950.

The battery 20', shown schematically in FIG. 13, can electrically connect to an electrical device, such as a battery charger 960 (also shown schematically). The battery; charger 960 can include a positive terminal 964, a negative terminal 968 and a sense terminal 972. Each terminal 964, 968, 972 of the battery charger 960 can electrically connect to the corresponding terminal 45', 50', 55' (respectively), of the battery 20'. The battery charger 960 also can include a circuit having electrical components, such as, for example, a first resistor 976, a second resistor 980, a solid-state electronic device or semiconductor 984, a comparator 988 and a processor, microcontroller or controller (not shown). In some constructions, the semiconductor 984 can include a transistor capable of operating in saturation or an "ON" state and capable of operating in cut-off or an "OFF" state. In some constructions, the comparator 988 can be a dedicated voltage monitoring device, a microprocessor or a processing unit. In other constructions, the comparator 988 can be included in the controller (not shown).

In some constructions, the controller (not shown) can be programmed to identify the resistance value of the electrical component in the battery 20', such as the identification resistor 950. The controller can also be programmed to determine one or more characteristics of the battery 20', such as, for example, the battery chemistry and the nominal voltage of the battery 20'. As previously mentioned, the resistance value of the identification resistor 950 may correspond to a dedicated value associated with one or more certain battery characteristics. For example, the resistance value of the identification resistor 950 can be included in a range of resistance values corresponding to the chemistry and to the nominal voltage of the battery 20'.

In some constructions, the controller can be programmed to recognize a plurality of resistance ranges of the identification resistor 950. In these constructions, each range corresponds to one battery chemistry, such as, for example, NiCd, NiMH, Li-ion, and the like. In some constructions, the controller can recognize additional resistance ranges, each corresponding to another battery chemistry or another battery characteristic.

In some constructions, the controller can be programmed to recognize a plurality of voltage ranges. The voltages included in the voltage ranges can be dependent on or correspond to the resistance value of the identification resistor 950, such that the controller can determine the value of the resistor 950 based on the measured voltage.

In some constructions, the resistance value of the identification resistor 950 can be further chosen to be unique for each possible nominal voltage value of the battery 20'. For example, in one range of resistance values, a first dedicated resistance value can correspond to a nominal voltage of 21 V, a second dedicated resistance value can correspond to a nominal voltage of 16.8 V, and a third dedicated resistance value can correspond to a nominal voltage of 12.6 V. In some constructions, there can be more or fewer dedicated resistance values, each corresponding to another possible nominal voltage of the battery 20' associated with the resistance range.

In an exemplary implementation, the battery 20' electrically connects to the battery charger 960. To identify a first battery characteristic, the semiconductor 984 switches to the "ON" state under the control of additional circuitry (not shown). When the semiconductor 984 is in the "ON" state, the identification resistor 950 and resistors 976 and 980 create a voltage divider network. The network establishes a voltage $V_A$ at a first reference point 992. If the resistance value of the resistor 980 is significantly lower than the resistance value of the resistor 976, then the voltage $V_A$ will be dependent upon the resistance values of the identification resistor 950 and the resistor 980. In this implementation, the voltage $V_A$ is in a range determined by the resistance value of the identification resistor 950. The controller (not shown) measures the voltage $V_A$ at the first reference point 992 and determines the resistance value of the identification resistor 950 based on the voltage $V_A$. In some constructions, the controller compares the voltage $V_A$ to a plurality of voltage ranges to determine the battery characteristic.

In some constructions, the first battery characteristic to be identified can include the battery chemistry. For example, any resistance value below 150 k ohms may indicate that the battery 20' has a chemistry of NiCd or NiMH, and any resistance value approximately 150 k ohms or above may indicate that the battery 20' has a chemistry of Li-ion. Once the controller determines and identifies the chemistry of the battery 20', an appropriate charging algorithm or method may be selected. In other constructions, there are more resistance ranges which each correspond to another battery chemistry than in the above example.

Continuing with the exemplary implementation, to identify a second battery characteristic, the semiconductor 984 switches to the "OFF" state under the control of the additional circuitry. When the semiconductor 984 switches to the "OFF" state, the identification resistor 950 and the resistor 976 create a voltage divider network. The voltage $V_A$ at the first reference point 992 is now determined by the resistance values of the identification resistor 950 and the resistor 976. The resistance value of the identification resistor 950 is chosen such that, when the voltage $V_{BATT}$ at a second reference point 1012 substantially equals the nominal voltage of the battery 20', the voltage $V_A$ at the first reference point 992 substantially equals a voltage $V_{REF}$ at a third reference point 996. If the voltage $V_A$ at the first reference point 992 exceeds the fixed voltage $V_{REF}$ at the third reference point 996, an output $V_{OUT}$ of the comparator 988 changes state. In some constructions, the output $V_{OUT}$ can be used to terminate charging or to serve as an indicator to commence additional functions, such as a maintenance routine, an equalization routine, a discharging function, additional charging schemes, and the like. In some constructions, voltage $V_{REF}$ can be a fixed reference voltage.

In some constructions, the second battery characteristic to be identified can include a nominal voltage of the battery 20'. For example, a general equation for calculating the resistance value for the identification resistor 958 can be:

$$R_{100} = \frac{V_{REF} \cdot R_{135}}{V_{BATT} - V_{REF}}$$

wherein $R_{100}$ is the resistance value of the identification resistor 950, $R_{135}$ is the resistance value of the resistor 976, $V_{BATT}$ is the nominal voltage of the battery 20' and $V_{REF}$ is a fixed voltage, such as, for example, approximately 2.5 V. For example, in the range of resistance values for the Li-ion chemistry (set forth above), a resistance value of approximately 150 k ohms for the identification resistor 950 can correspond to a nominal voltage of approximately 21 V, a resistance value of approximately 194 k ohms can correspond to a nominal voltage of approximately 16.8 V, and a resistance value of approximately 274.7 k ohms can correspond to a nominal voltage of approximately 12.6 V. In other constructions, more or fewer dedicated resistance values may correspond to additional or different battery pack nominal voltage values.

In the illustrated construction, both the identification resistor 950 and the third reference point 996 may be situated on the "high" side of a current sense resistor 1000. Positioning the identification resistor 950 and the third reference point 996 in this manner can reduce any relative voltage fluctuations between $V_A$ and $V_{REF}$ when a charging current is present. Voltage fluctuations may appear in voltage $V_A$ if the identification resistor 950 and the third reference point 996 were referenced to ground 1004 and a charging current was applied to the battery 20'.

In some constructions, the battery charger 960 can also include a charger control function. As previously discussed, when the voltage $V_A$ substantially equals the voltage $V_{REF}$ (indicative of voltage $V_{BATT}$ equaling the nominal voltage of battery 20'), the output $V_{OUT}$ of the comparator 988 changes state. In some constructions, the charging current is no longer supplied to the battery 20' when the output $V_{OUT}$ of the comparator 988 changes state. Once the charging current is interrupted, the battery voltage $V_{BATT}$ begins to decrease. When voltage $V_{BATT}$ reaches a low threshold, the output $V_{OUT}$ of the comparator 988 changes state again. In some constructions, the low threshold of voltage $V_{BATT}$ is determined by a resistance value of a hysteresis resistor 1008. The charging current is reestablished once the output $V_{OUT}$ of the comparator 988 changes state again. In some constructions, this cycle repeats for a predefined amount of time as determined by the controller or repeats for a certain amount of state changes made by the comparator 988. In some constructions, this cycle repeats until the battery 20' is removed from the battery charger 960.

Figure 17:
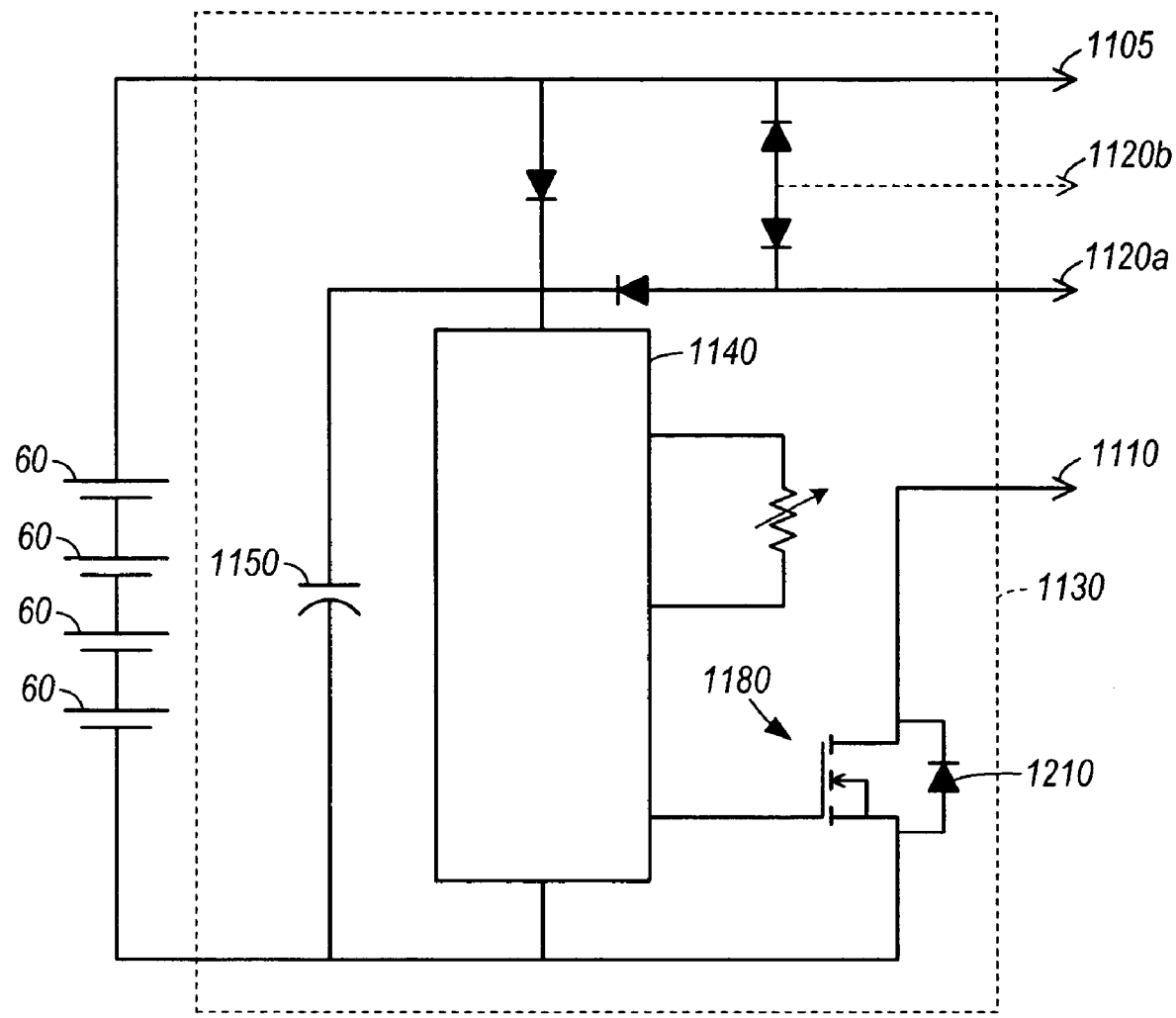
FIG. 17 is another schematic diagram of a battery.

In some constructions and in some aspects, a battery, such as the battery 20 shown in FIG. 17, can become so discharged that the battery cells 60 may not have enough voltage to communicate with a battery charger 30. As shown in FIG. 17, the battery 20 can include one or more battery cells 60, a positive terminal 1105, a negative terminal 1110 and one or more sense terminals 1120a and 1120b (as shown in FIG. 17, the second sense terminal or activation terminal 1120b may or may not be included in the battery 20). The battery 20 can also include a circuit 1130 including a microcontroller 1140.

As shown in FIG. 17, the circuit 1130 can include a semiconducting switch 1180 that interrupts the discharging current when the circuit 1130 (e.g., the microprocessor 1140) determines or senses a condition above or below a predetermined threshold (i.e., an "abnormal battery condition"). In some constructions, the switch 1180 includes an interruption condition in which current from or to the battery 20 is interrupted, and an allowance condition in which current from or to the battery 20 is allowed. In some constructions, an abnormal battery condition can include, for example, high or low battery cell temperature, high or low battery state of charge, high or low battery cell state of charge, high or low discharge current, high or low charge current, and the like. In the illustrated constructions, the switch 1180 includes a power FET or a metal-oxide semiconductor FET ("MOSFET"). In other constructions, the circuit 1130 can include two switches 1180. In these constructions, the switches 1180 can be arranged in parallel. Parallel switches 1180 can be included in battery packs supplying a high average discharge current (such as, for example, the battery 20 supplying power to a circular saw, a driver drill, and the like).

In some constructions, once the switch 1180 becomes non-conducting, the switch 1180 may not reset even if the abnormal condition is no longer detected. In some constructions, the circuit 1130 (e.g., the microprocessor 1140) may reset the switch 180 only if an electrical device, such as, for example, a battery charger 30, instructs the microprocessor 1140 to do so. As mentioned previously, the battery 20 may become so discharged that the battery cells 60 may not have enough voltage in order to power the microprocessor 1140 to communicate with a battery charger 30.

In some constructions, if the battery 20 can not communication with the charger 30, the battery charger 30 can supply a small charge current though the body diode 1210 of the switch 1180 to slowly charge the battery cells 60. Once the cells-60 receive enough charge current to power the microprocessor 1140, the microprocessor 1140 can change the state of the switch 1180. That is, the battery 20 can be charged even when the switch 1180 is in the non-conducting state. As shown in FIG. 17, the switch 1180 can include the body diode 1210, which, in some constructions, is integral with a MOSFET and other transistors. In other constructions, the diode 1210 can be electrically connected in parallel with the switch 1180.

In some constructions, if the battery 20 cannot communication with the charger 30, the battery charger 30 can apply a small average current through a sense lead such as, for example, the sense lead 1120a or the dedicated activation terminal 1120b. The current may charge a capacitor 1150, which in turn can supply enough voltage to the microprocessor 1140 to enable operation.

The constructions described above and illustrated in the figures are presented by way of example only and are not intended as a limitation upon the concepts, and principles of the present invention. As such, it will be appreciated by one having ordinary skill in the art that various changes in the elements and their configuration and arrangement are possible without departing from the spirit and scope of the present invention.

We claim:

1. A combination comprising:
   a battery pack including
      a first battery terminal,
      a second battery terminal,
      a plurality of battery cells, each of the battery cells having a lithium-based chemistry and a present state of charge, the battery cells being coupled to at least one of the first battery terminal and the second battery terminal, and
      a battery microcontroller coupled to at least one of the first battery terminal and the second battery terminal, the microcontroller being operable to measure the present state of charge of at least one of the battery cells to produce battery cell present state of charge measurements; and
   a battery charger operable to supply a charging current to the battery pack, the battery charger including
      a first charger terminal configured to couple to at least one of the first battery terminal and the second battery terminal, the first charger terminal configured to supply charging current to the battery pack,
      a second charger terminal configured to couple to at least one of the first battery terminal and the second battery terminal, and
      a charger microcontroller coupled to the second charger terminal and operable to receive the battery cell present state of charge measurements from the battery microcontroller, the charger microcontroller also operable to supply the charging current to the battery pack in pulses, wherein each pulse includes a first time interval in which charging current is being supplied to the battery pack and a second time interval in which supply of charging current to the battery pack is suspended, the microcontroller being further operable to modify the first time interval of a pulse based at least in part on the battery cell present state of charge measurements received from the battery microcontroller.

2. The combination as set forth in claim 1 and wherein the chemistry is a Li-ion based chemistry.

3. The combination as set forth in claim 1 and wherein the charger microcontroller is further operable to modify the second time interval of a pulse based at least in part on the battery cell present state of charge measurements received from the battery microcontroller.

4. The combination as set forth in claim 1 and wherein the battery pack has a pack state of charge, the pack state of charge being the sum of each present state of charge of the plurality of battery cells, the battery microcontroller also operable to measure the pack state of charge to produce a pack state of charge measurement.

5. The combination as set forth in claim 4 and wherein the charger microcontroller is operable to measure the pack state of charge to produce a second pack state of charge measurement.

6. The combination as set forth in claim 5 and wherein the second pack state of charge measurement as measured by the charger microcontroller is greater than the pack state of charge measurement as measured by the battery microcontroller.

7. The combination as set forth in claim 5 and wherein the battery microcontroller sends the present state of charge measurements for each battery cell in the plurality of battery cells as a percentage of the pack state of charge as measured by the battery microcontroller.

8. The combination as set forth in claim 7 and wherein the charger microcontroller is operable to estimate the present state of charge of a battery cell during the first time interval of a first pulse to produce an estimated state of charge measurement of a battery cell based on the percentage and the second pack state of charge measurement as measured by the charger microcontroller, the charger microcontroller is also operable to modify the first time interval of a subsequent pulse based on the estimated state of charge measurement of a battery cell.

9. The combination as set forth in claim 1 and wherein the battery charger is further operable to modify the second time interval of a pulse.

10. A battery charger operable to supply a charging current to a lithium-based battery pack having a plurality of battery cells and a battery microcontroller, each of the battery cells having a lithium-based chemistry and a present state of charge, the battery microcontroller operable to measure the battery cell present state of charge of at least one of the battery cells, the battery charger comprising:
a charger microcontroller operable to receive the battery cell present state of charge from the battery microcontroller, the charger microcontroller also operable to supply the charging current to the lithium-based battery pack in pulses, wherein each pulse includes a first time interval and a second time interval, the first time interval being an interval in which charging current is supplied to the battery pack and the second time interval being an interval in which supply of charging current to the battery pack is suspended, the microcontroller being further operable to modify the first time interval of a pulse based at least in part on the battery cell present state of charge received from the battery microcontroller.

11. The battery charger as set forth in claim 10, and wherein the battery microcontroller is operable to measure each present state of charge of the plurality of battery cells, and wherein the charger microcontroller is operable to receive each battery cell state of charge.

12. The battery charger as set forth in claim 11, and wherein the battery pack has a pack voltage, the pack voltage being a sum of each of the present state of charge of the plurality of battery cells, the charger microcontroller also operable to receive the pack state of charge.

13. The battery charger as set forth in claim 10, and wherein the battery charger is further operable to modify the second time interval of a pulse.

14. A method of pulse charging a battery having a plurality of battery cells, the method comprising:
measuring a state of charge for each battery cell in the plurality of battery cells, each of the battery cells having a lithium-based chemistry;
applying a first pulse of charging current to the battery, the first pulse having a first time interval in which charging current is supplied to the battery and a second time interval in which supply of charging current to the battery is suspended; and
applying a second pulse of charging current to the battery, the second pulse having a third time interval in which charging current is supplied to the battery and a fourth time interval in which supply of charging current to the battery is suspended, the third time interval based at least in part on the state of charge of a battery cell and the third time interval being less than the first time interval.

15. The method of pulse charging as set forth in claim 14 and further comprising:
identifying a high battery cell state of charge among the states of charge of the plurality of battery cells.

16. The method of pulse charging as set forth in claim 15 and further comprising:
measuring a battery state of charge; and
estimating a state of charge for the battery cell identified as the high battery cell state of charge to produce an estimated state of charge for the battery cell.

17. The method of pulse charging as set forth in claim 16 and wherein third time interval is based at least in part on the estimated state of charge for the battery cell.

18. The method of pulse charging as set forth in claim 16 and further comprising:
establishing a battery cell state of charge threshold; and
computing an estimated time when the estimated state of charge for the battery cell reaches the battery cell state of charge threshold.

19. The method of pulse charging as set forth in claim 18 and wherein the third time interval is approximately equal the estimated time.

20. The method of pulse charging as set forth in claim 14 and further comprising:
maintaining a parameter value representing the third time interval; and
modifying the parameter value based at least in part on the state of charge of a battery cell.

* * * * *

UNITED STATES PATENT AND TRADEMARK OFFICE
CERTIFICATE OF CORRECTION

PATENT NO. : 7,425,816 B2
APPLICATION NO. : 11/139020
DATED : September 16, 2008
INVENTOR(S) : Gary D. Meyer et al.

It is certified that error appears in the above-identified patent and that said Letters Patent is hereby corrected as shown below:

Add the following information under Related U.S. Application Data on the cover of the patent:

--Continuation-in-part of application No. 10/720,027, filed on Nov. 20, 2003, now Pat. No. 7,157,882, which claims the benefit of provisional application No. 60/428,358, filed on Nov. 22, 2002, provisional application No. 60/428,450, filed on Nov. 22, 2002, provisional application No. 60/428,452, filed on Nov. 22, 2002, provisional application No. 60/440,692, filed on Jan. 17, 2003, provisional application No. 60/440,693, filed on Jan. 17, 2003, provisional application No. 60/523,716, filed on Nov. 19, 2003, and provisional application No. 60/523,712, filed on Nov. 19, 2003.

Continuation-in-part of application No. 10/719,680, filed on Nov. 20, 2003, now Pat. No. 7,176,654, which claims the benefit of provisional application No. 60/428,358, filed on Nov. 22, 2002, provisional application No. 60/428,450, filed on Nov. 22, 2002, provisional application No. 60/428,452, filed on Nov. 22, 2002, provisional application No. 60/440,692, filed on Jan. 17, 2003, provisional application No. 60/440,693, filed on Jan. 17, 2003, provisional application No. 60/523,716, filed on Nov. 19, 2003, and provisional application No. 60/523,712, filed on Nov. 19, 2003.

Continuation-in-part of application No. 10/721,800, filed on Nov. 24, 2003, now Pat. No. 7,253,585, which claims the benefit of 60/428,356, filed on Nov. 22, 2002, provisional application No. 60/428,358, filed on Nov. 22, 2002, provisional application No. 60/428,450, filed on Nov. 22, 2002, provisional application No. 60/428,452, filed on Nov. 22, 2002, provisional application No. 60/440,692, filed on Jan. 17, 2003, provisional application No. 60/440,693, filed on Jan. 17, 2003, provisional application No. 60/523,712, filed on Nov. 19, 2003, and provisional application No. 60/523,716, filed on Nov. 19, 2003.--.

Column 1, line 18, replace "also relates to" with --is a continuation-in-part of--.

Column 1, line 29, replace "also relates to" with --is a continuation-in-part of--.

UNITED STATES PATENT AND TRADEMARK OFFICE
CERTIFICATE OF CORRECTION

PATENT NO. : 7,425,816 B2
APPLICATION NO. : 11/139020
DATED : September 16, 2008
INVENTOR(S) : Gary D. Meyer et al.

It is certified that error appears in the above-identified patent and that said Letters Patent is hereby corrected as shown below:

Column 1, line 40, replace "also relates to" with --is a continuation-in-part of--.

Signed and Sealed this

Eleventh Day of November, 2008

JON W. DUDAS
*Director of the United States Patent and Trademark Office*